US012210349B2

(12) United States Patent
Redford et al.

(10) Patent No.: US 12,210,349 B2
(45) Date of Patent: Jan. 28, 2025

(54) PERFORMANCE TESTING FOR ROBOTIC SYSTEMS

(71) Applicant: Five AI Limited, Bristol (GB)

(72) Inventors: John Redford, Cambridge (GB); Sebastian Kaltwang, Cambridge (GB); Sina Samangooei, Cambridge (GB); Blaine Rogers, Cambridge (GB)

(73) Assignee: Five AI Limited, Cambridge (GB)

( * ) Notice: Subject to any disclaimer, the term of this patent is extended or adjusted under 35 U.S.C. 154(b) by 315 days.

(21) Appl. No.: 17/636,524

(22) PCT Filed: Aug. 21, 2020

(86) PCT No.: PCT/EP2020/073568
§ 371 (c)(1),
(2) Date: Feb. 18, 2022

(87) PCT Pub. No.: WO2021/037765
PCT Pub. Date: Mar. 4, 2021

(65) Prior Publication Data
US 2022/0289218 A1   Sep. 15, 2022

(30) Foreign Application Priority Data

Aug. 23, 2019 (GB) .................................... 1912145
Apr. 6, 2020 (EP) .................................... 20168311

(51) Int. Cl.
*G06N 7/02* (2006.01)
*B60W 50/00* (2006.01)
(Continued)

(52) U.S. Cl.
CPC ....... *G05D 1/0221* (2013.01); *B60W 50/0098* (2013.01); *B60W 50/0205* (2013.01);
(Continued)

(58) Field of Classification Search
CPC ..... B60W 50/06; B60W 60/001; G06F 30/27; G06N 3/08; G06N 7/01; G06N 7/023
See application file for complete search history.

(56) References Cited

U.S. PATENT DOCUMENTS 10,481,044 B2 * 11/2019 Sun .................. B60W 50/0205
2013/0030779 A1   1/2013 Leonard
(Continued)

FOREIGN PATENT DOCUMENTS

EP          1 743 581 A1    1/2007
WO       2021037760 A1     3/2021
(Continued)

OTHER PUBLICATIONS

International Search Report and Written Opinion mailed Nov. 19, 2020 for International Application No. PCT/EP2020/073562.
(Continued)

*Primary Examiner* — Manuel A Rivera Vargas
(74) *Attorney, Agent, or Firm* — Andrew J. Tibbetts; Samuel S. Stone; Greenberg Traurig, LLP

(57) ABSTRACT

Herein, a "perception statistical performance model" (PSPM) for modelling a perception slice of a runtime stack for an autonomous vehicle or other robotic system may be used e.g. for safety/performance testing. A first PSPM is configured to: receive a computed perception ground truth; determine from the perception ground truth, based on a set of learned parameters, a probabilistic perception uncertainty distribution, the parameters learned from a set of actual perception outputs generated using the perception slice to be modelled, in order to compute a first time series of perception outputs. A second time series of perception outputs is computed using a second PSPM for modelling a second perception slice of the runtime stack, the first PSPM learned from data of a first sensor modality of the perception slice and the time series, and the second PSPM learned indepen- (Continued)

dently thereof from data of a second sensor modality of the second perception slice and the second time series.

18 Claims, 41 Drawing Sheets

(51) Int. Cl.
| | |
|---|---|
| *B60W 50/02* | (2012.01) |
| *B60W 50/04* | (2006.01) |
| *B60W 50/06* | (2006.01) |
| *B60W 60/00* | (2020.01) |
| *G05D 1/00* | (2006.01) |
| *G06F 30/27* | (2020.01) |
| *G06N 3/02* | (2006.01) |
| *G06N 3/08* | (2023.01) |
| *G06N 5/025* | (2023.01) |
| *G06N 7/01* | (2023.01) |
| *G06N 20/00* | (2019.01) |

(52) U.S. Cl.
CPC .......... *B60W 50/045* (2013.01); *B60W 50/06* (2013.01); *B60W 60/001* (2020.02); *B60W 60/0015* (2020.02); *G05D 1/0088* (2013.01); *G05D 1/0214* (2013.01); *G06F 30/27* (2020.01); *G06N 3/02* (2013.01); *G06N 3/08* (2013.01); *G06N 5/025* (2013.01); *G06N 7/01* (2023.01); *G06N 7/023* (2013.01); *G06N 20/00* (2019.01); *B60W 2050/0052* (2013.01); *B60W 2050/0215* (2013.01); *B60W 2555/20* (2020.02)

(56) References Cited

U.S. PATENT DOCUMENTS

| | | | |
|---|---|---|---|
| 2018/0336297 A1 | 11/2018 | Sun et al. | |
| 2019/0130056 A1 | 5/2019 | Tascione et al. | |
| 2019/0220737 A1 | 7/2019 | Yao | |
| 2019/0220744 A1 | 7/2019 | Yao | |
| 2019/0310650 A1 | 10/2019 | Halder | |
| 2019/0317510 A1 | 10/2019 | Ros Sanchez | |
| 2020/0110853 A1 | 4/2020 | Tooley et al. | |
| 2020/0293054 A1* | 9/2020 | George | G05D 1/0221 |
| 2021/0027103 A1 | 1/2021 | Brower | |
| 2021/0049377 A1* | 2/2021 | Hu | G06T 7/0002 |
| 2022/0269279 A1 | 8/2022 | Redford et al. | |
| 2022/0297707 A1 | 9/2022 | Redford et al. | |
| 2022/0297709 A1 | 9/2022 | Redford et al. | |
| 2022/0300810 A1 | 9/2022 | Redford et al. | |

FOREIGN PATENT DOCUMENTS

| | | |
|---|---|---|
| WO | 2021037761 A1 | 3/2021 |
| WO | 2021037763 A1 | 3/2021 |
| WO | 2021037766 A1 | 3/2021 |

OTHER PUBLICATIONS

International Search Report and Written Opinion mailed Nov. 20, 2020 for International Application No. PCT/EP2020/073563.
International Search Report and Written Opinion mailed Nov. 20, 2020 for International Application No. PCT/EP2020/073565.
International Search Report and Written Opinion mailed Nov. 20, 2020 for International Application No. PCT/EP2020/073568.
International Search Report and Written Opinion mailed Nov. 20, 2020 for International Application No. PCT/EP2020/073569.
Extended European Search Report mailed Feb. 23, 2021 for European Application No. 20192250.7.
[No Author Listed], The Offline Executor: Virtual Testing and the Aurora Driver. Medium. Aug. 2019. 7 pages. https://medium.com/aurora-blog/the-offline-executor-virtual-testing-and-the-aurora-driver-51c7f5c84ale (Last accessed Jan. 13, 2022).
Berkhahn et al., Traffic Dynamics at Intersections Subject to Random Misperception. University of Hannover. 2019. 11 pages. https://www.insurance.uni-hannover.de/fileadmin/house-of-insurance/Publications/2019/vk_mk_sw_Traffic_Dynamics_at_Intersections_Subject_to_Random_Misperception.pdf.
Bouton et al., Safe Reinforcement Learning with Scene Decomposition for Navigating Complex Urban Environments. arXiv preprint arXiv:1904.11483. Apr. 25, 2019. 8 pages.
Gomez et al., Uncertainty-based localization in a topological robot navigation system. 2017 IEEE International Conference on Autonomous Robot Systems and Competitions (ICARSC) Apr. 26, 2017:67-72.
Mitra et al., Towards modeling of perception errors in autonomous vehicles. 2018 21st International Conference on Intelligent Transportation Systems (ITSC) Nov. 4, 2018; 3024-29.
Piazzoni et al., Modeling perception errors towards robust decision making in autonomous vehicles. arXiv preprint arXiv:2001.11695v2. Sep. 3, 2021. 11 pages.
Ping et al., Modeling driver risk perception on city roads using deep learning. IEEE Access. Nov. 6, 2018;6:68850-66.

* cited by examiner

PERFORMANCE TESTING FOR ROBOTIC SYSTEMS

RELATED APPLICATIONS

This Application is a national stage filing under 35 U.S.C. 371 of International Patent Application Serial No. PCT/EP2020/073568, filed Aug. 21, 2020, which claims priority to European patent application number EP 20168311.7, filed Apr. 6, 2020, to United Kingdom patent application number GB 1912145.8, filed Aug. 23, 2019. Each of the foregoing applications is incorporated by reference herein in its entirety.

TECHNICAL FIELD

This disclosure pertains to performance testing of autonomous vehicles and other robotic systems. Performance testing is critical to ensure such systems can perform to a guaranteed level of safety.

BACKGROUND

It has been estimated that, in order for an autonomous vehicle (AV) to achieve a level of safety that matches that of human drivers, a maximum of 1 error per $10^7$ autonomous driving decisions must be guaranteed across the entire Operational Design Domain (ODD) of the AV.

This presents an enormous challenge given the complexity both of an AV and the ODD itself. A self-driving system is an exceptionally complex assembly of cross-dependent and interacting software and hardware components, each prone to limitations or error. Several of the components use neural networks for object detection, type classification, action prediction and other critical tasks. That system needs to operate safely in the ODD. In this context, the ODD characterises all possible driving scenarios the AV might ever encounter and therefore itself holds infinite possibilities, with variables including road topologies, users, appearances, lighting, weather, behaviours, seasons, velocities, randomness and deliberate actions.

An industry standard approach to safety testing is based on actual driven test miles. A fleet of autonomous vehicles is driven by test drivers and a decision is characterised as unsafe when it is necessary for a test driver to intervene. Once an instance of test driver intervention has occurred in a particular real-world driving scenario, the circumstances of that driving scenario can be explored to isolate whatever factors caused the AV to behave unsafely and take appropriate mitigating action.

SUMMARY

Simulation has been used for safety testing but is only useful if the simulated scenarios are sufficiently realistic (if an AV planner makes an unsafe decision in a simulated scenario that is completely unrealistic, that is much less useful in the context of safety testing than an instance of unsafe behaviour in a realistic scenario).

One approach runs simulations based on real-world scenarios in which test driver intervention was necessary. The sensor outputs from the AV are collected and can be used to reconstruct, in a simulator, a driving scenario which necessitated test driver intervention. Variables of the scenario may be "fuzzed" at a planning level in order to test variations of the real-world scenario that are still realistic. In this manner, more information about the cause of the unsafe behaviour can be obtained, analysed and used to improve prediction and planning models. However, a significant problem arises because, as the number of errors per decision reduces, the number of test miles that need to be driven in order to find a sufficient number instance of unsafe behaviour increases. A typical AV planner might take, on average, about 1 decision every two seconds. At an average speed of 20 miles per hour, that equates to around 90 decisions per mile driven. This, in turn, implies less than one error per $10^5$ driven miles in order to match a human level of safety. Robust safety testing would require many multiples of that to sufficiently test the AV across its ODD. This is exacerbated further as the perception stack evolves as, with every change to the perception stack, more test miles are needed. For those reasons, this approach is simply not viable when testing at a level of safety approaching that of humans.

There are other problems with existing approaches to simulation.

One approach is planning-level simulation but this fails to adequately account for the effect of perception errors. Numerous factors can influence perception errors such as weather, lighting, distance to or velocity of another vehicle, occlusion etc.

An alternative would be full "photorealistic" simulation, in which the entire hardware and software stack of an AV is simulated. However, this in itself is an enormous challenge. An AV perception pipeline will typically be made up of multiple perception components which cooperate to interpret the AV's sensor outputs.

One problem is that certain perception components, such as Convolutional Neural Networks (CNNs), are particularly sensitive to the quality of the simulated data. Although it is possible to generate high quality simulated image data, the CNNs in perception are extremely sensitive to even the minutest deviations from real data. Therefore, these would require exceptionally high-quality simulated image data covering all possible conditions that an AV might encounter in the real-world (e.g. different combinations of simulated weather conditions, lighting conditions etc.)—otherwise their behaviour in a simulated scenario will not adequately reflect their behaviour in the real-world.

A second problem is that certain types of sensor data are particularly hard to model (simulate). Thus, even a perception system that is not particularly sensitive to the quality of the input data will give poor results, e.g. RADAR falls into the category of sensor data that is extremely difficult to simulate. This is because the physics of RADAR is inherently hard to model.

A third overarching problem is that of computational efficiency. Based on current hardware constraints, it is estimated that it might, at best, be possible to achieve photorealistic simulation in real-time (even if the other problems could be overcome).

The present disclosure provides a materially different approach to simulation-based safety testing using what are referred to herein as "Perception Statistical Performance Models" (PSPMs). A core problem addressed in this disclosure is that of simulating realistic perception outputs—that is, perception outputs with realistic errors—in a way that is not only more robust than photorealistic simulation but also significantly more efficient.

PSPMs model perception errors in terms of probabilistic uncertainty distributions, based on a robust statistical analysis of actual perception outputs computed by a perception component or components being modelled. A unique aspect of PSPMs is that, given a perception ground truth (i.e. a "perfect" perception output that would be computed by a perfect but unrealistic perception component), a PSPM provides a probabilistic uncertainty distribution that is representative of realistic perception components that might be provided by the perception component(s) it is modelling. For example, given a ground truth 3D bounding box, a PSPM which models a PSPM modelling a 3D bounding box detector will provide an uncertainty distribution representative of realistic 3D object detection outputs. Even when a perception system is deterministic, it can be usefully modelled as stochastic to account for epistemic uncertainty of the many hidden variables on which it depends on practice.

Perception ground truths will not, of course, be available at runtime in a real-world AV (this is the reason complex perception components are needed that can interpret imperfect sensor outputs robustly). However, perception ground truths can be derived directly from a simulated scenario run in a simulator. For example, given a 3D simulation of a driving scenario with an ego vehicle (the simulated AV being tested) in the presence of external actors, ground truth 3D bounding boxes can be directly computed from the simulated scenario for the external actors based on their size and pose (location and orientation) relative to the ego vehicle. A PSPM can then be used to derive realistic 3D bounding object detection outputs from those ground truths, which in turn can be processed by the remaining AV stack just as they would be at runtime.

A first aspect herein provides a computer system for testing and/or training a runtime stack for a robotic system, the computer system comprising:

- a simulator configured to run simulated scenarios, in which a simulated agent interacts with one or more external objects;
- a planner of the runtime stack configured to make autonomous decisions for each simulated scenario in dependence on a first time series of perception outputs and a second time series of perception outputs computed for the simulated scenario; and
- a controller of the runtime stack configured to generate a series of control signals for causing the simulated agent to execute the autonomous decisions as the simulated scenario progresses;
- wherein the computer system is configured to compute each perception output of the first time series by:
- computing a perception ground truth based on a current state of the simulated scenario,
- applying a first perception statistical performance model (PSPM) to the perception ground truth, thereby determining a probabilistic perception uncertainty distribution, and
- sampling the perception output from the probabilistic perception uncertainty distribution;
- wherein the first PSPM is for modelling a first perception slice of the runtime stack and is configured to determine the probabilistic perception uncertainty distribution based on a set of parameters learned from a set of actual perception outputs generated using the perception slice to be modelled;
- wherein the computer system is configured to compute the second time series of perception outputs using a second PSPM for modelling a second perception slice of the runtime stack, the first PSPM learned from data of a first sensor modality of the perception slice for computing the first time series, and the second PSPM learned independently thereof from data of a second sensor modality of the second perception slice for computing the second time series.

One benefit of this approach is modularity. Separate PSPMs can be independently trained to model different perception slices of the runtime stack, and redeployed in different configurations to test different configurations of the runtime stack without retraining.

In embodiments, computer system may be configured to apply at least one unmodelled perception component of the runtime stack to the first and second time series of perception outputs, thereby computing processed perception outputs, the planner configured to make said autonomous decisions in dependence on the processed perception outputs.

The unmodelled perception component may be a filtering component applied to the first and second time series of perception outputs, the processed perception outputs being filtered perception outputs.

The filtering component may be applied to fuse the time series of perception outputs of the first sensor modality with the second time series of perception outputs.

The PSPM may be applied to the perception ground truth and one or more confounders associated with the simulated scenario, each confounder being a variable of the PSPM whose value characterizes a physical condition applicable to the simulated scenario and on which the probabilistic perception uncertainty distribution depends.

The one or more confounders c may comprise one or more of the following confounders, which at least partially determine the probabilistic uncertainty distribution from which the perception output is sampled:

- an occlusion level for at least one of the external objects,
- one or more lighting conditions,
- an indication of time of day,
- one or more weather conditions,
- an indication of season,
- a physical property of at least one of the external objects,
- a sensor condition, for example a position of at least one of the external objects in a sensor field of view of the agent,
- a number or density of the external objects;
- a distance between two of the external objects,
- a truncation level for at least one of the external objects,
- a type of at least one of the objects, and
- an indication as to whether or not at least one of the external objects corresponds to any external object from an earlier time instant of the simulated scenario.

The computer system may comprise a scenario assessment component configured to assess the behaviour of the external agent in each of the simulated scenarios by applying a set of predetermined rules.

At least some of the predetermined rules may pertain to safety, and the scenario assessment component may be configured to assess the safety of the agent's behaviour in each of the simulated scenarios.

The scenario assessment component may be configured to automatically flag instances of unsafe behaviour by the agent for further analysis and testing.

The computer system may be configured to re-run a simulated scenario in which the agent originally exhibited unsafe behaviour based on a time series of perception ground truths determined for the re-run scenario, without applying the PSPM to those perception ground truths and therefore without perception errors, and assess whether the agent still exhibited unsafe behaviour in the re-run scenario.

The sampling from the probabilistic perception uncertainty distribution may be non-uniform and is biased towards lower-probability perception outputs.

The computer system may comprise a scenario fuzzing component configured to generate at least one fuzzed scenario for running in the simulator by fuzzing at least one existing scenario.

To model false negative detections, the probabilistic perception uncertainty distribution may provide a probability of successfully detecting a visible one of the objects, which is used to determine whether or not to provide an object detection output for that object, an object being visible when it is within a sensor field of view of the agent in the simulated scenario, whereby detection of the visible object is not guaranteed.

The perception ground truths may be computed for the one or more external objects using ray tracing.

At least one of the external objects may be a moving actor, the computer system comprising a prediction stack of the runtime stack configured to predict behaviour of the external actor based on the perception outputs, the planner configured to make the autonomous decisions in dependence on the predicted behaviour.

The computer system may be configured to record details of each simulated scenario in a test database, wherein the details include decisions made by the planner, the perception outputs on which those decisions were based, and the behaviour of the simulated agent in executing those decisions.

A second aspect herein provides a computer-implemented method of performance testing a runtime stack for a robotic system, the method comprising:
  running a simulated scenario in a simulator, in which a simulated agent interacts with one or more external objects, wherein a planner of the runtime stack makes autonomous decisions for the simulated scenario in dependence on first and second time series of perception outputs computed for the simulated scenario, and a controller of the runtime stack generate a series of control signals for causing the simulated agent to execute the autonomous decisions as the simulated scenario progresses;
  wherein each perception output of the first time series is computed by:
  computing a perception ground truth based on a current state of the simulated scenario,
  applying a first perception statistical performance model (PSPM) to the perception ground truth, thereby determining a probabilistic perception uncertainty distribution, and
  sampling the perception output from the probabilistic perception uncertainty distribution;
  wherein the first PSPM is for modelling a first perception slice of the runtime stack and determined the probabilistic perception uncertainty distribution based on a set of parameters learned from a set of actual perception outputs generated using the perception slice to be modelled;
  wherein the second time series of perception outputs is computed using a second PSPM for modelling a second perception slice of the runtime stack, the first PSPM learned from data of a first sensor modality of the perception slice for computing the time series, and the second PSPM learned independently thereof from data of a second sensor modality of the second perception slice for computing the second time series.

A further aspect herein provides a computer program for programming one or more computers to implement any method or functionality herein.

BRIEF DESCRIPTION OF FIGURES

For a better understanding of the present disclosure, and to show how embodiments of the same may be put into effect, reference is made to the accompanying figures in which.

DETAILED DESCRIPTION

1. Overview

The following description used the terms "PSPM" and "PRISM" interchangeably.

When making a safety case for an autonomous vehicle, it is impractical to perform all the required testing in the real world. However, constructing a simulation with such high fidelity that the vehicle's perception systems perform equivalently on real and simulated data is an unsolved problem. An approach referred to herein as "PRISM" addresses this problem by constructing a surrogate model of a perception system, including both the sensors and the perception component(s) that interpret the sensor data captured by the sensors. A PRISM is a distribution over plausible perception outputs given some low-fidelity scene representation (perception ground truth).

Expanding on the above, ensuring self-driving technologies are provably safe requires testing of self-driving technologies in a very large number of situations. Performing this testing with real cars is expensive and time consuming. In natural scenarios, most miles that are driven will be uneventful—in Great Britain in 2016, there were 136,621 injuries and 1,792 deaths due to road accidents, and 323.7 billion miles driven by all motor vehicles, which is only one accident every 2.4 million miles driven. Simulation must form part of a testing strategy for self-driving technologies. Simulated miles are much cheaper than real miles, and it is easier and safer to increase the number of hazards per mile in simulation than in the real world.

Figure 11:
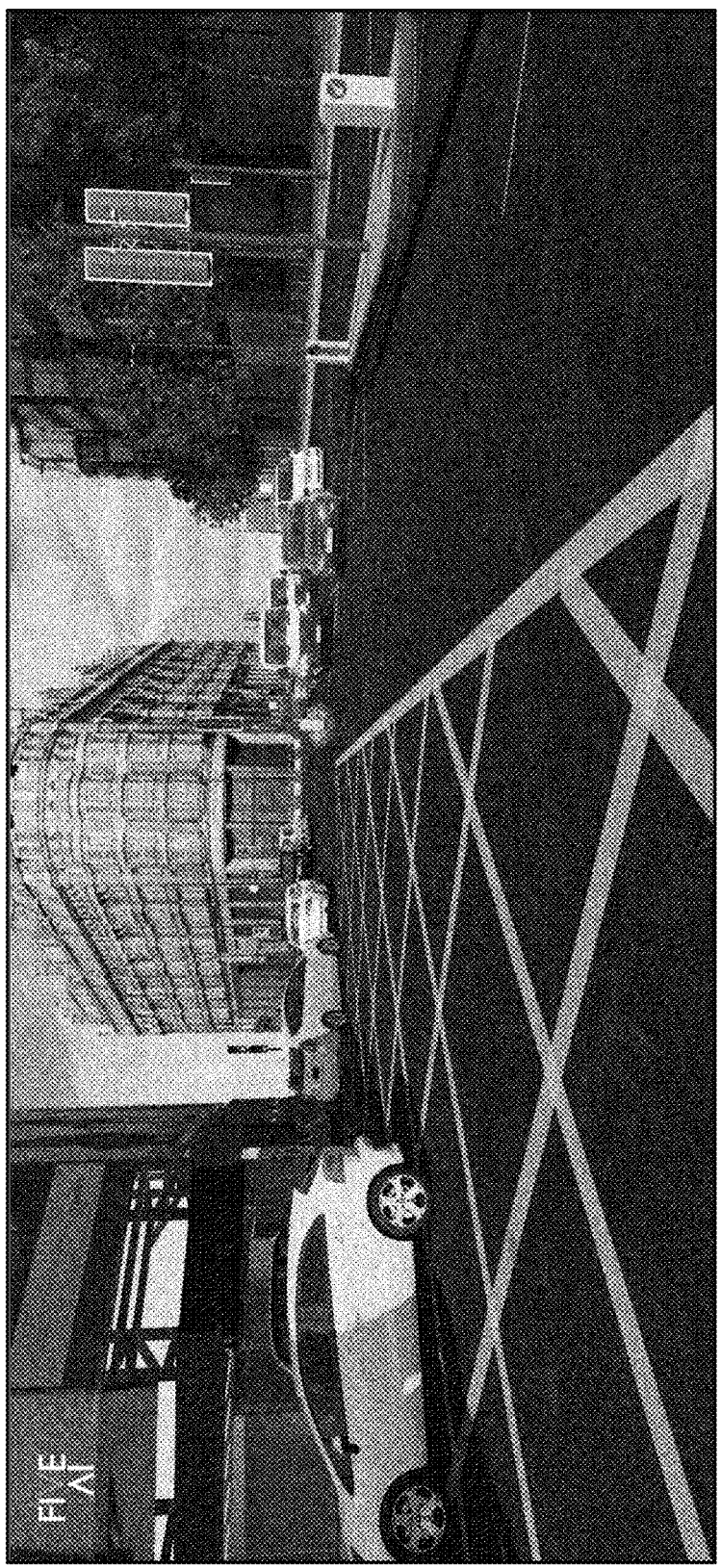
FIG. 11 shows an example of simulated image data, to which certain forms of perception component are highly sensitive.

One approach to generating realistic perception outputs is via a high-fidelity simulation of the world, including sensor measurements. In this approach, 'photo-realistic' sensor readings are produced, which are fed to the car's software in place of real sensor readings, e.g. a realistic twin of the real world rendered as an image for input to perception. Such a rendering is shown in FIG. 11. The car software outputs control signals for the car's actuators, which are fed to a physics simulation. New sensor readings are produced based on the output of the physics simulation, closing the loop. This approach requires producing accurate models for tasks that range from challenging to unsolved:

The road surface, vehicle dynamics and other physical properties are possible to simulate with current technology, but not well understood.

GPS, IMU and wheel-encodings are possible to simulate, but getting their error statistics correct is important.

Visual appearance, camera lens and image sensor modelling are reasonably well understood, but high-fidelity rendering is slow.

Lidar modelling is similar to camera modelling, though with different material reflectance properties. The scanning nature of lidar is an additional complication.

Radar returns are very hard to model accurately with current technology, due to difficulty in modelling relevant material properties, detailed dependence on shapes and multiple reflections.

Worst of all, the neural networks that are state-of-the-art for visual object detection are extremely sensitive to detailed image statistics, and constructing synthetic images that cause the same network behaviour as equivalent real images is an unsolved problem.

Inaccurate models of the above sensors will affect the output of the perception modules in simulation, leading to potentially different ego behaviour. Such differences in behaviour limit how useful these simulations can be in assessing real world performance. Furthermore, running photorealistic simulations of the many miles necessary to verify the safe behaviour of an autonomous vehicle is expensive. This is because rendering photorealistic scenes is a slow, compute-intensive task requiring GPUs. High-fidelity simulation is difficult and expensive, and the conclusions from tests conducted using a high-fidelity simulation are unlikely to generalise to the real world.

Figure 1:
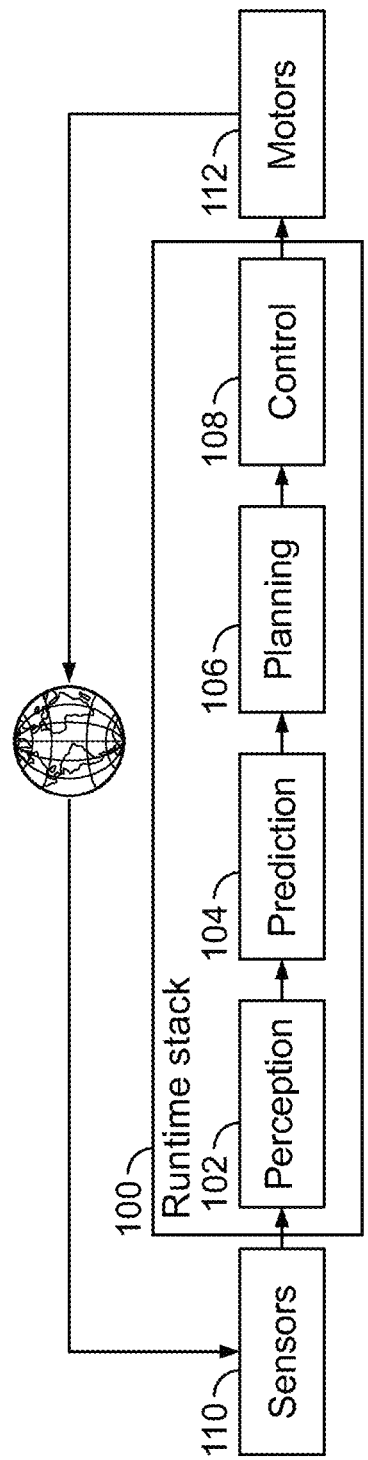
FIG. 1 shows a schematic block diagram of an autonomous vehicle runtime stack.

FIG. 1 shows a diagram of data flow through a decomposed autonomous vehicle stack 100. A perception system 102 receives sensor readings from the world and outputs a scene representation. A planning and prediction system (denoted separately by reference numerals 104 and 106) takes the scene representation and plans a trajectory through the scene. A control system 108 outputs control signals to the world that will cause the vehicle to follow the trajectory.

The perception system 102, planning and prediction system 104, 106 and control system 108 communicate with each other using well-defined interfaces. The perception system 102 consumes raw sensor data and processes it into a more abstract scene representation. This representation includes dynamic object pose, extent, motion and detection confidence. The planning and prediction system predicts the likely trajectories of other agents in the scene and plans a path through the scene that is safe, legal and comfortable. The control system consumes desired trajectories from the planning and prediction system and outputs control signals for the actuators.

In many cases, particularly in the case of the interface between perception and planning, these internal interfaces are easier to simulate than sensor readings. These interfaces may be leveraged for a second kind of simulation called low-fidelity simulation. It is possible to simulate only those aspects of the world that are necessary to reconstruct the abstract scene representation used by the planner, and feed that abstract scene representation directly to the planner, taking the perception system out of the loop. This avoids some of the burdens of high-fidelity simulation, but presents a new challenge: replicating the behaviour of the perception system. It is known that the perception system is not perfect and that its errors affect the prediction, planning and control systems in meaningful ways. Because the results of tests in simulation should generalise to the real world, it is necessary to be able to simulate realistic perception outputs.

An approach is presented for simulating realistic perception outputs using models called PRISMs. A PRISM is a distribution over plausible perception outputs given some low-fidelity scene representation. The mathematical framework that guides the creation of PRISMs is outlined, a prototype is created, and modelling choices are documented. Doing this demonstrates that the modelling approach is sensible.

In summary, in high-fidelity simulation, the world is replaced with a simulator, treating the entire vehicle stack as a black box. In low-fidelity simulation, the world and the perception system 102 are replaced (see FIG. 4 and description below).

FIG. 1 shows a highly schematic block diagram of a runtime stack 100 for an autonomous vehicle (AV). The runtime stack 100 is shown to comprise a perception stack 102, a prediction stack 104, a planner 106 and a controller 108.

The perception stack 102 receives sensor outputs from an on-board sensor system 110 of the AV.

The on-board sensor system 110 can take different forms but generally comprises a variety of sensors such as image capture devices (cameras/optical sensors), LiDAR and/or RADAR unit(s), satellite-positioning sensor(s) (GPS etc.), motion sensor(s) (accelerometers, gyroscopes etc.) etc., which collectively provide rich sensor data from which it is possible to extract detailed information about the surrounding environment and the state of the AV and any external actors (vehicles, pedestrians, cyclists etc.) within that environment.

Hence, the sensor outputs typically comprise sensor data of multiple sensor modalities such as stereo images from one or more stereo optical sensors, LiDAR, RADAR etc.

The perception stack 102 comprises multiple perception components which co-operate to interpret the sensor outputs and thereby provide perception outputs to the prediction stack 104.

The perception outputs from the perception stack 102 are used by the prediction stack 104 to predict future behaviour of the external actors.

Predictions computed by the prediction stack 104 are provided to the planner 106, which uses the predictions to make autonomous driving decisions to be executed by the AV in a way that takes into account the predicted behaviour of the external actors.

The controller 108 executes the decisions taken by the planner 106 by providing suitable control signals to on-board motors 112 of the AV. In particular, the planner 106 plans manoeuvres to be taken by the AV and the controller 108 generates control signals in order to execute those manoeuvres.

Figure 2:
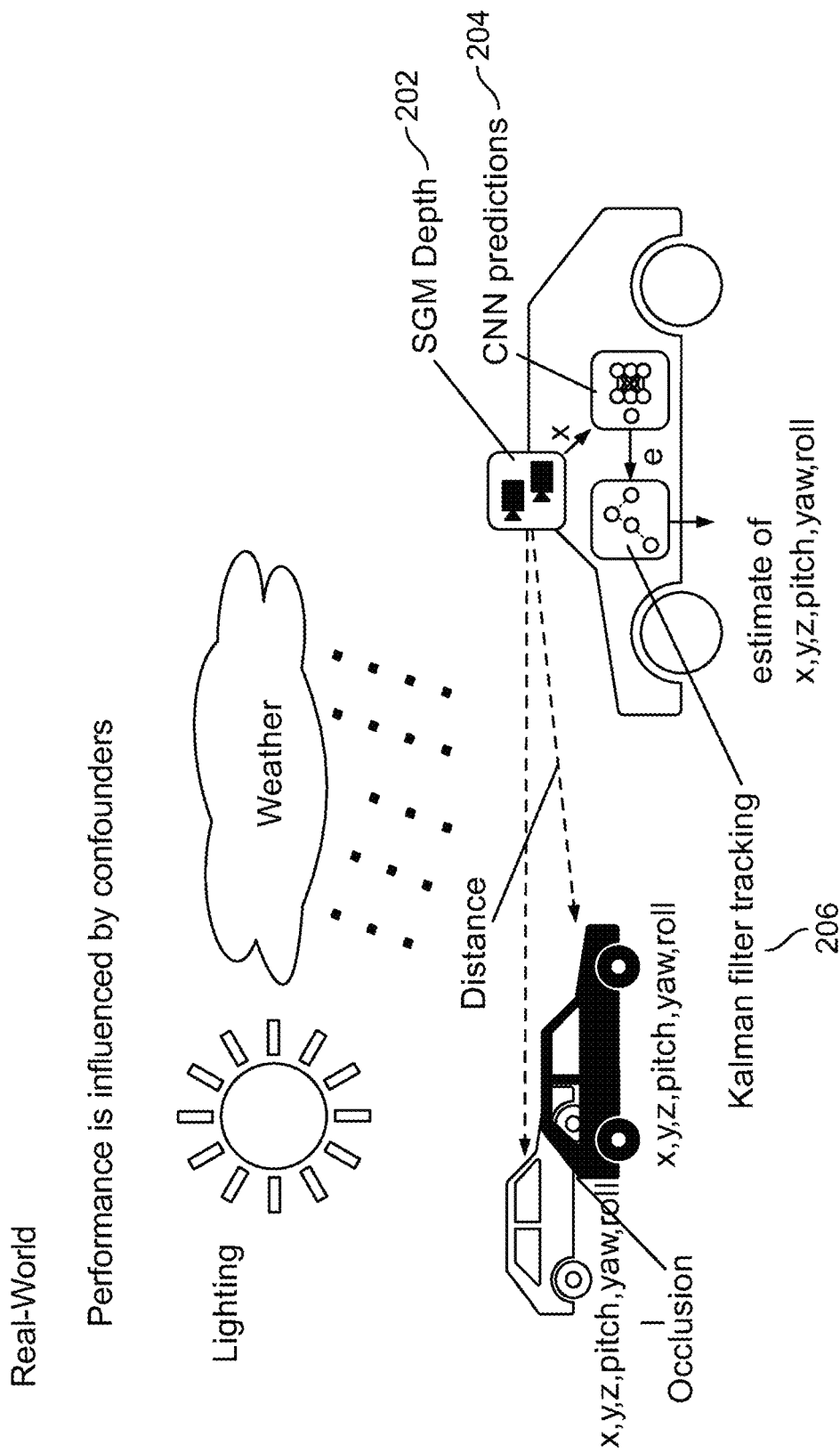
FIG. 2 shows an example of a real-world driving scenario.

FIG. 2 shows an example of certain perception components which might form part of the perception stack 102, namely a 3D object detector 204 and a Kalman filter 206.

A depth estimator 202 captures stereo image pairs and applies stereo imaging (such as Semi-Global Matching) to extract depth estimates therefrom. Each depth estimate is in the form of a depth map, which assigns depth values to pixels of one image of the stereo image pair from which it is derived (the other image is used as a reference). The depth estimator 202 comprises a stereo pair of optical sensors and a stereo processing component (hardware and/or software) which are not shown separately. Both the optical sensors and the stereo processing component of the depth estimator 202 are considered part of the on-board sensor system 110 according to the terminology used herein (not the perception stack 102). The depth maps are one form of sensor output provided to the perception stack 102.

The 3D object detector 204 receives the depth estimates and uses them to estimate poses for external actors in the vicinity of the AV (ego vehicle). Two such external actors are shown, in the form of two other vehicles. Pose in this context means 6D pose, i.e. (x,y,z,pitch,roll,yaw), denoting the location and orientation of each external actor in 3D space.

FIG. 2 is highly simplified for the purposes of illustration. For example, it may be that the 3D object detector is formed of multiple cooperating perception components which collectively operate on sensor outputs of multiple sensor modalities. The application of PSPMs to more complex stacks is described later. For the time being, in order to illustrate certain core principles of PSPMs, a simplified example is considered in which the 3D object detector is assumed to operate on sensor outputs of a single modality (stereo depth).

In a real-world scenario, multiple physical conditions can influence the performance of the perception stack 102. As indicated, a physical condition which is treated as a variable in respect of a particular PSPM is referred to as a "confounder". This allows variable physical conditions that are statistically relevant to a particular perception slice to be accounted for.

Figure 3:
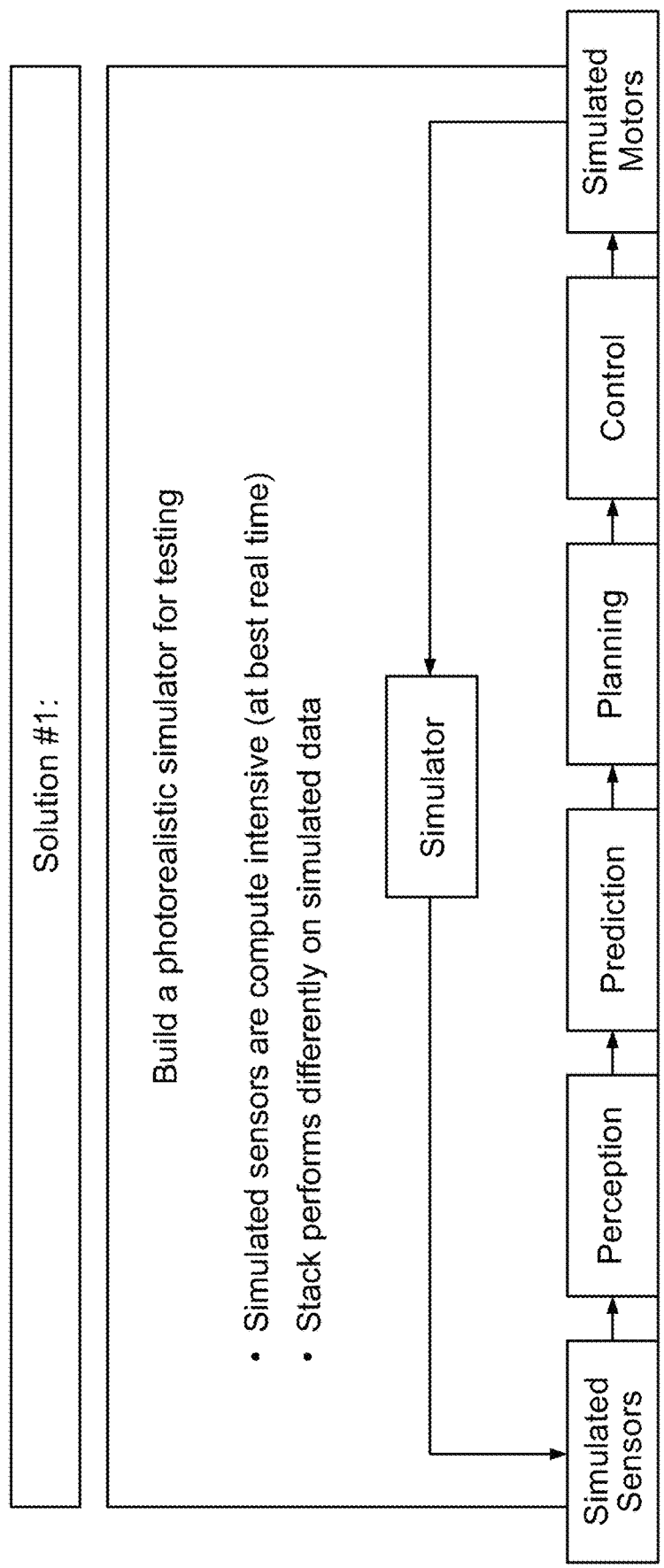
FIG. 3 shows a testing pipeline using photorealistic simulation.

As mentioned, one approach to simulation would be to attempt photorealistic simulation of not only the entire runtime stack 100 of FIG. 1 but also the on-board sensor system 110 and the motors 112. This is illustrated in FIG. 3. A challenge in this scenario is the simulation of sensor data: certain types of sensor data (e.g. RADAR) are inherently very difficult to simulate well and, whilst other types of sensor data (image data) are relatively easier to simulate, certain perception components, such as CNNs, are highly sensitive to even minute deviations from actual sensor data. Another challenge is the significant computational resources required to simulate both sensors and to run complex perception components such as CNNs.

For example, for the arrangement of FIG. 3, it would require extremely high-quality depth maps to be simulated and the 3D object detector 204 to be run on those simulated depth maps. Even miniscule deviation in the simulated depth maps (compared to real depth maps provided the stereo depth estimator 202) could significantly impact the performance of the 3D object detector 204 during the simulation.

Figure 4:
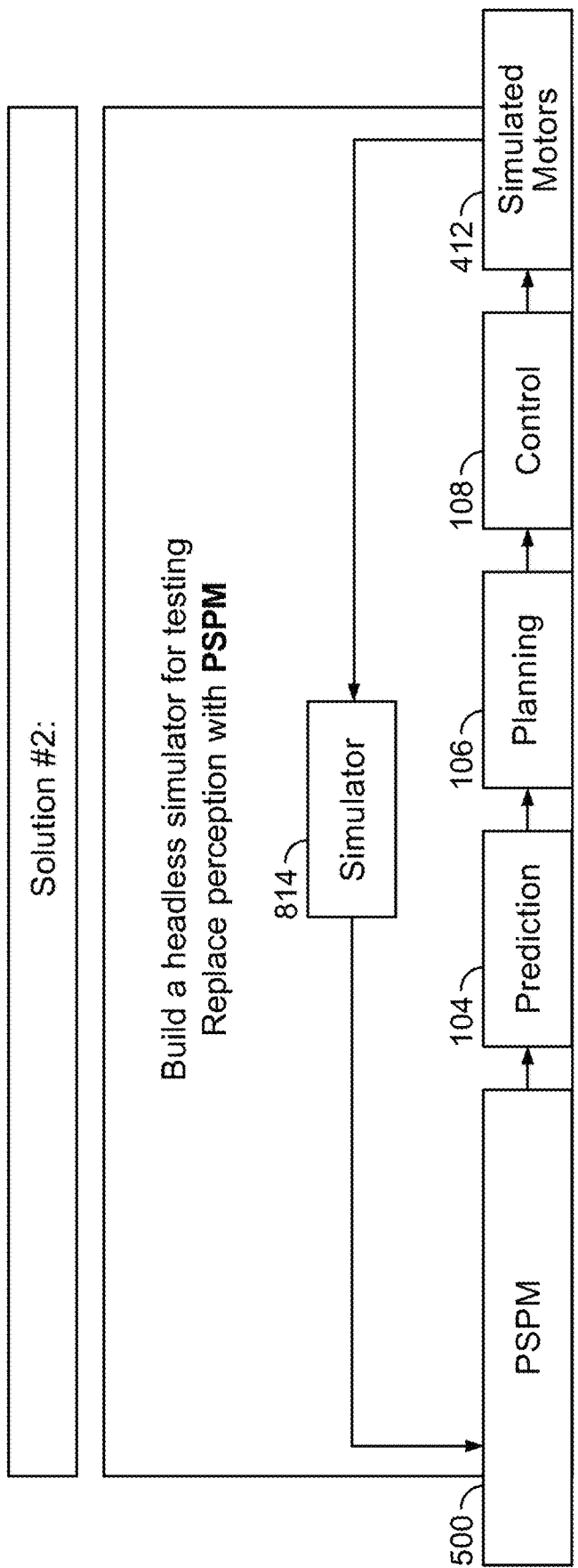
FIG. 4 shows an alternative PSPM-based testing pipeline in accordance with the present disclosure.

FIG. 4 provides a high-level schematic overview of PSPM based simulation. In this case a "headless" simulator set up is used, without the need to create simulated sensor data (e.g. simulated images, depth maps, LiDAR and/or RADAR measurements etc.), and without applying the perception stack 102 (or at least without applying it in full—see below). Instead, one or more PSPMs are used to efficiently compute realistic perception outputs, which in turn feed into higher-level components of the runtime stack 100 and are processed as they would be at runtime.

A PSPM is said to model a "perception slice" which can be all or part of the perception stack 102. A perception slice can be a single perception component or multiple cooperating perception components.

Mathematically, a perception slice may be represented as a function F where $$e = F(x),$$

e being a perception output of the perception slice and x being a set of sensor outputs on which the perception component(s) operate.

On the AV at runtime, e is determined by applying F to x, which in turn is given by a sensor(s).

A PSPM mapped to a confounder space C may be represented as a function p where $$p(e|t,c)$$

represents a probabilistic uncertainty distribution that provides the probability of F computing a perception output e given a perception ground truth t and a set of one or more confounders c (i.e. given a particular set of possible real-world conditions represented by the point c in the confounder space C)

For example, for 2D bounding box detection:
F may be a CNN
x may be an RGB image
t could be a ground truth bounding box which can be computed directly from the simulation using ray tracing (without simulating x and without applying F), or a set of multiple such bounding boxed for multiple ground truth objects (set-to-set approach)
c might be distance and/or weather etc.

In the example of FIG. 3, e represents one or more 6D pose vectors computed by the 3D object detector 204 and x represents a depth map provided by the stereo depth estimator 202 from which e is derived.

Figure 5:
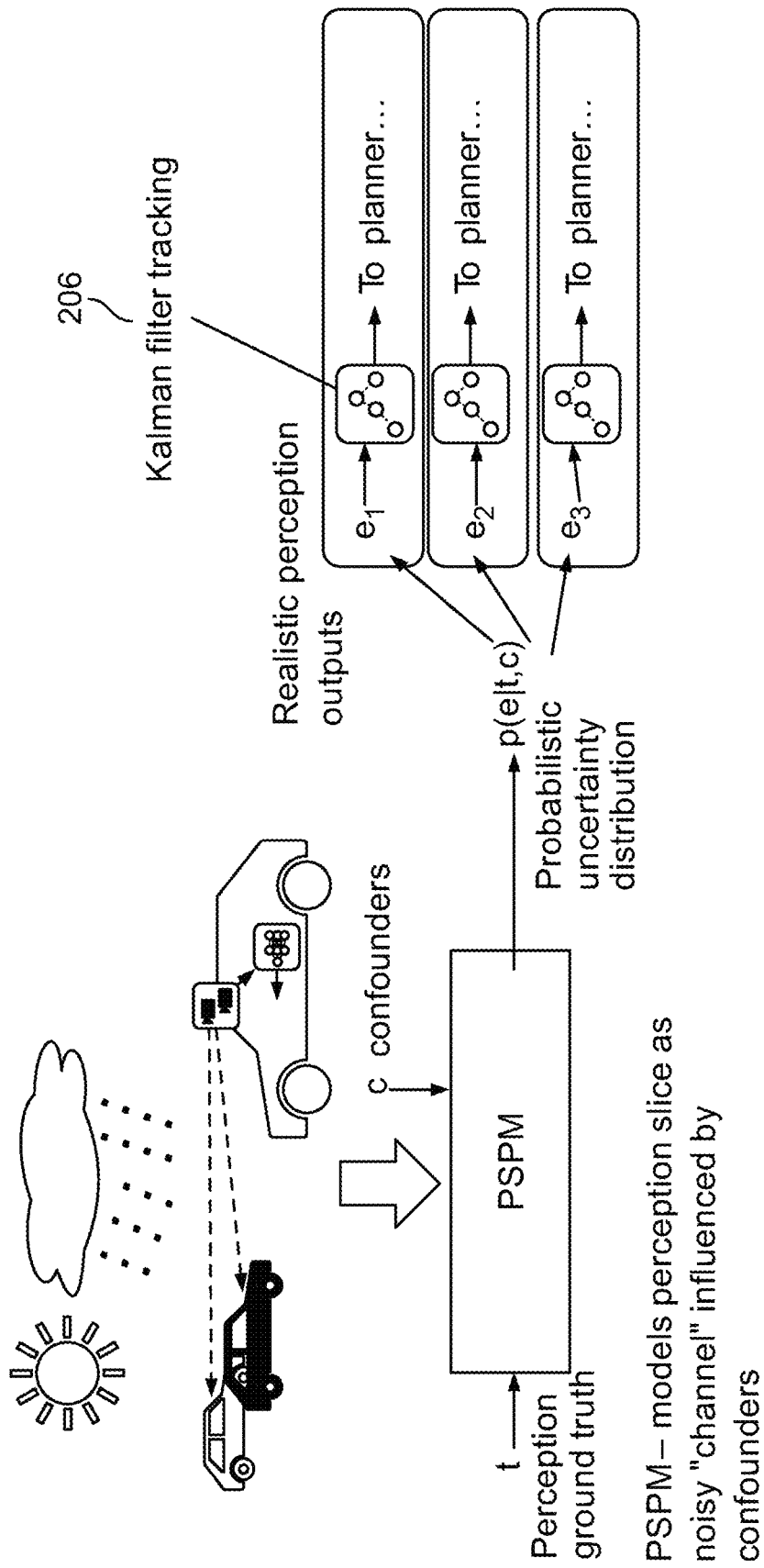
FIG. 5 shows how perception performance may be influenced by confounders.

FIG. 5 shows how a PSPM may be used to simulate realistic perception outputs for the scenario of FIG. 3. In this case, the perception slice is the 3D object detector 204.

Realistic in the present context refers to perception outputs which are more realistic than the perception ground truths.

A PSPM 500 is provided which essentially models the perception slice 204 as a noisy "channel" which is influenced both by the characteristics of the stereo depth estimator 202 and also the physical environment. The physical environment is characterized by a set of confounders c which, in this example are: lighting, weather, occlusion and distance to each external actor.

In order to apply the PSPM 500, a perception ground truth can be computed directly from a simulated scenario under consideration. For example, in a simulated scenario in which a simulated AV (ego vehicle) has a number of external actors in its vicinity, a 6D pose ground truth can be determined by directly computing the 6D pose of each external actor in the ego vehicle's frame of reference.

The PSPM 500 then uses the computed ground truth t to compute the distribution p(e|t,c). Continuing the above example, this would provide, for each simulated external actor, the probability that the actual 3D object detector 204 would compute perception output e [estimated 3D pose(s) of the external actor(s)] given perception ground truth t [the "actual" 6D pose(s)] in a real-world scenario characterized by the same confounders c.

Having computed p(e|t,c), it can be used to run multiple simulations for a range of realistic perception outputs (PSPM samples) obtained by sampling p(e|t,c). Realistic means of sufficiently high probability according to p(e|t,c)—noting that it may well be desirable to test relatively low probability perception outputs (outliers) provided they are still realistic. The extent to which outliers are tested will depend on the level of safety the AV is required to meet.

In FIG. 5, three realistic perception outputs $e_1$, $e_2$, $e_3$ are shown by way of example. These are sampled from p(e|t,c).

One approach would be to sample perception outputs from p(e|t,c) in a way that favours the most probable perception outputs, e.g. using Monte Carlo sampling. This would, broadly speaking, test a larger number of the most probably perception outputs and fewer less probable outputs.

However, whilst this may be useful in some contexts, in others it may be more useful to deliberately test a greater number of "outliers", i.e. less probable but still realistic perception outputs, as it may be that outliers are more likely to cause or contribute to unsafe behaviour. That is, p(e|t,c) may be sampled in a way that is deliberately biased towards outliers to deliberately make a particular scenario more "challenging" or "interesting" as it progresses.

This could be implemented by transforming the distribution of the PSPM and sampling from the transformed distribution.

Figure 6:
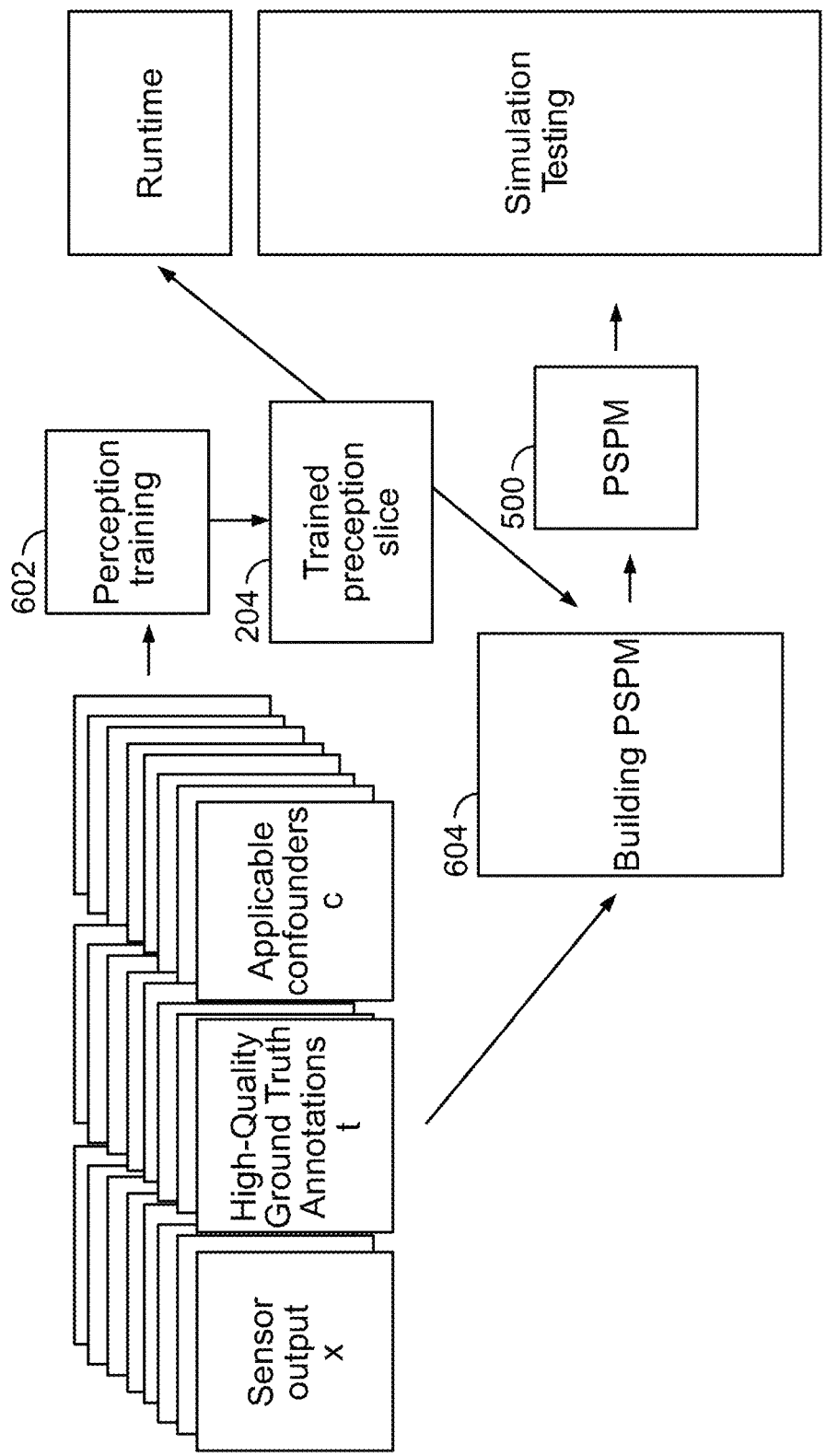
FIG. 6 provides a high-level overview of certain principles of PSPM-based safety testing.

FIG. 6 provides an overview of a process of building a PSPM. A vast number of real sensor outputs x are collected and annotated with perception ground truths t. This exactly the same process as used to generate training data for training the perception components of the perception stack 102 (denoted by block 602)—and a first subset of the annotated sensor outputs are used for this propose. A trained perception slice 204 is shown, which is executed at run-time (in the real-world) and for the purpose of building a PSPM 500 which will model that perception slice 204 at simulation.

Continuing the example of FIG. 3, the real sensor outputs would be depth maps and the ground truths would be ground truth 6D poses of any objects captured in the depth map. Such annotated data is used not only to train the 3D object detector 204 (the perception slice in this example), but is also used to build the PSPM 500 which models the 3D object detector during simulation.

Block 604 denotes PSPM building (training) and a second subset of the annotated sensor outputs is used for this purpose. Each sensor output is additionally annotated with a set of confounders c which characterize the physical conditions in which it was captured in the real-world. A large number of sensor outputs are needed for every set of confounders c that the PSPM needs to be able to accommodate. For full "level 4" autonomy, this means capturing and annotating sensor outputs across the whole ODD.

A PSPM 500 can take the form of a parametric distribution $$\text{Dist}(t,c;\theta)$$

where t and c are variables on which the distribution depends and $\theta$ is a set of learned parameters.

The parameters $\theta$ are learned as follows:
1) Apply the trained perception slice 204 to each sensor output x to compute a corresponding perception output e;
2) For each perception output e, determine a deviation (error) $\Delta$ between e and the corresponding ground truth t;
3) Each error $\Delta$ is associated with the ground truth t and the set of confounders c pertaining to the corresponding sensor output x;
4) Tune the parameters $\theta$ to fit the distribution to the errors $\Delta$, taking into account the associated ground truths and variable confounders c.

As will be apparent, various known forms of parametric distribution/model can be applied in this context. Therefore the details are not described further.

More generally, the training set used for PSPM training is made up of perception ground truths (from manual, automatic or semi-automatic annotation), and corresponding actual perception outputs generated by the perception slice 204 to be modelled. The aim in training is to learn mappings between perception ground truths and perception output distributions that capture the statistics of the actual perception outputs. Hence, perception outputs sampled from the distribution p(e|t) for a given ground truth t will be statistically similar to the actual perception outputs used for training.

As one example, the perception slice 204 could be modelled as having zero-mean Gaussian noise. It is emphasised, however, that the present disclosure is not limited in this respect. PSPMs may well take the form of more sophisticated non-Gaussian models. As one example, a PSPM could take the form of a hidden Markov model, which would allow time-dependency between perceptions outputs at different times to be explicitly modelled.

In the case of a Gaussian case, the PSPM 500 could, for example, be characterized as:

$$e = t + \varepsilon$$

$$\varepsilon \sim N(0, \Sigma(c)),$$

where $N(0, \Sigma(c))$ denotes a Gaussian distribution having zero-mean and a covariance $\Sigma(c)$ that varies as a function the confounders c. During simulation, noise would then be sampled from the Gaussian and added to the perception ground truths. This would be dependent on the variance of the Gaussian, and hence on the confounders applicable to the simulated scenario.

Example PSPM Error Dataset

Figure 7:
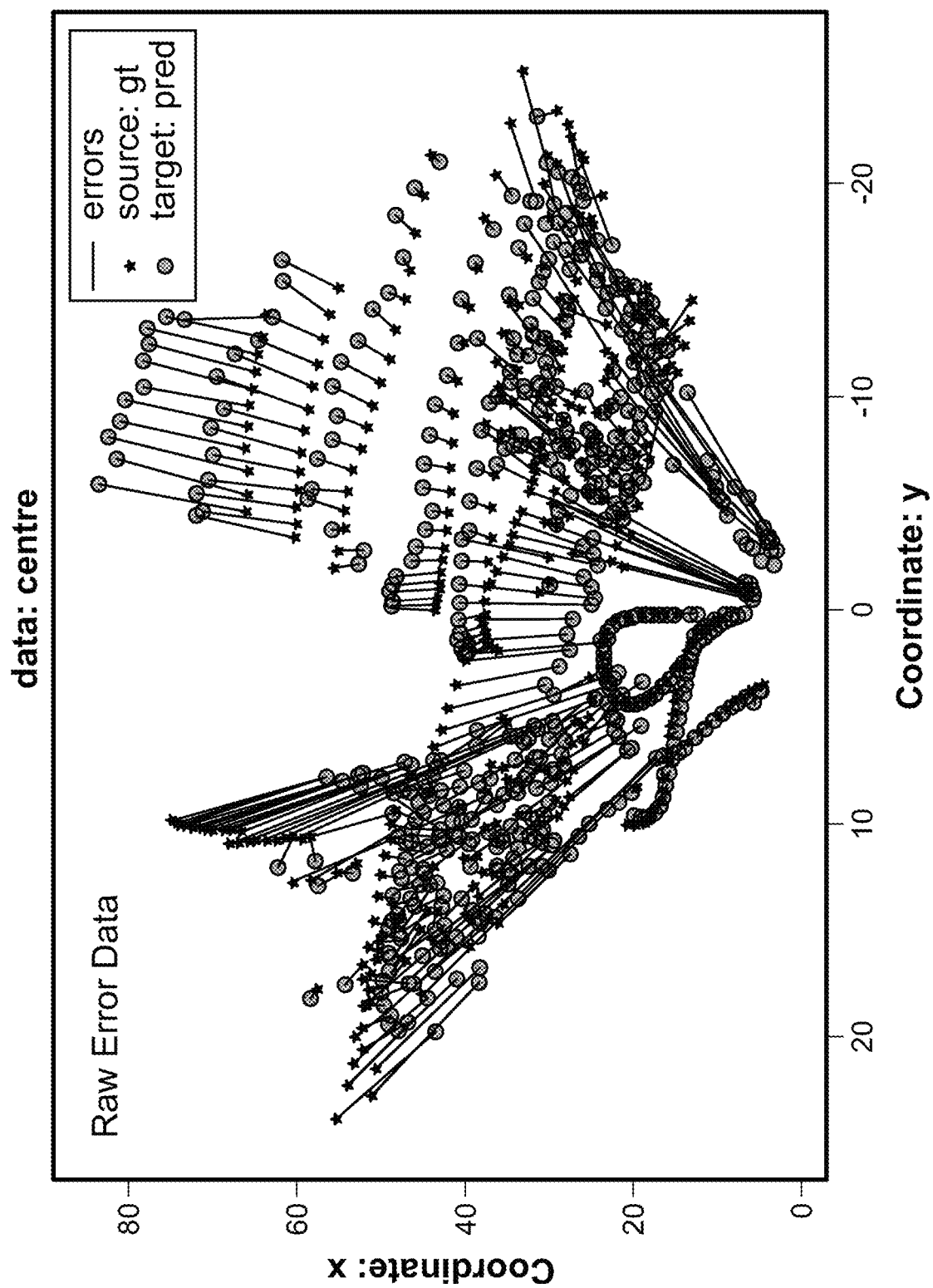
FIG. 7 shows a perception error dataset which may be used to train a PSPM.

FIG. 7 shows an example of a raw error plot for a two-dimensional prediction space—e.g. each point could correspond to an (x,y) coordinate that might be estimated by a 2D object detector. Each prediction e is represented by a circle and each ground truth t is represented by a star. Each error Δ is represented by a line segment between the corresponding prediction e and the corresponding ground truth t (a longer line segment denotes a larger error).

In order to build a PSPM, the aim would be to tune a parametric distribution in a way that accurately captures the error relationships between the data points of FIG. 7 in probabilistic terms (the data points being the errors Δ in this context), taking into account the variable confounders c.

Figure 7A:
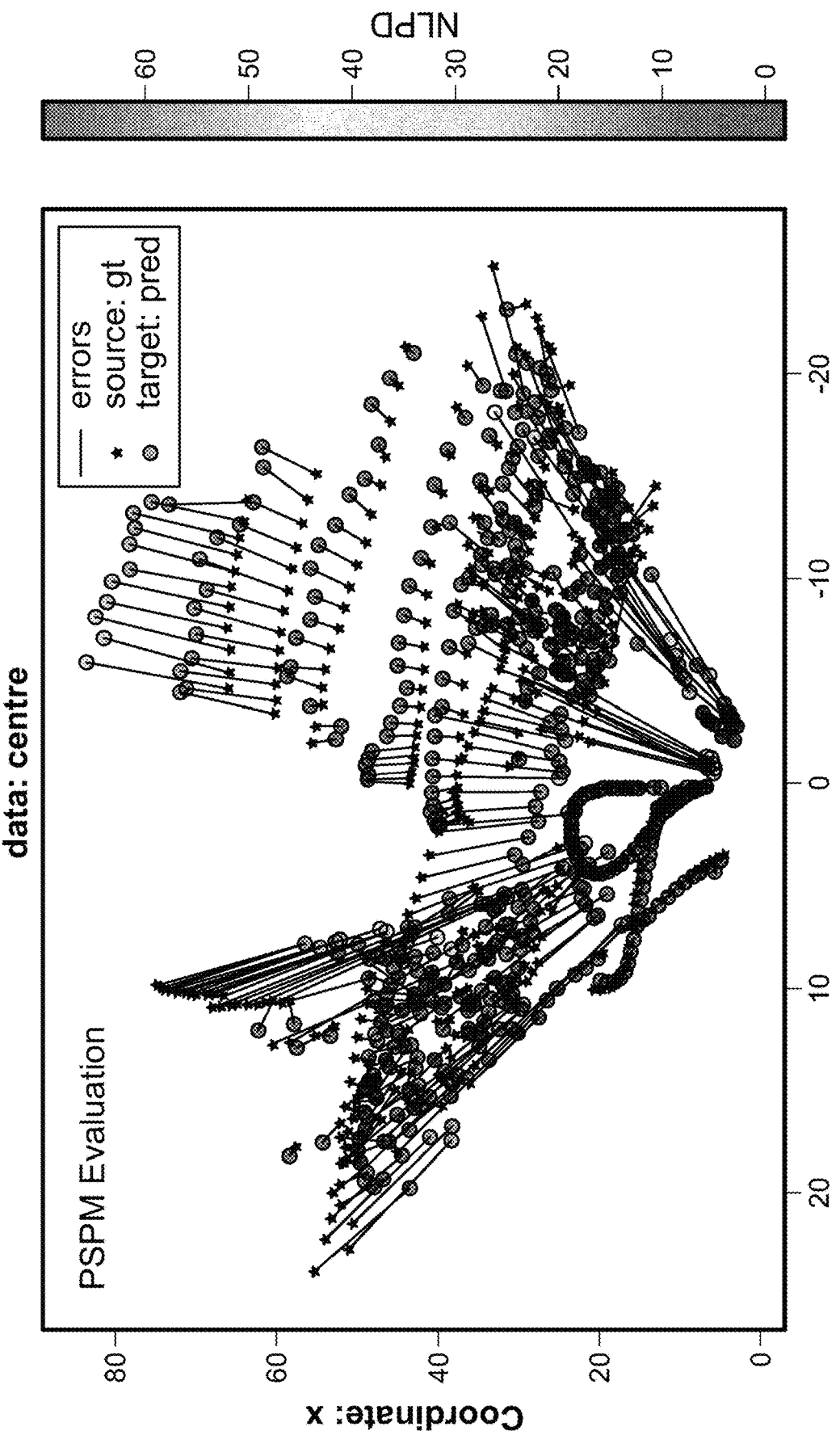
FIG. 7A shows results of a trained PSPM applied to the perception error dataset of FIG. 7.

FIG. 7A shows the results of a trained PSPM applied to the error dataset of FIG. 7.

Choosing Confounders

Decisions about which confounder to incorporate are driven by observation: when it can be seen that a particular physical property/condition is having a material effect on perception uncertainty, that could be a trigger to introduce that as a confounder variable into the applicable PSPM(s). Only confounders which are statistically relevant should be introduced.

One approach to confounders is to divide the error dataset according to confounders, and train a separate model for each division of the dataset. To take a very simple example, two confounders might be "lighting" and "weather" each of which can take a binary "good/poor" value. In this case, the dataset may be divided into four subsets having (lighting, weather)=(good, good), (good, bad), (bad, good) and (bad, bad) respectively, and four separate models may be trained for each subset. In that case, the PSPM is made up of four models, with the confounder variable c=(lighting, weather) acting as an index that determines the choice of model.

Engineering Pipeline Architecture

Figure 8:
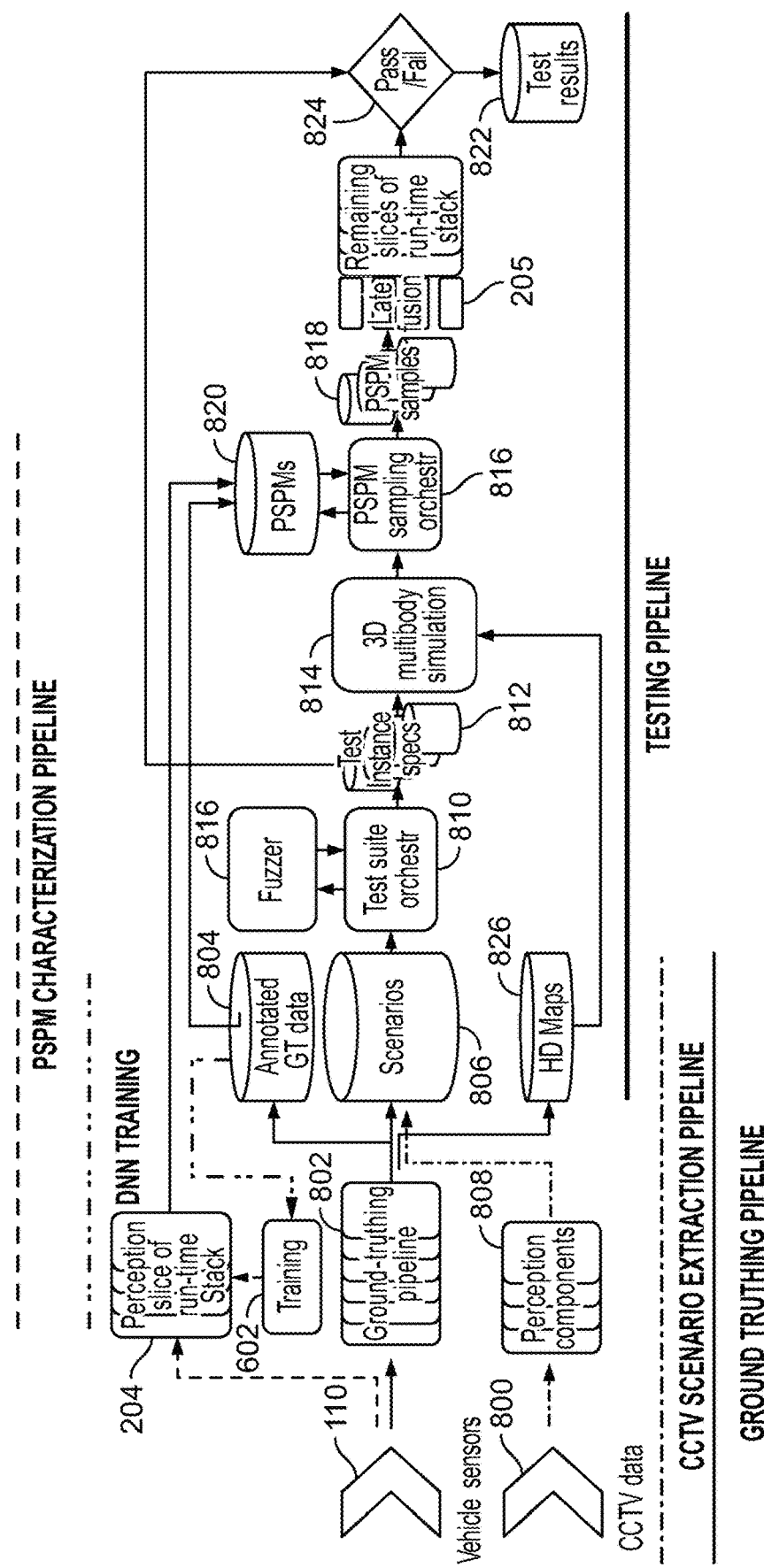
FIG. 8 shows an engineering pipeline which incorporates PSPMs.

FIG. 8 shows a highly schematic overview of an engineering pipeline which incorporates PSPMs. The overall pipeline covers everything from data collection, annotation and extraction; training of perception components; PSPM characterisation and simulation-based testing.

A large number of sensor outputs, such as stereo images, depth maps, LiDAR measurements and RADAR measurements, are collected using a fleet of vehicles each equipped with a sensor system 110 of the kind described above. These are collected in the kind of environments and driving scenarios that an AV will need to be able to handle in practice, for example in target urban areas in which deployment of AVs is desired. The collecting vehicles themselves can be AVs or they can be manually-driven vehicles equipped with similar sensor systems.

A ground-truthing pipeline 802 is provided for the purpose of annotating the captured sensor outputs with ground truths. This includes the annotation of sensor outputs with perception ground truths of the kind described above. Sensor outputs annotated with perception ground truths are stored in an annotated ground truth database 804. Further details are described below.

Additionally, sensor outputs captured by the vehicle fleet are also used to extract driving scenarios which can then be re-created in a simulator. Driving scenarios are captured using a high-level structured scenario description language and are stored in a scenarios database 806.

Sensor outputs captured from the vehicle fleet are not the only source of information from which driving scenarios can be extracted. In addition, CCTV (closed circuit television) data is used as a basis for scenario extraction, typically CCTV data captured in urban environments showing, for example, challenging urban driving scenarios such as complex roundabouts. This provides a rich source of challenging driving scenarios which, in turn, provides an excellent basis for safety testing. A set of back-end perception components 808 are used to process the CCTV data 800 to assist in the process of extracting driving scenarios therefrom, which in turn are also stored in the scenarios database 806 in the scenario description language format.

Further details of the scenario description language and the process of extracting scenarios from CCTV data and other data may be found in United Kingdom Patent Application No. 1816852.6, which is incorporated herein by reference in its entirety.

A driving scenario captured in a scenario description language format is a high-level description of a driving scenario. A driving scenario has both a static layout, such as road layout (lanes, markings etc.), buildings, road infrastructure etc. and dynamic elements. In the pipeline of FIG. 8, static layout is captured in a scenario description as a pointer to an HD (high definition) map, stored in a map database 826. The HD maps themselves may be derived from the annotated sensor outputs collected by the fleet of AVs and/or from CCTV.

Dynamic elements include, for example, positions and movement of actors within the static layout (e.g. vehicles, pedestrians, cyclists etc.) and are captured in the scenario description language.

Running Simulations

A test suite orchestration component 810 uses the captured driving scenarios to formulate test instance specifications 812, which in turn can be run in a 3D simulator 814 as 3D multibody simulations. The purpose of these simulations is to enable accurate perception ground truths to be derived, to which PSPMs are then applied. Hence, they contain a sufficient level of 3D geometric detail to be able to derive e.g. ground truth 3D bounding boxes (size, 6D pose of external actors in the frame of reference of the ego vehicle), odometry and ego-localization outputs etc. However, they are not photorealistic simulations, because that level of detail is not required. They also do not attempt to simulate conditions such as rain, lighting etc. because those are modelled as the confounders c.

To provide greater variation of scenarios, a scenario "fuzzer" 820 is provided which can fuzz scenarios in the above sense. Fuzzing a scenario means altering one or more variables of the scenario to create a new scenario that is still realistic.

Typically, this would involve fuzzing dynamic elements into the static scene, for example, changing the motion of external actors, removing or adding external actors etc.

However, the static layout may also be fuzzed, for example to change the curvature of the road, change the location of static objects, change road/lane markings etc.

The training block 602 of FIG. 8 is shown to have access to the annotated ground truth data database 804, which, as noted, is used for the purpose of training the perception slice(s) 204 of the run time stack 100.

As noted above and shown in FIG. 8, the perception slice 204 is not necessarily the entirety of the perception stack 102. In this example, the perception stack 102 is "sliced" before a final set of fusion components (filters) which co-operate to fuse perception outputs from lower down the perception stack 102. These form part of one or more remaining prediction slices 205, which are not modelled using PSPMs but are applied to PSPM samples. The outputs of the final (unmodelled) prediction slice(s) 205 feed directly into the prediction stack 104.

The PSPMs are shown to be stored in a PSPM database 820.

Running Simulations

A PSPM sampling orchestration component 816 uses 3D multibody simulations in the 3D simulator 814 to derive ground truths, which in turn form inputs to the one or more PSPMs used to model the perception slice 104 PSPM and provide PSPM samples 818 for each simulation. The PSPM samples 818 are fed into the remainder of the runtime stack 100, i.e. into the final set of filters 205 in this example, and used as a basis for planning and prediction, ultimately causing the controller 108 to generate control signals that are provided to a set of simulated AV motors.

The simulated motors are not shown in FIG. 8 but are shown in FIG. 4 and are denoted therein by reference numeral 412. As indicated in FIG. 4, the 3D multibody simulation in the 3D simulator is driven in part by the simulated motors. These determine how an agent (simulated in this case) moves within the static layout (i.e. they determine changes in the agent's state, which may be referred to herein as a simulated robot state). The behaviour of the agent, in turn, might also influence the behaviour of simulated external actors as they respond to the AV's motion. As the 3D simulation progresses, new perception ground truths continue to be derived and fed to the PSPMs 500 in an iterative manner until the simulation completes.

Each completed simulation is logged as a set of test results stored in a test database 822.

Note, the same scenario can be run multiple times and will not necessarily yield the same results. This is due to the probabilistic nature of PSPMs: each time the scenario is run, different PSPM samples may be obtained from the PSPMs. A significant amount of information can therefore be gained by running the same simulated scenarios on multiple occasions and observing, for instance, the extent to which the simulated agent behaves differently in each instance of that scenario (a large discrepancy in the agent's behaviour indicates that the effect of perception errors is significant), or the proportion of scenario instances in which the agent behaves unsafely. If the same scenario is run a large number of times and the agent behaves safely and very similarly in each scenario, that indicates that the planner 106 is able to plan properly under uncertainty in that scenario.

Test Oracle

The driving scenarios used as a basis for the simulation are generally based on real-world scenarios or fuzzed real-world scenarios. This ensures that realistic scenarios are being tested. Note however that these are generally driving scenarios that have not involved any actual autonomous vehicles, i.e., for the most part at least, the driving scenarios that are tested are derived from real-life instances of human driving. There is therefore no way of knowing which scenarios are likely to result in failure.

For this reason, a scenario assessment component 824, referred to herein as the "test oracle" is provided and has the role of assessing, once a simulation has completed, whether the simulated AV behaved acceptably in that scenario or not. The output of the test oracle 824 can include a simple binary (yes/no) output to flag whether or not the AV behaved safely, or it can be a more complex output. For example, it may include a risk score.

In order to do this, the test oracle 824 applies a set of predetermined rules which may be referred to herein as a "Digital Highway Code" (DHC). In essence, this hard-codes the rules that define safe driving behaviour. If the scenario is completed without violating those rules, then the AV is deemed to have passed. However, if any of those rules is breached, then the AV is deemed to have failed and this is flagged as an instance of unsafe behaviour that requires further testing and analysis. Those rules are encoded at an ontological level so that they may be applied to an ontological description of the scenario. The concept of ontology is known in the field of robotics and, in the present context, aims to characterise the driving scenario and the behaviour of the simulated AV in that scenario at the same level of abstraction so that the DHC rules can be applied by the test oracle 824. The results of the analysis may quantify how well the agent performed with respect to the DHC e.g. the extent to which rules are violated (e.g. a rule might specify a certain distance from a cyclist should always be maintained, and the results may indicate the extent to which this rule was violated, and the circumstances in which it was violated).

An instance of unsafe behaviour can also be flagged as one in which a "disengagement" was necessary. For example, this could be where a failover mechanism within the runtime stack was activated in order to prevent a crash or some other critical failure (just as it would have been in that scenario in the real-world).

The present techniques are not limited to detecting unsafe behaviour. Behaviour may be assessed with respect to other metrics, such as comfort, progression etc.

Example Perception Stack

Figure 9:
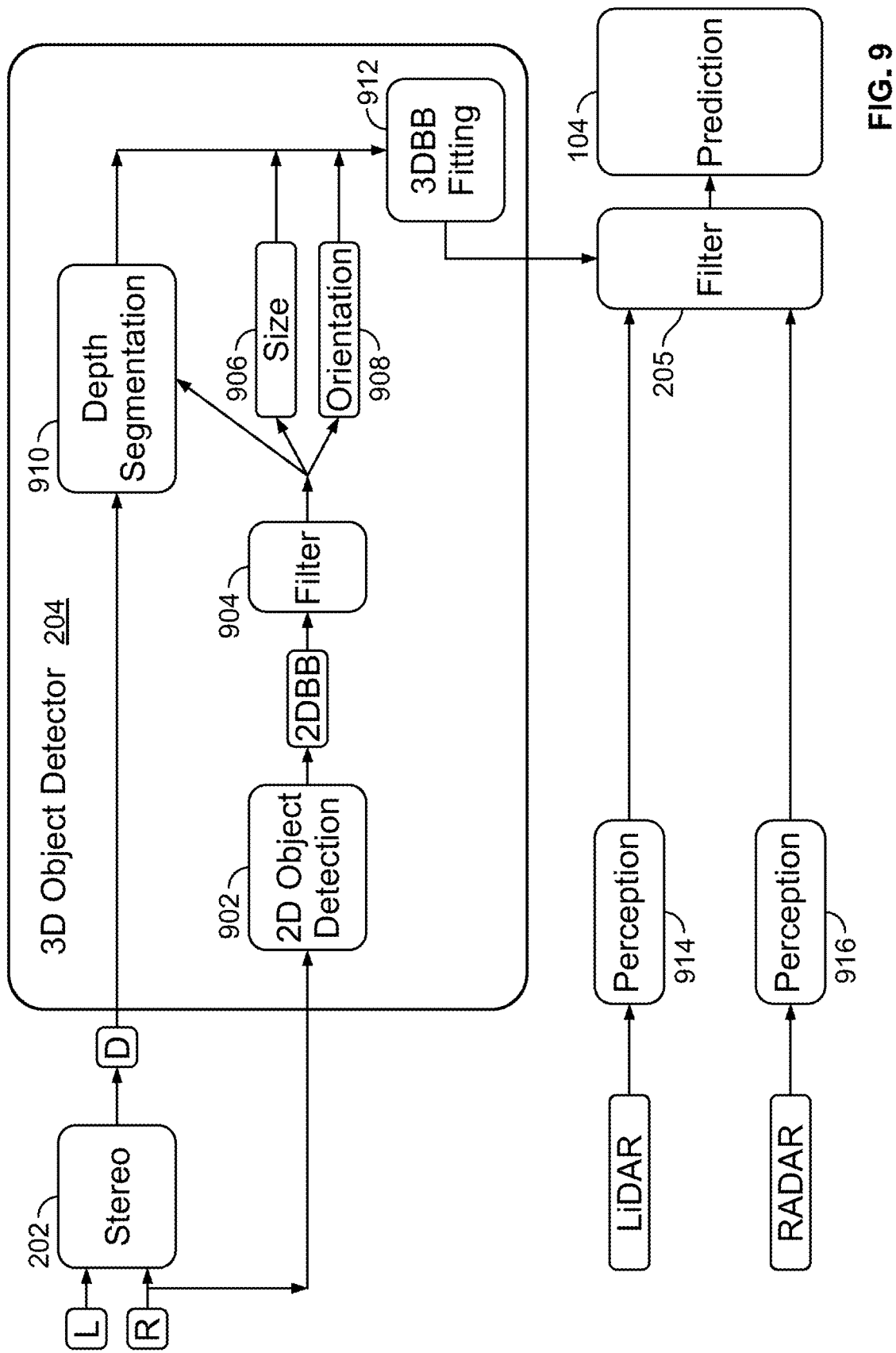
FIG. 9 shows an example of a perception stack.

FIG. 9 shows a schematic block diagram of part of an example perception stack. A 3D object detector is shown and denoted by reference numeral 204, which in turn is shown to comprise a 2D object detector 902, a 2D tracker filter 904, a size estimation component 906, an orientation estimation component 908, a depth segmentation component 910 and a template fitting component 912. This represents one example architecture for the 3D object detector 204 referred to above and shown in the earlier figures.

The 2D object detector receives one image of each captured stereo image pair (the right image R in this example) and applies 2D object detection to that image. The output is a 2D bounding box for each object detected in the image. This provides a 2D (x,y) location of each object in the image plane and a bounding box indicating the size of the projection of the object into the image plane. The 2D tracking filter 904 receives the 2D bounding box outputs and applies filtering to them in order to refine the 2D bounding box estimations. This filtering may for example take into account previous 2D detected bounding boxes and expected behaviour of the detected objects, based on an object behaviour model. The filtered 2D bounding boxes and the image data of the original image contained therein are used for a number of different purposes thereafter. The 2D object detector 902 can take the form of a trained CNN.

The depth segmentation component 910 receives the filtered 2D bounding boxes and also receives the depth map extracted from the original stereo image pair by the stereo estimator 202. It uses the filtered 2D boxes to isolate depth points belonging to each object within the depth map. This is a form of depth segmentation.

The size estimation component 906 also receives the filtered 2D bounding boxes and uses them to estimate a 3D size of each detected object based on the image data of the right image contained within the 2D bounding box.

The orientation estimation component 908 similarly receives the filtered 2D bounding boxes and uses them to determine a 3D orientation of each detected object using the image data of the right image contained within the applicable 2D bounding box. The size estimation component 906 and the orientation estimation component 908 can take the form of trained CNNs.

The 3D template fitting component 912 receives, for each detected object, the isolated depth points for that object from the depth segmentation component 910, the 3D size of that object from the size estimation component 906, and the 3D orientation of that detected object from the orientation component 908. The 3D template fitting component 902 uses those three pieces of information to fit a template, in the form of a 3D bounding box, to the depth points belonging to that object. The 3D size and 3D orientation of the 3D bounding box are both known from the size and orientation estimation components 906, 908 respectively and the points to which the bounding box must be fitted are also known. Therefore, this is simply a case of finding an optimal 3D location for the 3D bounding box. Once this has been done for each object, the 3D size and 6D pose (3D location and 3D orientation) are known for each detected object at a given time instant.

An output from the 3D template fitting component 912 to an input of a final filter 205 is shown. In addition, the final filter 205 is shown having an input to receive perception outputs from LiDAR and RADAR respectively. LiDAR and RADAR perception components are shown and denoted by reference numerals 914 and 916 respectively. Each of these provides perception outputs which can be fused with the perception outputs from the 3D object detector 204, such as 6D pose. This fusion takes place in the final filter 205 and an output of the final filter is shown connected to an input of the prediction stack 104. This could, for example, be a filtered (refined) 6D pose that takes into account all of these stereo, Lidar and radar measurements. It could also take into account expected object behaviour in 3D space as captured in an expected behaviour model for 3D objects.

Slicing of Perception Stack

Figure 9A:
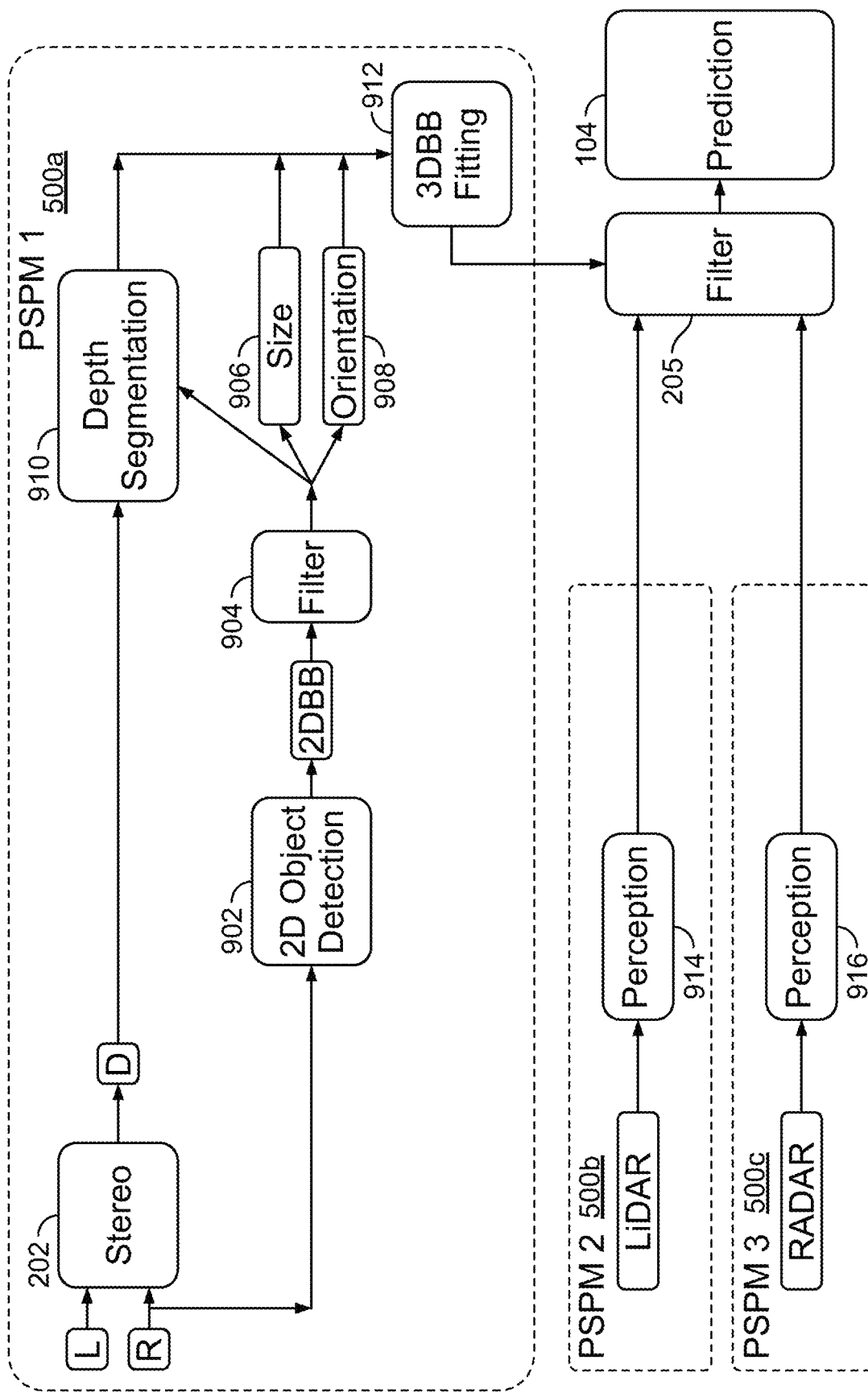
FIGS. 9A-C shows different ways in which the perception stack of FIG. 9 may be modelled using one or more PSPMs.

FIG. 9A shows one example of how the perception stack of FIG. 9 might be "sliced", i.e. modelled as PSPMs. The perception stack 102 is said to be sliced after the final perception component(s) that is modelled by the PSPM and the perception outputs of that perception component(s) may be referred to as the "final outputs" for the PSPM. The distribution of that PSPM will be defined over those final outputs, i.e. e in p(e|t,c) corresponds to those final output(s) of the component(s) after which the perception stack 102 is sliced. All perception components and sensors which provide input(s) to that component(s) (directly or indirectly) will be modelled by that PSPM in terms of their effect on the uncertainty in the final outputs e (and are said to be "wrapped up" in that PSPM).

In this case, a single PSPM is provided for each sensor modality, i.e. one for stereo imaging, a second for LiDAR, and a third for RADAR. The three PSPMs are denoted by reference numerals 500a, 500b and 500c respectively. To build the first PSPM 500a, the perception stack 102 is sliced after the 3D template fitting component 912, hence the distribution of the first PSPM 500a is defined over the perception outputs of the template fitting component 912. All of the perception components and sensors that feed into the 3D template fitting component 912 are wrapped up in that first PSPM 500a. The second and third PSPMs 914, are sliced after the LiDAR and RADAR perception components 914, 916 respectively.

The final filter 205 is not modelled as a PSPM, bur it rather is applied to PSPM samples obtained from the three PSPMs 500a, 500b and 500c during testing.

Figure 9B:
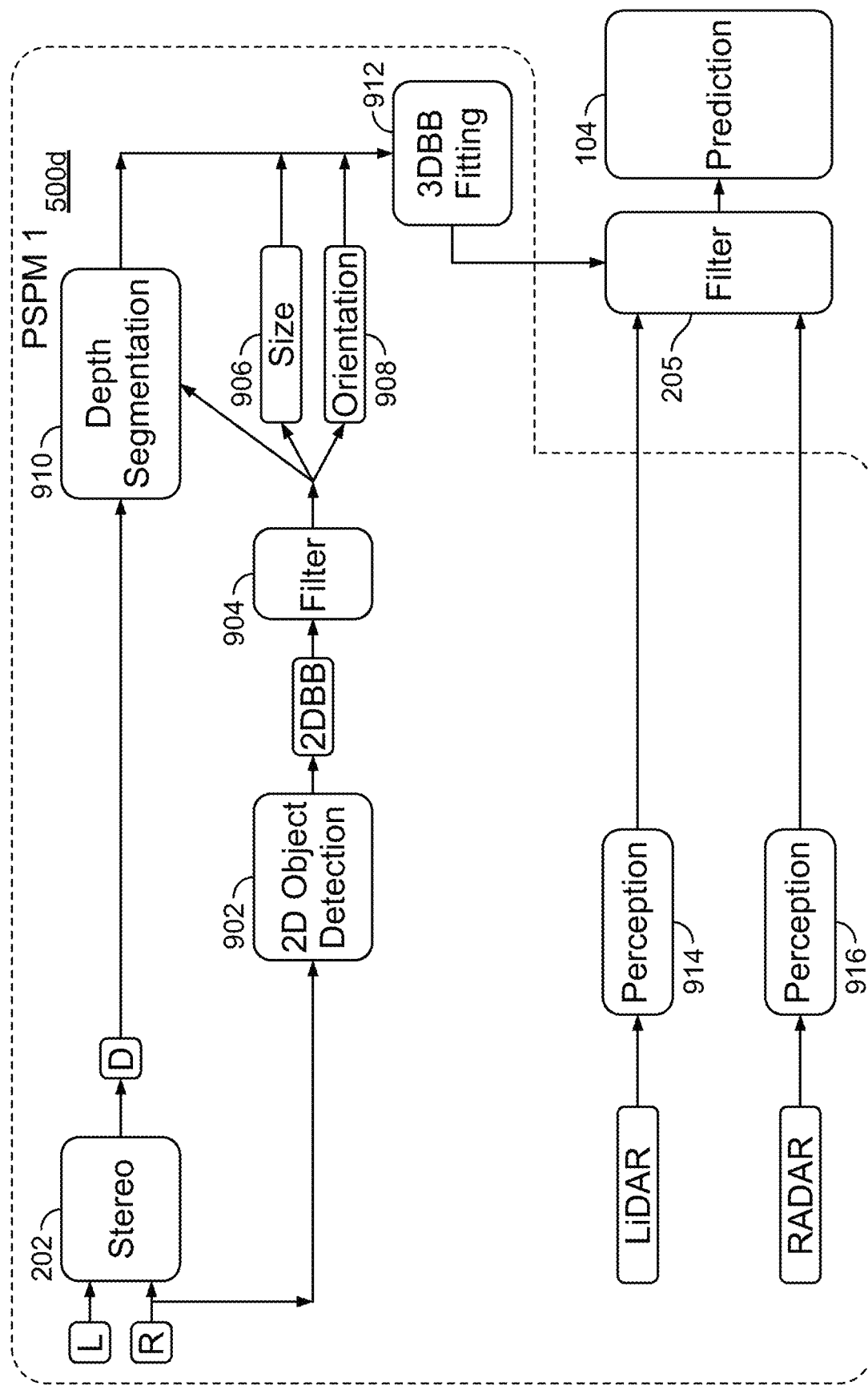

FIG. 9B shows a second example slicing, in which all three sensor modalities are modelled using a single PSPM 500d. In this case, the distribution p(e|t,c) is defined over all three sensor modalities, i.e. $e=(e_{stereo}, e_{lidar}, e_{lidar})$. Therefore, each PSPM sample will include realistic perception outputs for all three sensor modalities. The final filter is still not modelled as a PSPM in this example, and will be applied at testing to PSPM sampled obtained using the single PSPM 500d.

Figure 9C:
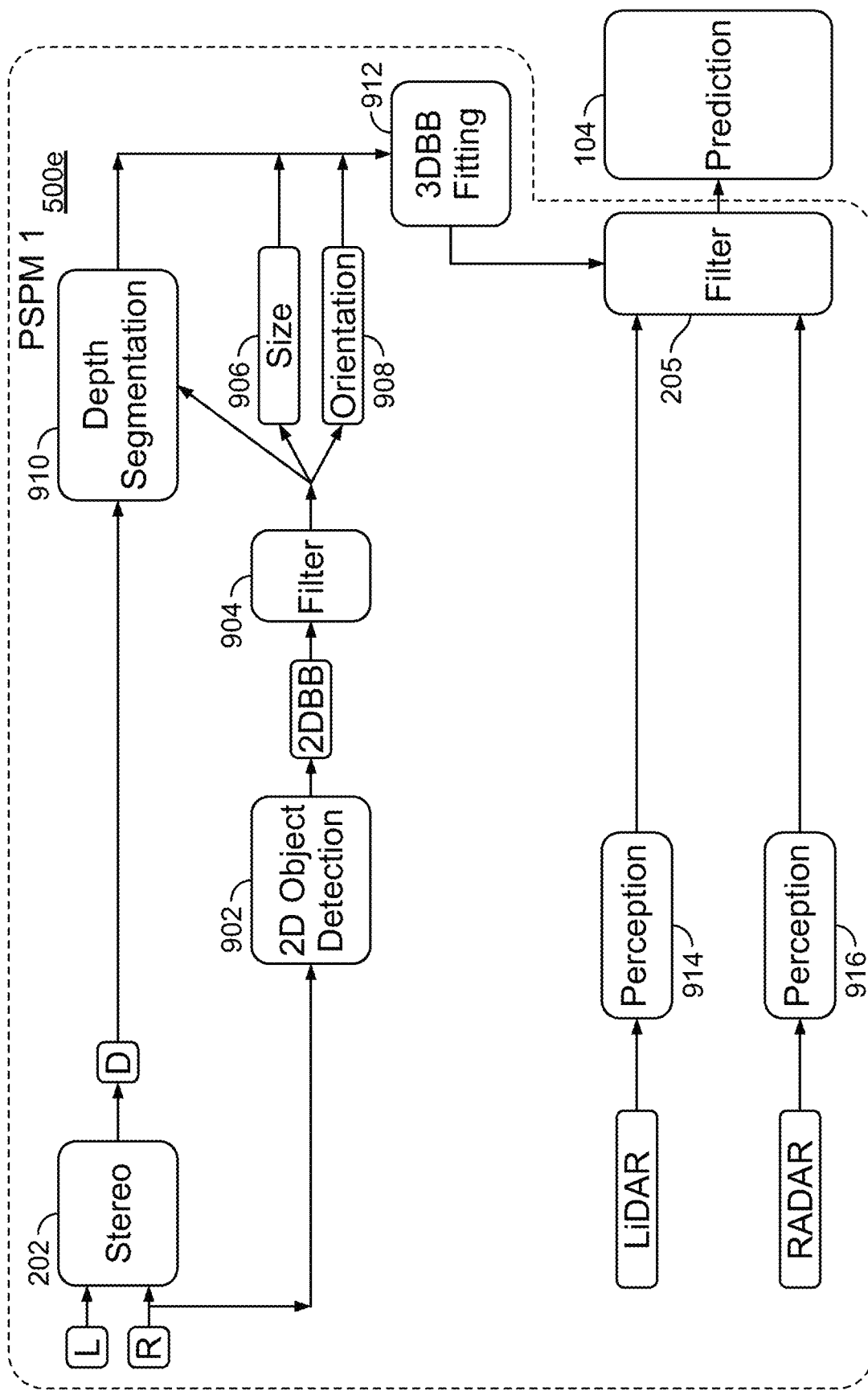

FIG. 9C shows a third example slicing, in which all three sensor modalities together with the final filter 205 are modelled as a single PSPM 500e. In this case, the distribution p(e|t,c) is defined over the filtered perception output of the final filter 205. During testing, the PSPM 500e will be applied to ground truths derived from the simulation, and the resulting PSPM samples will be fed directly to the prediction stack 104.

Slicing Considerations

One factor when deciding where to "slice" the perception stack is the complexity of ground truth that will be needed (the required ground truth will correspond to the perception component(s) after which the stack is sliced): an underlying motivation for the PSPM approach is to have a ground truth that is relatively easy to measure. The lowest parts of the perception stack 102 operate directly on sensor data, however the information needed for planning and prediction is much more high-level. In the PSPM approach, the idea is to "bypass" the lower level details whilst still providing statistically representative perception outputs for prediction and planning during testing. In very broad terms, the higher up the perception stack 102 is sliced, the simpler the ground truths will be in general.

Another consideration is the complexity of the perception components themselves, because any perception components that are not wrapped up in a PSPM will have to be executed during testing.

It is generally expected that slicing always would take place after the CNNs in the perception stack, avoiding the need to simulate inputs to the CNNs and avoiding the need to consume compute resources running the CNNs at testing.

In one sense, it is beneficial to wrap up as much of the perception stack 102 as possible into a single PSPM. In the extreme case, this would imply that the entire perception stack 102 is modelled as a single PSPM. This has the benefit of being able to model any correlations between different sensors and/or perception components, without requiring knowledge of those correlations. However, as more and more of the perception stack 102 is wrapped up in a single PSPM, this significantly increases the complexity of the system being modelled.

For FIG. 9A, each of the individual PSPMs 500a, 500b, 500c can be built independently from data of a single sensor modality. This has the benefit of modulatory—existing PSPMs can be rearranged to test different configurations of the perception slice 204 without retraining. Ultimately the optimal PSPM architecture will be context dependent.

In the case of FIG. 9C in particular, it may also be necessary to use a time-dependent model in order to adequately capture the dependency on previous measurements/perception outputs introduced by the final filter 205. For example, the PSPM 500e of FIG. 9C could take the form of a hidden Markov model in order to capture that additional level of time dependency. More generally, such time-dependent PSPMs might be used in any of the above. This is one context in which time-dependent models are useful, but there are many situations in which explicit modelling of time-dependency can be useful.

For FIGS. 9A and 9B, cutting off before the final filter(s) 205 has the benefit that it may not be necessary to introduce explicit time dependency, i.e. a form of PSPM could be used which does not have any explicit dependency on previous PSPM samples taken from the PSPM.

Examples of PSPMs

The above description has mainly focused on dynamic objects, but PSPMs can also be used in the same way for static scene detectors, classifiers and other static scene perception components (e.g. traffic light detectors, lane offset correction etc.).

Indeed, PSPMs can be built for any part of the perception stack 102, including:
  odometry, e.g.:
    IMU,
    visual-odometry,
    LIDAR-odometry,
    RADAR-odometry,
    wheel encoders;
  (ego-)localization, e.g.
    vision-based localization,
    GPS localization (or satellite positioning more generally).

"Odometry" refers to the measurement of local relative motion and "Localisation" refers to the measurement of global position on a map.

PSPMs can be built in exactly the same way to model the perception outputs of such perception components, using suitable perception ground truths.

These allow realistic odometry and localization errors to be introduced into the simulated scenarios, in the same way as detection errors, classification errors etc.

Ground-Truthing Pipeline

As noted above, the generation of annotations in the ground-truthing pipeline 802 can be manual, automated or semi-automated annotation.

Automated or semi-automated ground truth annotation can make use of high-quality sensor data that would not normally be available to the AV at runtime (or at least which would not be available all of the time). In fact, this can provide a way to test whether such components are required.

Automated or semi-automated annotation can make use of offline processing to obtain more accurate perception outputs that can be used as ground truths for PSPM building. For example, to obtain perception ground truth for localization or odometry components, offline processing such as bundle adjustment can be used to reconstruct a path of a vehicle to a high level of accuracy, which in turn can be used as ground truth to measure and model the accuracy of the AV's online processing. Such offline processing may not be feasible on an AV itself at runtime because of compute resource constraints or because the algorithms used are inherently non-real time.

Examples of Confounders

Figure 10:
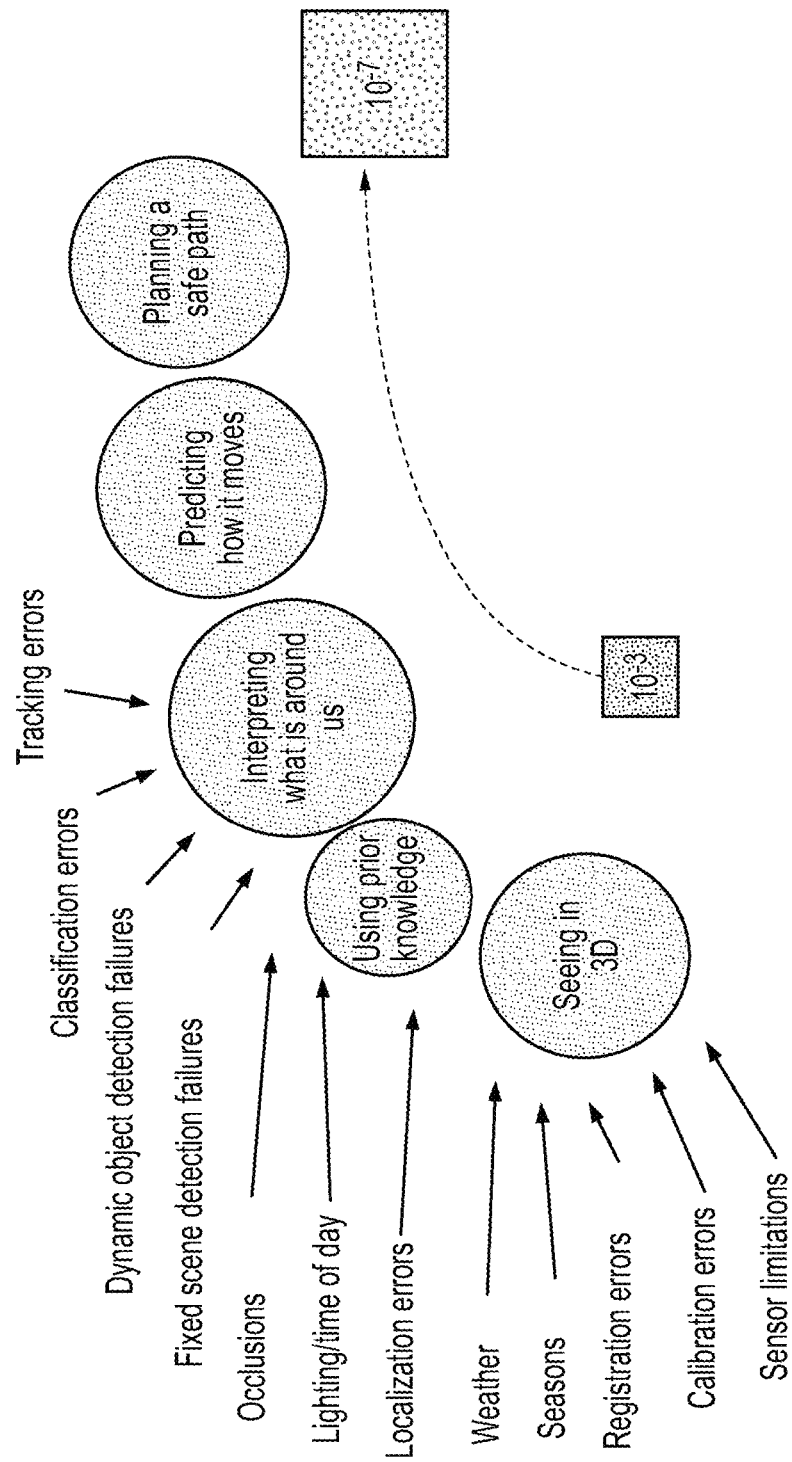
FIG. 10 provides a schematic overview of factors that can contribute to perception uncertainty.

FIG. 10 shows a high-level overview of various factors that can contribute to uncertainty in the perception outputs (i.e. various sources of potential perception error). This includes further examples of confounders c which may be incorporated as variables of a PSPM:
  Occlusions
  Lighting/time of day
  Weather
  Seasons
  Distance to object (linear and/or angular)
  Velocity of object (linear and/or angular)
  Position in sensor field of view (e.g. angle from centre of image)
  Other object properties, such as reflectivity, or other aspects of its response to different signals and/or frequencies (infrared, ultrasonic etc.)

Other examples of possible confounders include a map of the scene (indicating environmental structure), and inter-agent variables such as "business" (a measure of the number or density of agents in a scene), distance between agents, and agent types.

Each can be characterized numerically or categorically in one or more variable components (dimensions) of the confounder space C.

Note, however, that a confounder can be any variable representing something about the physical world that could potentially be relevant to perception error. This does not necessarily have to be a directly measurable physical quantity like velocity, occlusion etc. For example, another example of a confounder relating to another actor might be "intent" (e.g. whether a cyclist at a particular moment in time intends to turn left at an upcoming turn, or continue straight ahead, which could be determined in respect of real-world data at a given time by looking ahead to the action actually taken by the cyclist). In one sense, a variable such as intent is a latent or unobserved variable in the sense that, at a particular moment in time (before the cyclist has taken definitive action in this case), intent is not something that can be measured directly using the perception system 102 and could only be inferred though other measurable quantities; the point about confounders is that those other measurable physical quantities do not have to be known or measured in order to model the effect on intent on confounder error. It might be, for example, that there is a statistically significant increase in perception error associated with cyclists who have a "turn left" intent vs. a "continue straight" intent, which might arise from multiple, unknown and potentially complex behavioural changes in the behaviour of cyclists who are about to turn left that mean that, as a matter of fact, the perception system is worse at perceiving them. By introducing an "intent" variable as a confounder in an error model, there is no need to try to ascertain what observable, physical manifestations of intent are relevant to perception errors—provided "intent" ground truth can be systematically assigned to the training data (e.g. based on hindsight of the action ultimately taken by the cyclist) in a way that is consistent with simulations (where the intent of a simulated cyclist would be known in order to simulate their behaviour as the scenario develops), then such data can be used to build suitable behaviour models for different intents in order to simulate that behaviour, as well as intent-dependent perception error models, without having to determine what physical manifestations of intent (if any) are actually relevant to perception error. To put it another way, it is not necessary to understand why intent is relevant to perception error in order to model the effect of intent on perception error, because intent itself can be modelled as a perception confounder (rather than trying to model observable manifestations of intent as confounders).

Low Level Errors

Examples of low-level sensor errors include:
Registration errors
Calibration errors
Sensor limitations Such errors are not modelled explicitly in the simulations but their effect is wrapped up in the PSPM used to model a perception slice which interprets the applicable sensor data. That is to say, these effects would be encoded in the parameters θ that characterize the PSPM. For example, for a Gaussian-type PSPM, such errors would contribute to a larger covariance denoting greater uncertainty.

High-Level Perception Errors

Other errors can occur within the perception pipeline, for example:
Tracking errors
Classification errors
Dynamic object detection failures
Fixed scene detection failures When it comes to detection, false positives and false negatives can potentially cause the prediction stack 104 and/or planner 106 to behave in unexpected ways.

Specific PSPMs are constructed in order model this type of error, in a statistically robust fashion. These models can also take into account the influence of variable confounders c.

Using object detection as an example, detection probabilities can be measured and used to construct a detection distribution dependent on, say, distance, angle and level of occlusion (the confounders c in this example). When running the simulation then, through ray tracing from the camera, it can be ascertained that an object is "possibly" detectable, according to the model. If so, then the measured detection probabilities are checked and the object is detected or not. This deliberately introduces the possibility that an object which is sensible to the sensors is not detected in the simulation, in a way that reflects the behaviour of the perception stack 102 in real life, because of the statistically robust way in which detection failures have been modelled.

This method can be extended within a Markov model to ensure that conditional detections that are properly modelled. E.g. an object is detectable with the appropriate probability only if it had been detected beforehand, otherwise the probability may be different. In this case, false negatives involve some time dependency on the simulated detections.

False positives could be generated randomly with a density in space and time similar to that which is measured by the PSPM. That is, in a statistically representative fashion.

2 Problem Statement

By way of further explanation, this section sets out a mathematical framework for PRISMs and introduces a particular dynamic object detection problem addressed in the subsequent sections. Section 3 discusses the dataset used for training PRISMs, techniques used for identifying relevant features and a description of evaluation methods. Section 4 describes particular modelling decisions and how those decisions were informed by data science.

Note that in the below description, the notation $x_g, y_g, z_g$ may be used to denote coordinates of a location perception ground truth t. Similarly, $x_s, y_s, z_s$ may be used to denote coordinates of a location perception stack output e. Therefore, a distribution $p(x_s, y_s, z_s | x_g, y_g, z_g)$ is one form the perception uncertainty distribution p(e|t) described above can take. Similarly, x may be used below to refer generally a set of confounders, which is equivalent to a set of confounders c or c' described above.

Perception systems have inputs that are difficult to simulate, such as camera images, lidar scans and radar returns. As these inputs cannot be rendered with perfect photorealism, perception performance in simulation will not match that in the real-world.

An aim is to construct a probabilistic surrogate model, called a PRISM, for the perception stack. The PRISM consumes a low-fidelity representation of the world state (perception ground truth) and produces perception outputs of the same format as the vehicle stack (or, more precisely, the perception slice 204 being modelled). The samples drawn from the surrogate model in simulation should look similar to the outputs from the perception stack when the stack is run on real data.

PRISM sampling should be fast enough for use as part of a simulation system for verification and development of downstream components, such as the planner.

2.1 Intuition

The following section states the most general case, motivated by the following considerations:
Some stochastic function exists which maps from the true state of the world to an output of the perception stack.
This function may be modelled using training data. The function is modelled as a probability distribution.
Since the world state changes smoothly over time, the sampled perception outputs should also change smoothly over time. Since the world state is only partially observed, an appropriate way of achieving this is to have the probability distribution depend on the history of observed world states and perception outputs.
A simulator (Genie) is responsible for producing the representation of the world at run time. The outputs of Genie are 6D pose and extent for dynamic objects and some other information like road geometry and weather conditions.

For real world training data, this world representation is obtained from annotation.

Mathematical Statement

2.2.1 Preliminaries

For any set S, let the set of histories of S be histories(S)= $\{(t, h) | t \in \mathbb{R}, h:(-\infty, t] \to S\}$. An element (t, h)∈histories(S) is composed of t, the current time, and h, a function that returns an element of S for any time in the past. The notation $\bar{x}$ indicates the simulated equivalent of x.

A perception system is a stochastic function $f$:histories (World)→histories(Perception). Usually, $f$ will be of the form $f$=perceive∘sense, sense: histories(World)→histories(SensorReading), perceive: histories(SensorReading)→histories(Perception).      (1)

A goal is to simulate some $f$. The world states may be broken down into a set Observed World of properties that can be reliably measured (this might include meshes and textures for every object in the scene, locations of light sources, material densities, etc) and a set Unobserved World of everything else (exact pixel values of camera images, temperature at every point on every surface), such that there is a bijection between World and ObservedWorld×UnobservedWorld. In a traditional photorealistic simulation approach, simulating $f$ amounts to finding some stochastic function $\overline{\text{sense}}$: histories(ObservedWorld)→histories(SensorReading), which can be composed with perceive to form $\overline{f}$:histories(ObservedWorld)→histories(Perception), $\overline{f}$=perceive∘$\overline{\text{sense}}$. (2)

Let observe:World→ObservedWorld be the function that maps world states onto their observed counterparts. Note that this function is not one-to-one: there will be many world states that map onto a single observed world state. An accurate and useful simulation $\overline{f}$ of $f$ will have $f = \overline{f} \circ \text{map(observe, •)}$, (3)

for all histories (t, h)∈histories(World), where map:((S→T)× histories(S))→histories(T) maps a function over a history.

Then one must conclude that the optimal photorealistic simulation has $\overline{\text{sense}}$ such that sense=$\overline{\text{sense}}$∘map(observe,•), (4)

since combining Equations 1, 2 and 4 gives Equation 3 by associativity of ∘. sense predicts a joint distribution over the history of sensor readings, histories(SensorReading), and the correlation of different sensor readings enables the dependence on unobserved properties of the world to be more effectively modelled. A similar correlation should therefore be observed in the computed $\overline{f}$.

Because SensorReading has high dimensionality and sense is a stochastic function (since it is very dependent on unobserved properties of the world), finding $\overline{\text{sense}}$ such that Equation 4 holds even approximately is non-trivial. Therefore, $\overline{f}$ may be found directly.

2.2.2 Creating a Surrogate Model

The creation of the surrogate model may be characterised as a stochastic function estimation task. Let S+ be the set of finite sequences of elements of S. Let $[s_i]_{i=1}^N \in S^+$ be a sequence of length N with elements $s_i$. A dataset of sequences of sensor readings $$[(t_{ij}, I_{ij})]_{j=1}^{M_i}]_{i=1}^N$$

is obtained, where each $I_{ij}$∈SensorReading is the sensor reading at time $t_{ij}$ in run i, and $M_i$ is the number of time stamps in a particular run. Using a function annotate: SensorReading→ObservedWorld that recovers the observed scene parameters from the sensor readings, a new dataset is constructed.

$$\mathcal{D} = [[(t_i, x_i, y_i)]_{j=1}^{M_i}]_{i=1}^N \quad x_{ij} = \text{annotate }(I_{ij}), \quad y_{ij} = \text{perceive }(I_{ij}).$$

The task of the PRISM is then to estimate the distribution $p(y_k|t_k, x_k, [(t_j, x_j, y_j)]_{j=1}^{k-1})$ from the samples in $\mathcal{D}$. Realisations of $\overline{f}$ can be obtained by drawing samples from this distribution.

A dependence on the previously sampled stack outputs, $[(y_j)]_{j=1}^{k-1}$ is included, because the distribution of y depends meaningfully on the unobserved world, and the unobserved world changes smoothly through time. As discussed in Section 2.2.1, this dependence on the unobserved world means that y will change smoothly over time, in a way that may be difficult to model solely from a dependence on $[(x_j)]_{j=1}^{k-1}$. This time-dependent nature of stack outputs is explored for the perception system 102 in Section 4.2.3, where a strong correlation in time is found.

Samples from the learnt PRISM distribution give plausible perception outputs, conditioned on a low-fidelity scene representation and a history of previous samples. These factors are independent variables in the generative model, the dependent variable being the perceived scene. Independent variables which meaningfully affect the distribution over the dependent variable are referred to herein as confounders. Part of the process of building a PRISM model is identifying relevant confounders to include in the model, as well as how these confounders should be combined. A method for identifying relevant confounders is explored in Section 3.2.

2.2.3 the Dynamic Objects Problem

A specific example of a perception system is presented—a system that detects dynamic objects in a scene using RGBD images. A "dynamic object" is a car, lorry, cyclist pedestrian or other road user, described by an oriented bounding box (6D pose and extent). The observed world is a set of such dynamic objects. In this setting,

*DynamicObject* =

Position × Extent × Orientation × Type = $\mathbb{R}^3 \times \mathbb{R}^3 \times$ Spin (3) × Categorical, Perception = $\wp$(*DynamicObject*),

*ObservedWorld* = $\wp$(*DynamicObject* × Info),

*SensorReading* = Image = $[0, 1]^{w \times h \times 4}$, where $\wp$ (S) is the set of finite subsets of S,[1] Type represents the object type (Car, Van, Tram, Pedestrian), Spin(3) is the set of unit quaternions and Info is an arbitrary set whose elements describe additional properties of dynamic objects that are useful to know when characterising the behaviour of the perception system, e.g. how much the object is obscured by other (possibly static) objects in the scene closer to the camera.

[1] For simplicity, it is assumed that there are never two objects that are precisely identical. It is straightfoward to extend the present teaching to the case where the elements of one or both of ObservedWorld and Perception are multisets.

This example simplifies the dynamic objects problem even further, choosing only to model the position of dynamic objects given the ObservedWorld. This includes fitting a model for the possibility of an observable object not being perceived, a false negative.

It is shown in Section 4.2.8 that false negatives are much more frequent mistakes made by the perception system 102 than false positives (spurious dynamic object detections).

For simplicity, the following description considers only poison in 3D space and omits a discussion of orientations, extents, object type, or other possible perception outputs. However, the principles can be applied equally to such other perception outputs.

3 Method

3.1 The Data

Figure 12:
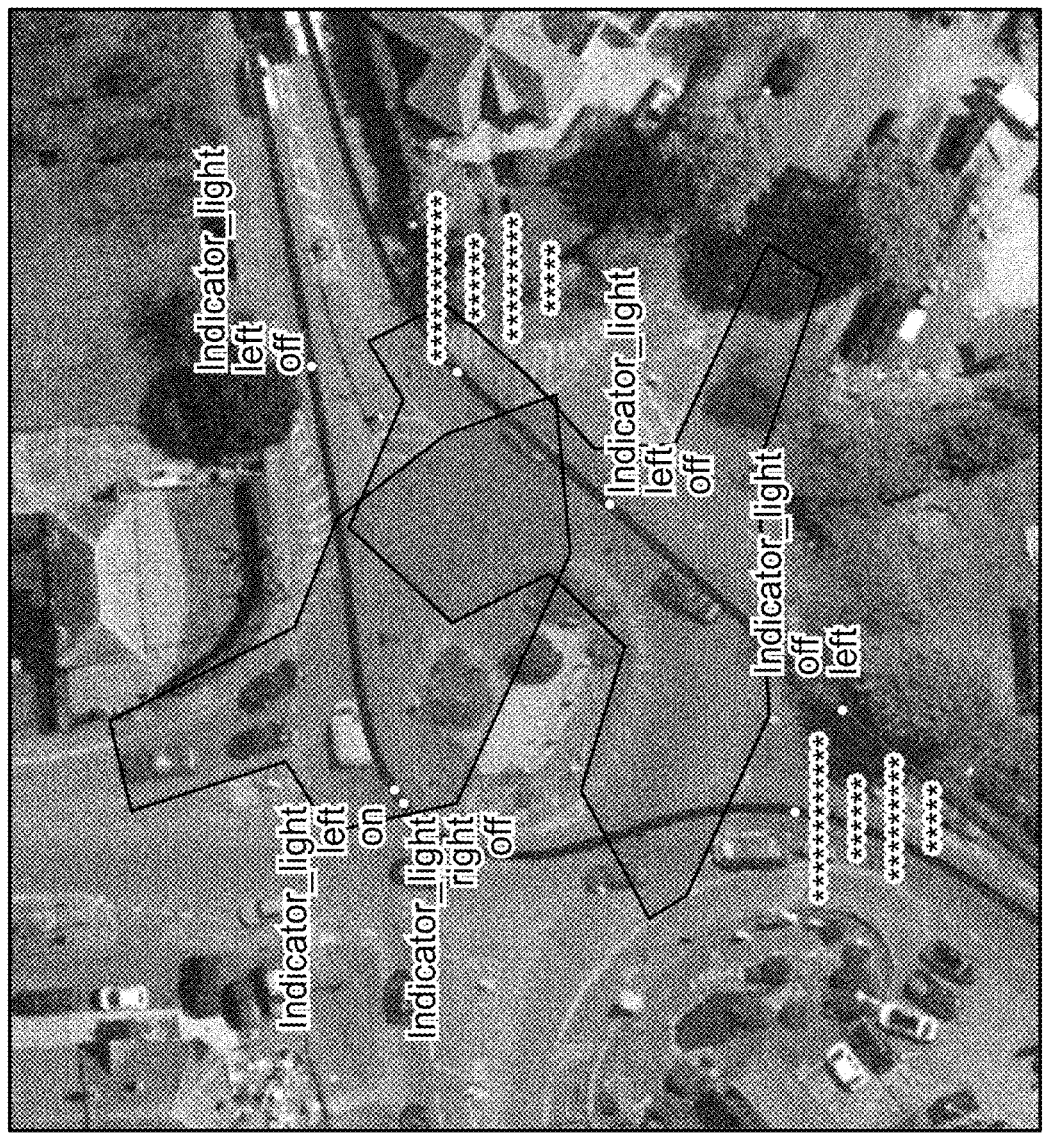
FIGS. 12 and 13 shows birds-eve and driver views of a roundabout scene.
Figure 13:
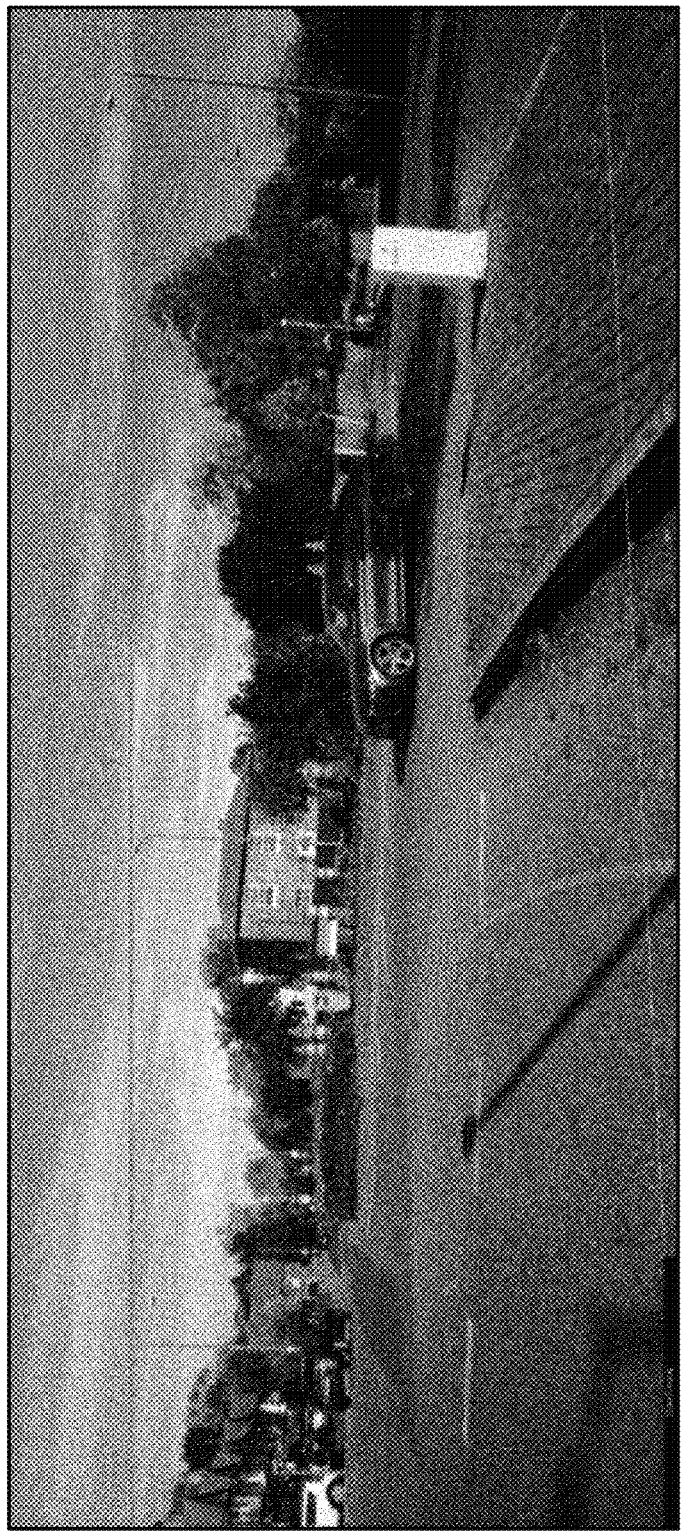

A particular driving scene is presented for which data has been recorded multiple times under similar conditions. The scene referred to by way of example herein is a roundabout in south-east London which lies on a testing route. The roundabout context and the path of vehicles through it can be seen in FIG. 12, with the view from a camera shown in FIG. 13.

By constraining the PRISM training data to runs on the same roundabout in similar climatic conditions, the effect of weather and sunlight as confounding factors in perception performance is minimised. The potential performance of a PRISM tested on data similarly collected is likewise maximised. PRISM performance could be tested on out-of-domain data, for example by evaluating how a PRISM trained on roundabout data performs on highway scenes.

3.1.1 Dataset Generation

PRISM training requires datasets containing sufficient information to learn the distributions over perception errors. For simplicity, this section considers only the errors introduced by the perception system 102 when predicting the centre position of dynamic objects in the frame of the camera in which they are observed. To learn such errors the ground truth centre and perception centre estimate are required.

The ground truth centre positions are estimated from human-annotated 3d bounding boxes present in each frame of a recorded video sequence of the roundabout and applied to all dynamic objects in the scene. These bounding boxes are fit to the scene using a ground truth tooling suite. The ground truth tooling suite combines camera images, stereo depth pointclouds and lidar pointclouds into a 3D representation of the scene to maximise annotation accuracy. Annotation accuracy is assumed to be good enough to be used as ground truth.

FIG. 9 shows a process of obtaining stack predicted objects from recorded camera images. It is important to note that this pipeline is stateless, each pair of camera frames is processed independently. This forces any time correlation discovered in the perception error data to be attributed to the behaviour of the detector on closely related inputs, rather than internal state of a detection algorithm.

In general, sets of object predictions indexed by image timestamp combined with similarly indexed sets of ground truth data from the ground truth tooling suite is sufficient for PRISM training data. However, all models considered in this section were trained on data that had been passed through an additional processing step to generate associations between ground truth and predicted objects. This restricts the space of models to choose from, but simplifies the fitting task by separating it into: fit a model of position error; fit a model for generating false negatives; fit a model for generating false positives. The association algorithm used operates on each frame independently. For each timestamp, the set of stack predictions and set of ground truth objects are compared using intersection over union (IOU), where predicted objects with the highest confidence score (a measure generated by the perception stack 102 indicating how good the prediction is likely to be) are considered first. For each predicted object, the ground truth object with the highest IOU is associated with it, forming a pair used to learn the error distributions. No associations are formed for pairs with IOU scores less than 0.5, a tunable threshold. After all predicted objects have been considered for association, there will remain a set of unassociated ground truth objects and a set of unassociated predicted objects. The unassociated ground truth objects are stored as false negative examples and the unassociated predicted objects as false positive examples.

"Set-to-set" models that do not require such associations are considered later.

3.1.2 Contents of the Training Data

The previous section describes how PRISM training data is produced and split into three sources: associations, false negatives, false positives. Table 1 specifies the data present in each of these sources, for which the following definitions are provided:

centre_x, centre_y, centre_z The x,y,z coordinates of the centre of the ground truth 3d box.

orientation_x, orientation_y, orientation_z The x, y, z components of an axis-angle representation of the rotation from the camera frame (front stereo right) to the ground truth 3d box frame.

height, width, length The extent of the ground truth 3d box along the z, y, x axes in the 3d box's coordinate frame.

manual_visibility Label applied by human annotator as to which of four visibility categories the ground truth object belongs. The categories are: fully-occluded (100%), largely-occluded (80-99%), somewhat-occluded (1-79%) and fully-visible (0%).

occluded The fraction of the area of the ground truth 2d bounding box that is overlapped by the 2d bounding boxes of other ground truth objects that are closer to the camera.

occluded_category A combination of manual_visibility and occluded that can be thought of as the maximum of the two. It is useful to combine manual_visibility and occluded in this way to maximise the number of correct occlusion labels. To see this, note that objects occluded by static parts of the scene (bushes, trees, traffic lights) will have an occluded score of 0, but will have a correctly set manual_visibility by the human annotator. Objects that are only occluded by other ground truth objects do not have the manual_visibility field set by human annotators, but will have a correct occluded field. These two cases can be handled by taking the maximum of the two values. Even with this logic, it is possible for the 2d bounding box of a ground truth object to completely obscure that of an object behind it, even if some of the background object is visible. This will generate some fully-occluded cases which can be detected by the perception system.

truncated The fraction of the eight vertices of the ground truth 3d box that lie outside the sensor frustum.

type When attached to a ground truth object (false negatives, ground truth part of associated pair) this is a human annotated object type, such as Car or Tram. When attached to a predicted object (false positives, predicted part of associated pair) this is the perception stack's best guess at object type, limited to Pedestrian or Vehicle.

In addition to the above, the following derived quantities will be referred to in this section:

distance The distance of the object centre from the camera, calculated as the Euclidean norm of the object centre position in the camera frame.

azimuth The angle formed between the projection of the ray joining the camera and object centres onto the camera's y=0 plane, and the camera's positive z axis. Polarity is defined by the sense of rotation about the camera's y axis. Range is restricted to [−π/2, π/2] as objects behind the camera cannot be observed.

TABLE 1

| Column | Associations | | | |
|---|---|---|---|---|
| | GT | Stack | FN | FP |
| centre[†] | X | X | X | X |
| orientation[†] | X | X | X | X |
| hwl[†] | X | X | X | X |
| occluded | X | | X | |
| manual_visibility | X | | X | |
| occluded_category | X | | X | |
| truncated | X | | X | |
| type | X | X* | X | X* |

The makeup of the dataset will be discussed in detail where relevant in later sections. A high level summary of the data is presented below.

- 15 traversals of the roundabout scene, spanning approximately 5 minutes of total footage.
- 8600 unique frames containing 96 k ground truth object instances visible to the camera.
- Of these 96 k instances: 77% are cars; 14% are vans; 6% are pedestrians; 3% belong to a range of smaller groups.
- Of these 96 k instances: 29% are fully visible; 43% are somewhat occluded; 28% are largely occluded.

In Table 1, the presence of particular data elements in each of the three generated sources of PRISM data. An X indicates that the column is present in the given data source. GT=ground truth, FN=false negatives, FP=false positives. Each of these is really three separate variables (eg. centre_x, centre_y, centre_z) but have been "squashed" here for legibility. * The contents of type can be either 'Vehicle' or 'Pedestrian' in the asterisked cases, these being the only classes predicted by the Five perception stack. In the non-asterisked cases, many more classes (such as 'Lorry' and 'Van') are present, these being all the classes reported in the ground truth data.

3.1.3 Training and Test Data

For all modelling experiments described herein, the roundabout dataset is split into two roughly equal halves to form the train and test sets. No hyperparameter optimisation is performed, so a validation set is not required.

3.2 Identifying Relevant Confounders

There are many confounders that might be considered for a PRISM model. Rather than optimise a model for every possible combination of confounders, it is preferable to perform such an optimisation over a restricted set of confounders known to be relevant.

To identify relevant confounders, a Relief-based algorithm is used. An outline of a general Relief-based algorithm is given in Algorithm 1. The Relief algorithm yields an array of feature weights in the range [−1, 1], where a weight greater than 0 indicates the feature is relevant, as changes in the feature tend to change the target variable. In practice, some features will have a weight greater than 0 by chance, only the features with weight greater than some user-defined cutoff $0 < \tau < 1$ are chosen.

---

Algorithm 1 Calculate feature weights $W = (W_i, \ldots, W_n)$ for dataset $[(\vec{x}_i, y_i)_{i=1}^n$, where y is some (scalar or categorical) target variable and $\vec{x} = (x_1, \ldots, x_n)$ is some set of (scalar or categorical) feature variables.

Data: $S = [s_i]_{i=1}^n$, $s_i = (\vec{x}_i, y_i)$
Required: $d(\vec{x}_i, \vec{x}_j)$, a distance function on the feature space
$W_i \leftarrow 0, i = 1, \ldots, a$
for $s_i \in S$ do $$j \leftarrow \underset{j}{\mathrm{argmin}}\, d(\vec{x}_i, \vec{x}_j): y_i = y_j, i \neq j$$

$$k \leftarrow \underset{k}{\mathrm{argmin}}\, d(\vec{x}_i, \vec{x}_k): y_i \neq y_k, i \neq k$$

for $p \in 1, \ldots, a$ do
  if $(\vec{x}_i)_p \neq (\vec{x}_j)_p$ then
    decrease $W_p$
  end if
  if $(\vec{x}_i)_p \neq (\vec{x}_k)_p$ then
    increase $W_p$
  end if
end for
end for

---

This algorithm has the following desirable properties:

- It is sensitive to nonlinear relationships between features and target variables. Other feature selection methods, such as a naive principal component analysis or comparison of Pearson correlation, are not sensitive to these kinds of relationships. Not all things that are uncorrelated are independent.
- It is sensitive to interactions between features.
- It is conservative. It errs on the side of accidentally including irrelevant or redundant confounders rather than accidentally excluding relevant ones.

It is important to note the following caveats of this approach:

- It identifies correlations in the data, but provides no insight into how or why the target variable is correlated with the confounders under investigation.
- The results depend on the parameterisation of the confounding variables.

There are many extensions to the Relief algorithm. An extension called MultiSURF is used here. MultiSURF was found to perform well across a wide range of problem types, and is more sensitive to interactions of three or more features than other methods. The implementation is used from scikit-rebate, an open-source Python library that provides implementations of many Relief-based algorithms extended to cover scalar features and target variables.

In experiments, $$\tau = \frac{1}{\sqrt{\alpha n}}$$

is used, where n is the size of the dataset and $\alpha = 0.2$ is the desired false discovery rate. By Chebyshev's inequality, this lets us say that the probability of accepting an irrelevant confounder as relevant is less than $\alpha$.

Relief based methods are a useful tool for identifying plausible confounders and their relative importance. However, not all features which affect the error characteristics of the perception system will be captured in the annotated training data. A manual process of inspecting model failures to hypothesise new features to label as confounders is necessary.

4 Models

4.1 Heuristic Model

Figure 14:
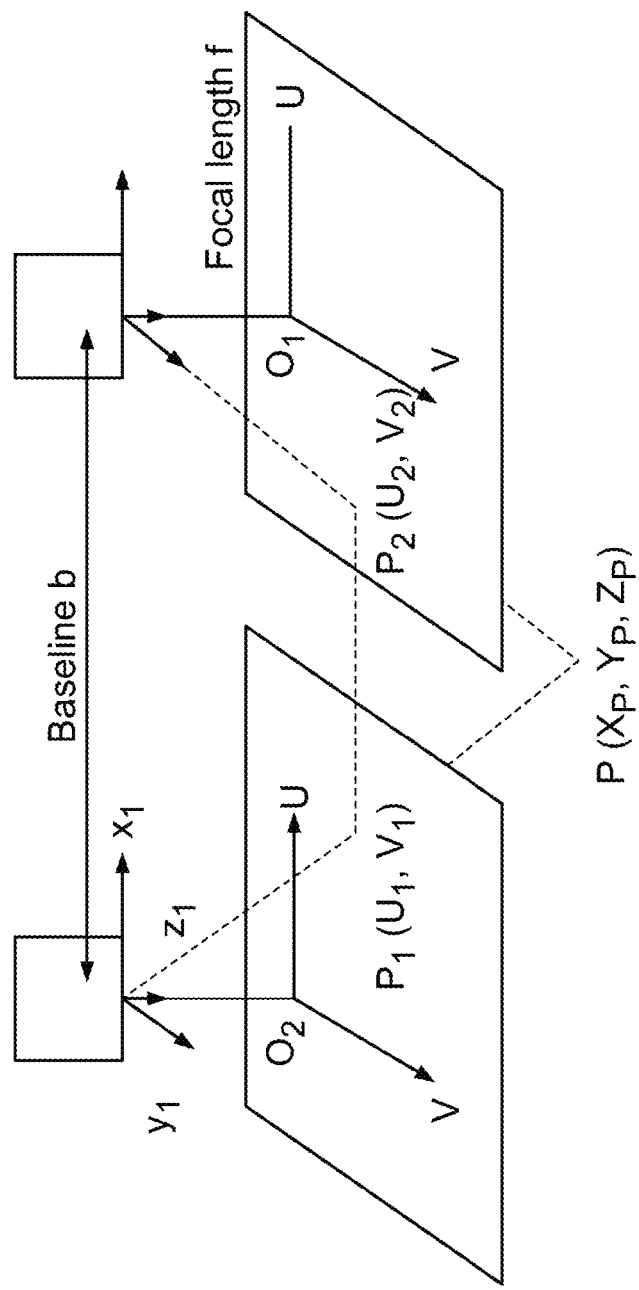
FIG. 14 schematically depicts a stereo imaging geometry.

Camera coordinates represent the location of a point in an image in pixel space. In binocular vision, the camera coordinates of a point in two images are available. This allows the location of a point in the 3D Cartesian world to be reconstructed. The camera coordinates of a point p in 3D space are given by:

$$u_1 = f\frac{x_p}{z_p}, \tag{5}$$

$$u_2 = f\frac{x_p - b}{z_p}, \tag{6}$$

$$v = v_1 = v_2 = f\frac{y_p}{z_p}, \tag{7}$$

where $(u_1, v_1)$, $(u_2, v_2)$ are image pixel coordinate of p in the left and right camera respectively, $(x_p, y_p, z_p)$ are 3D world coordinates of p with respect to the left camera, b is the camera baseline and $f$ is the focal length of the camera. This is shown in FIG. 14. Defining disparity, d, as $$d = u_1 - u_2 = f\frac{b}{z_p}, \tag{8}$$

the 3D world coordinates of p can be written as $$x_p = \frac{bu_1}{d}, \tag{9}$$

$$y_p = \frac{bv}{d}, \tag{10}$$

$$z_p = \frac{bf}{d}, \tag{11}$$

A heuristic model is obtained by imposing a distribution in camera coordinates and propagating it to 3D coordinates using the relationships above. This distribution can be used equally for object centres or object extent. This model allows one to consider the physical sensor uncertainty of the camera when the image is discretised to pixels. The model is given by $$p(x_s,y_s,z_s|x_g,y_g,z_g) = \iiint p(x_s,y_s,z_s|u_1,v,d)p(u_1,v,d|x_g,y_g,z_g) \, du_1 dv dd, \tag{12}$$

where $(x_g, y_g, z_g)$ are the coordinates of the ground truth point, and $(x_s, y_s, z_s)$ are the coordinates of the stack prediction. The probability distribution over camera coordinates given world coordinates is $$p(u_1,v,d|x_g,y_g,z_g) = p(u_1|x_g,y_g,z_g)p(v|x_g,y_g,z_g)p(d|x_g,y_g,z_g), \tag{13}$$

where distributional independence in each camera coordinate is assumed $$p(u_1|x_g, y_g, z_g) = \mathcal{N}\left(f\frac{x_g}{z_g}, \sigma\right), \tag{14}$$

$$p(v|x_g, y_g, z_g) = \mathcal{N}\left(f\frac{y_g}{z_g}, \sigma\right), \tag{15}$$

$$p(d|x_g, y_g, z_g) = \text{Lognormal}\left(f\frac{b}{z_g}, \sigma\right) \tag{16}$$

where $\sigma$ is a constant, $\mathcal{N}$ is a normal distribution and Lognormal is a log-normal distribution, chosen as it only has support on the positive reals. This defines a normally distributed probability density centred on the camera coordinates of a point in 3D space. Normal distributions are chosen on the basis of mathematical simplicity. If only discretisation error is to be considered, a uniform distribution may be more appropriate. However, it is likely other errors contribute to uncertainty in stereo vision and hence the extended tails of the normal distribution are useful for modelling such phenomena in practice. For front stereo cameras, the a can be determined to be 0.7 by maximum likelihood estimation. $p(x_s, y_s, z_s|u_1, v, d)$ is given by a Dirac distribution centred on point values of $x_s$, $y_s$ and $z_s$ obtained from Equations 9-11.

A runtime model is obtained by forming a piecewise constant diagonal multivariate normally distributed approximation of Equation 12, by solving the integral with Monte Carlo simulation and approximating $p(x_s, y_s, z_s|x_g, y_g, z_g)$ for different values of $x_g$, $y_g$ and $z_g$ using the mean and variance of sampled values.

The model could be improved by considering a more accurate approximation of the conditional distribution in Equation 12, or by modelling uncertainties in the camera parameters $f$ and b (which are set to their measured values in the model). How this model can be extended to include time dependence is an open question.

4.2 PRISM

Described below is an attempt to build a plausible surrogate model of the perception stack/substack 204 guided by data analysis, a PRISM. The model includes time-dependent position errors and non-zero probability of objects going undetected, these being salient features of the data.

4.2.1 Positional Errors

The centre position of dynamic objects detected by the perception stack will be modelled using an additive error model given by $$y_k = x_k + e_k$$

where $y_k$ is the observed position of an object, $x_k$ is the ground truth position of that object and $e_k$ is an error term, all at time $t_k$. The phrase "positional error" will be used to refer to the additive noise component $e_k$ of this model.

Figure 15:
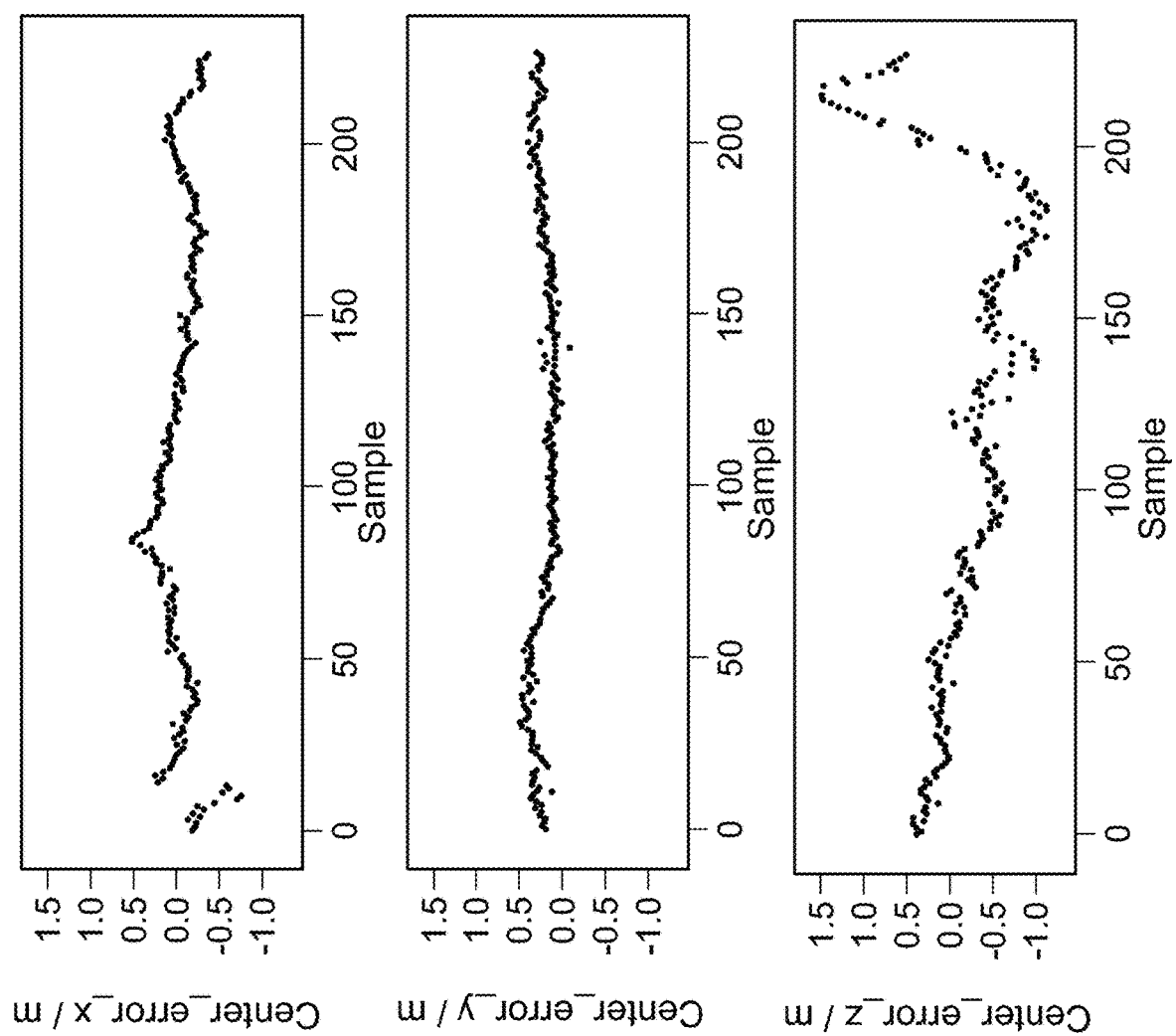
FIG. 15 shows example time series of additive errors for a position component.
Figure 16:
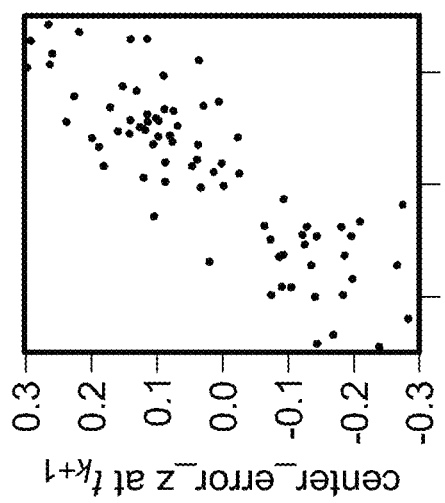
FIG. 16 shows lag plots for positional errors.
Figure 16:
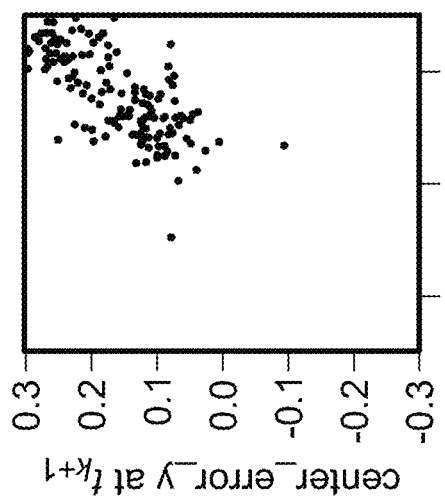
Figure 16:
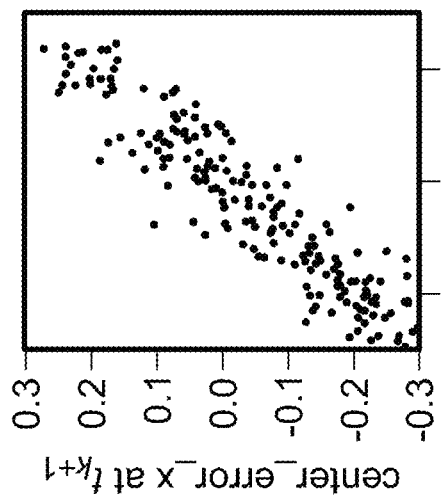
Figure 17:
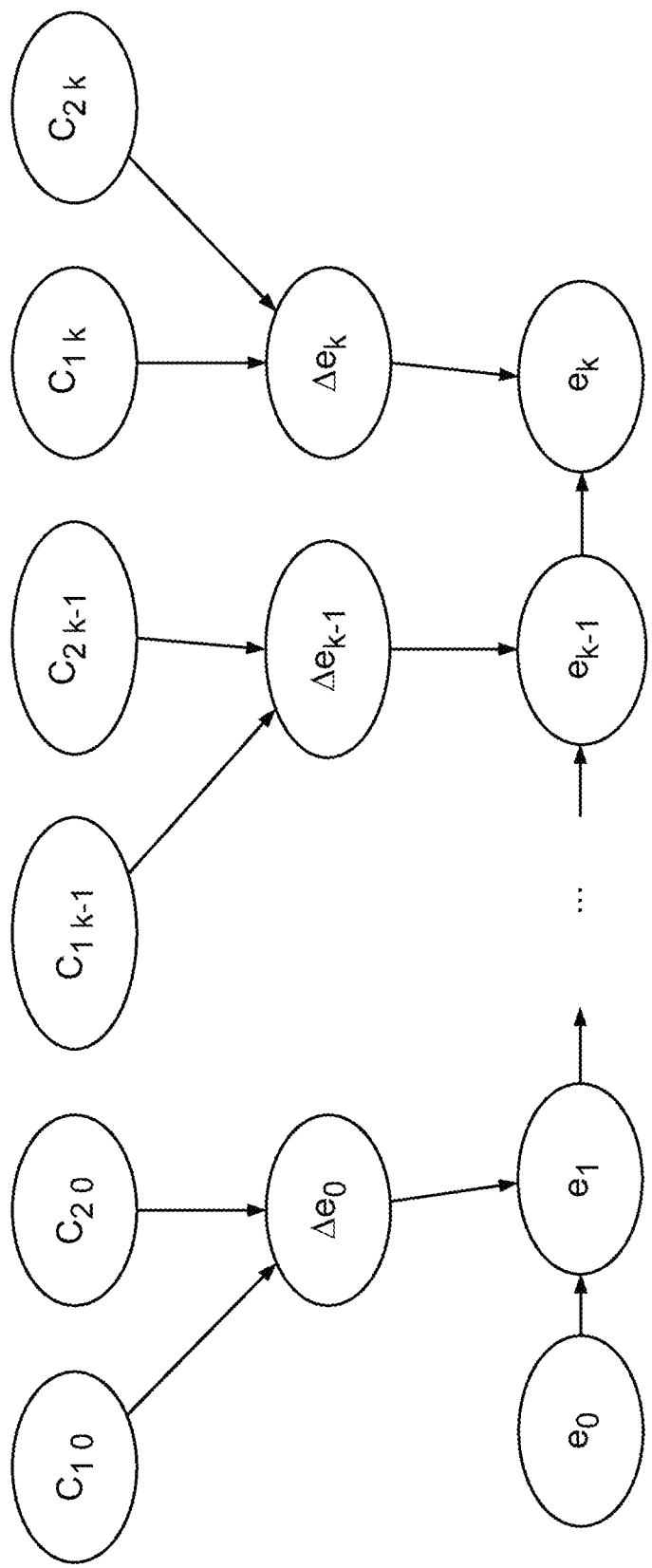
FIG. 17 shows a graphical representation of time-correlated positional errors model.

The positional error of a specific dynamic object detected by the perception stack relative to human labelled ground truth is shown in FIG. 15. A lag plot of the same data can be found in FIG. 16, indicating a strong time-correlation of these errors. From these plots it can be concluded that a generative model of positional errors must condition each sample on the previous sample. An autoregressive model is proposed for time-correlated positional errors, where each error sample depends linearly on the previous error sample and some noise. The proposed model can be written as $$e_k = e_{k-1} + \Delta e_k \tag{18}$$

where $e_k$ is the positional error sample at timestep k and $\Delta e_k$ is a stochastic term which may be a function of one or more confounders and which are referred to in general as "error deltas". A graph that visualises this model, including dependencies on hypothetical confounders C1 and C2 is shown in FIG. 17.

This model is based on several assumptions. First, that subsequent error deltas are independent. This is explored in Section 4.2.3. Second, that the empirical distribution of error deltas can be reasonably captured by a parametric distribution. This is explored in Section 4.2.4. Third, that the model as described is stationary, such that the mean error does not change with time. This is explored in Section 4.2.5.

4.2.2 Piecewise Constant Model

It has been shown that modelling position errors requires subsequent errors to be conditioned on the previous error, but how should the first error sample be chosen? The task of fitting a time-independent positional error distribution is now considered. If no time correlation had been found in the data, the approach taken here could equally be applied to all samples for each dynamic object, rather than just the first.

In general such a model will be a complicated joint probability distribution over all confounders. As discussed in section 2, a distribution over possible perception outputs given a ground truth scene is expected due to an incomplete scene representation (ObservedWorld≠World) and possible indeterminism in the perception stack. The variance is expected to be heteroskedastic; it will vary based on confounder values. As a simple example, it should not be surprising that the error in the position estimate of dynamic objects has a variance which increases with object distance from the detector.

The conditional distribution modelled by PRISM is expected to have a complicated functional form. This functional form can be approximated by discretising each confounder. In this representation, categorical confounders (such as vehicle type) are mapped to bins. Continuous confounders (such as distance from detector) are sliced into ranges and each range mapped to a bin. The combination of these discretisations is a multidimensional table, for which an input set of confounders maps to a bin. It is assumed that within each bin the variance is homoskedastic, and a distribution with constant parameters can be fitted. Global heteroskedasticity is captured by the different parameters in each bin. A model with a distribution with fixed parameters in each bin is referred to herein as a Piecewise Constant Model (PCM). Examples of general implementations of similar models can be found in the literature. Mathematically, this can be written this as $P(y|x) \sim G(\alpha[f(x)], \beta[f(x)], \ldots)$, where y is the set of outputs, x is the set of confounders, $f(\cdot)$ is a function mapping the confounders to bins, and G is a probability distribution with parameters $\alpha[f(x)], \beta[f(x)], \ldots$ that are fixed within each bin.

In the PCM for PRISM, it is assumed that errors are additive i.e. the stack predicted position, pose and extent of dynamic objects are equal to the ground truth position, pose and extent plus some noise. The noise is characterised by the distribution in each bin. In this PCM it is assumed that this noise is normally distributed. Mathematically this can be written as $$y = \tilde{y} + \epsilon$$

$$\epsilon \sim \mathcal{N}(\mu, \Sigma),$$

where y is the stack observation, $\tilde{y}$ is the ground truth observation and $\epsilon$ is the noise. The distribution in each bin is characterised by the mean $\mu$ and the covariance $\Sigma$. $\mu$ and $\Sigma$ can be viewed as functions of the confounder bins.

Figure 18:
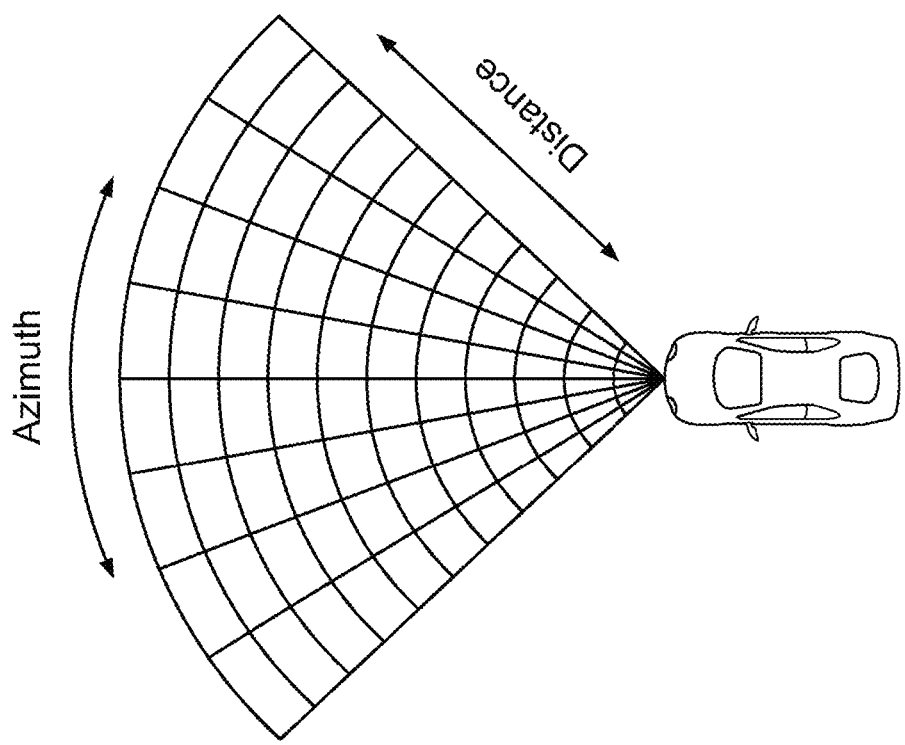
FIG. 18 shows an example binning scheme for confounders azimuth and distance.

An example binning scheme is shown in FIG. 18. A bin is constructed from the azimuth and distance to the centre of the ground truth dynamic object.

Training a model requires ground truth and stack predictions (actual perception outputs), collected as described in Section 3.1.1. The mean and covariance of the normal distribution are fitted (e.g. using a maximum a posteriori method to incorporate a prior) to the observations in that bin. For the mean of the normal distribution, a normally distributed prior is used. For the scale of the normal distribution, an Inverse Gamma prior is used.

To set the hyper-parameters of the prior, physical knowledge can be used in combination with intuition for how quickly the model should disregard the prior when data becomes available. This intuition can be represented with the concept of pseudo observations, i.e. in the posterior distribution how strongly should the prior distribution be weighted compared to real observations (which are encapsulated in the likelihood function). Increasing the number of pseudo observations results in a prior with lower variance. The hyper-parameters for the normally distributed prior can be set as $\mu_h = \mu_p$ and $\sigma_h = \sigma_p \sqrt{n_{pseudo}}$, where $\mu_p$ and $\mu_p$ represent prior point estimates for the mean and standard deviation of the bin under consideration, and $n_{pseudo}$ represents the number of pseudo observations. The rate and scale hyper-parameters for the Inverse Gamma prior can be set as $\alpha = \beta \sigma_p^2$ and $$\beta = \frac{n_{pseudo}}{2},$$

respectively. For the present model, $n_{pseudo} = 1$ is chosen and the heuristic model described in Section 4.1 is used to provide prior point estimates for the parameters for each bin.

The advantages of the PCM approach are that it accounts for global heteroskedasticity, gives a unified framework to capture confounders of different types, and it utilises simple probability distributions. In addition, the model is interpretable: the distribution in a bin can be examined, the training data can be directly inspected and there are no hidden transforms. Moreover, the parameters can be fitted analytically, meaning uncertainty from lack of convergence in optimisation routines can be avoided.

Confounder Selection

To select appropriate confounders for a PCM, the approach described in Section 3.2 and the data described in Section 3.1.2 is used. The results of this investigation applied to position, extent and orientation errors are presented in Table 2.

TABLE 2

A table showing confounders identified to be important for the target variables considered.

| Target variable | Good confounders |
|---|---|
| d_centre_x | centre_x, distance, azimuth, occluded_category |
| d_centre_y | centre_y, height |
| d_centre_z | centre_x, centre_y, centre_z, distance, occluded_category |
| d_height | height, type |
| d_width | width |
| d_length | height, width, length, type |
| d_orientation_x | orientation_x, orientation_y, orientation_z |
| d_orientation_y | orientation_x, orientation_y, orientation_z |
| d_orientation_z | orientation_x, orientation_y, orientation_z |

It can be seen from Table 2 that for d_centre_x and d_centre_z, relevant confounders are some combination of object position relative to the camera and how occluded the object is.

The perception system 102 assumes that detected objects exist on the ground plane, y=0, which is a likely reason why d_centre_y does not show a dependence on distance.

For a model of the position errors of dynamic objects detected by the perception system 102, this analysis identifies position and occlusion as good confounders to start with. The data doesn't show a strong preference for favouring a position confounder based on a Cartesian grid (centre_x, centre_y, centre_z) versus polar coordinates (distance, azimuth). distance and azimuth are used for the PRISM prototype described herein, but a more in depth evaluation of the relative performance of each could be performed.

4.2.3 Analysis of Time Correlation for Positional Error Deltas

Figure 19:
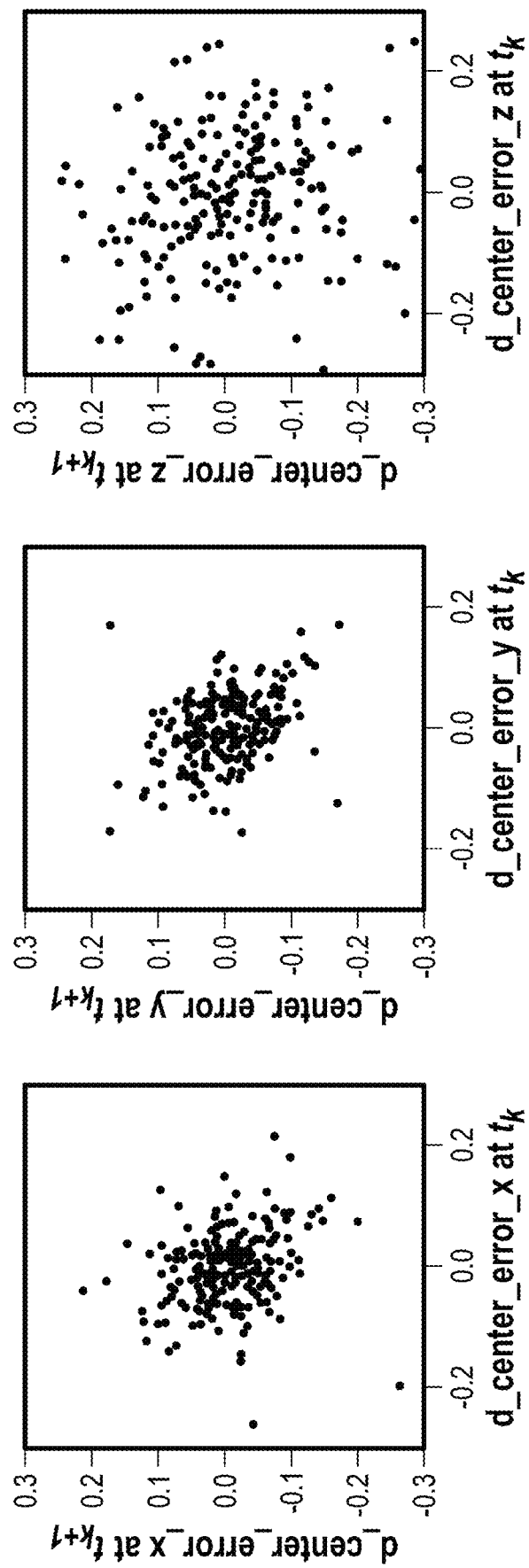
FIG. 19 shows lag plots for positional error deltas.

The time-correlation analysis performed for positional errors can be repeated for a time series of error deltas, giving the lag plots shown in FIG. 19. These plots show much less time-correlation in the error deltas than was found in the positional errors. Pearson correlation coefficients for the error deltas are presented in Table 3. For each dimension they are reasonably small in magnitude, -0.35 being the furthest from zero. From this analysis it can be concluded that a good model of error deltas can be formed of independent samples from a relevant distribution.

TABLE 3

| Pearson correlation coefficients for error delta sample vs one time step delayed sample | |
|---|---|
| Person coefficient | value |
| $\rho_X$ | -0.144944 |
| $\rho_Y$ | -0.350051 |
| $\rho_Z$ | -0.20976 |

Distributions of Positional Error Deltas

Figure 20:
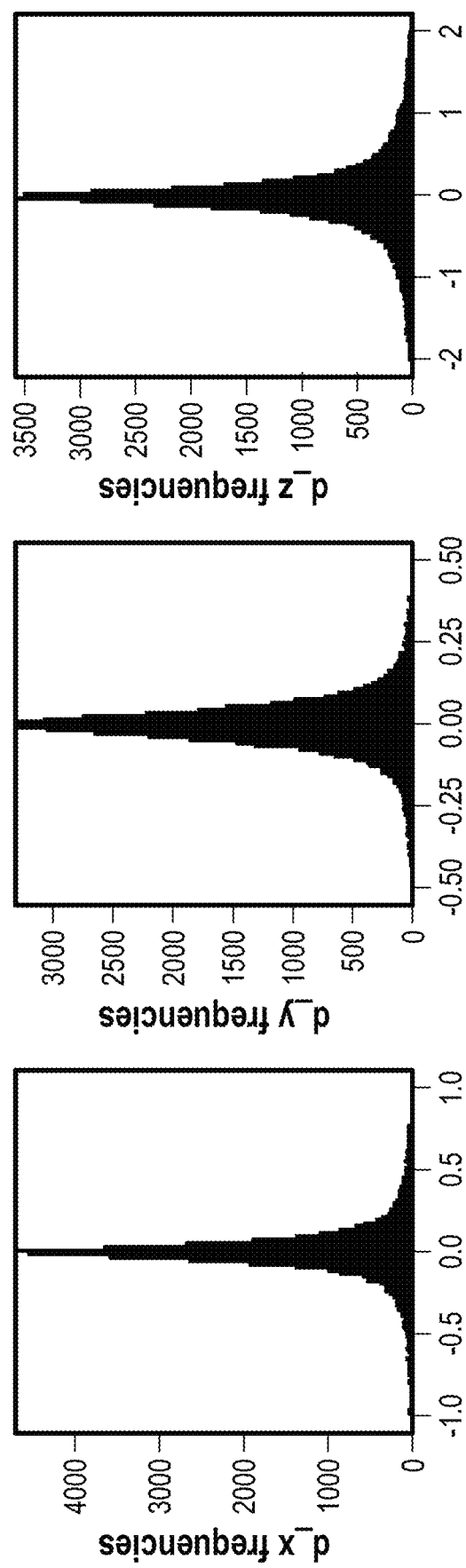
FIG. 20 shows histograms of positional error deltas, for X Y and Z components.
Figure 21:
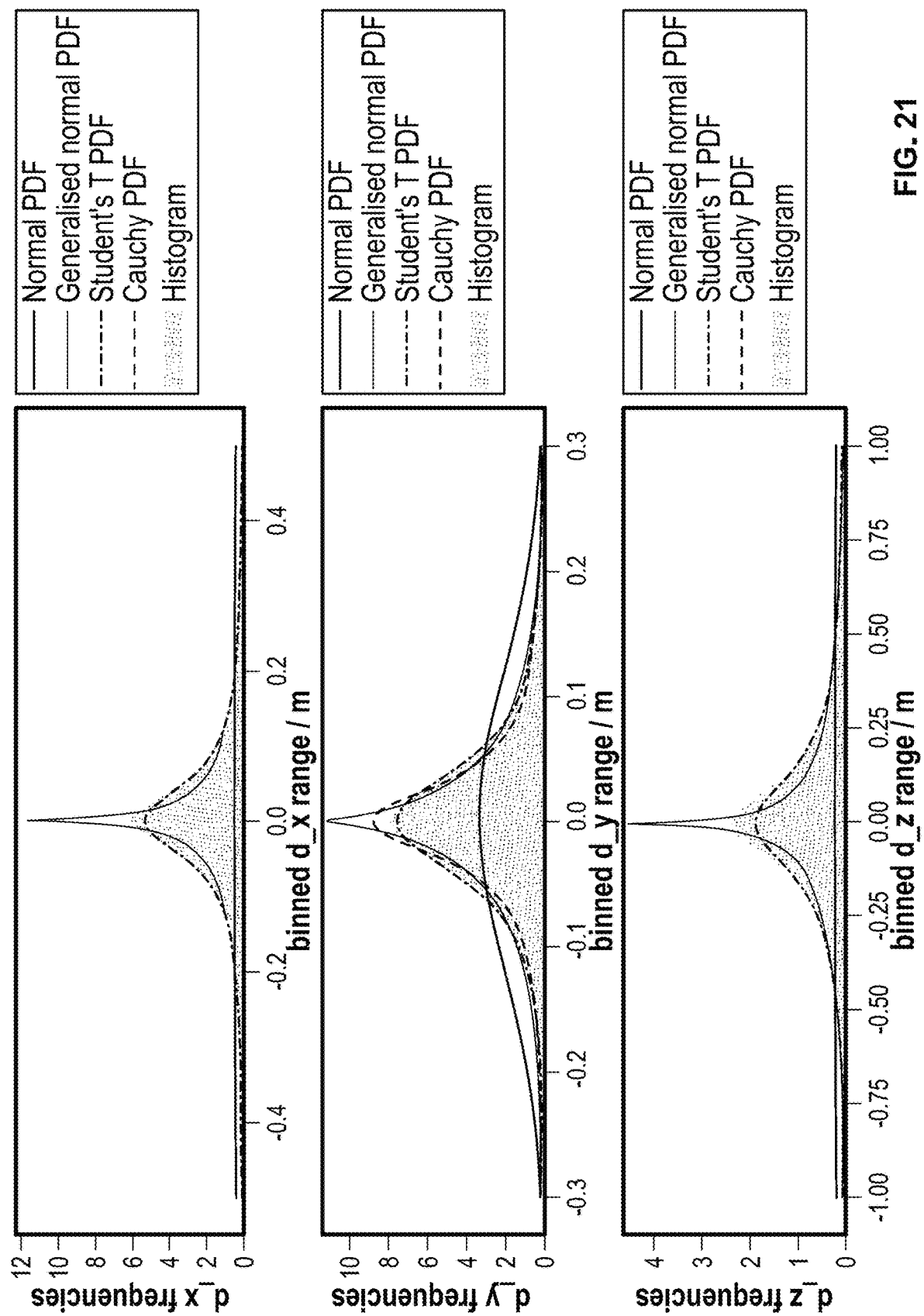
FIG. 21 shows PDF fitting positional error deltas, for X Y and Z components.

In general, the x, y, z error delta dimensions will be correlated. Here they are considered independently, but note that future effort could consider modelling them jointly. Histograms of error delta samples are presented in FIG. 20 from which it is clear that error deltas are much more likely to be approximately zero than not, but with a long tail of extreme values. The maximum likelihood best-fit to this data of some trial distributions is shown in FIG. 21. A visual inspection of these plots indicates that the Student's t-distribution may be a good modelling choice for generating error deltas. A normal distribution is a poor fit due to the non-trivial number of extreme error deltas present in the data.

Bounding the Random Walk

The autoregressive error delta model proposed in Section 4.2.1 is in general a non-bounded stochastic process. However, it is known that the detected position of dynamic objects does not simply diverge, it remains in the vicinity of the ground truth. This is an important property that must be captured in the time-dependent model. As a concrete example of this point, consider modelling the positional error as a Gaussian random walk, setting $\Delta e_k \sim \mathcal{N}(0, k\sigma^2)$. This yields a distribution on positional error at time $t_k$ of $e_k \sim$ $\mathcal{N}(0, k\sigma^2)$, for which the variance increases without bound in time. Such a property must not be present in a PRISM model.

AR(1) is a first-order autoregressive process defined by $$y_t = a_1 y_{t-1} + \epsilon_t \tag{19}$$

with $\epsilon_t$ a sample from a zero-mean noise distribution and $y_t$ a sample of the variable of interest at time t. This process is known to be wide-sense stationary for $|a_1|<1$, otherwise the generated time series is non-stationary. Comparing Equation 18 to Equation 19 it can be seen that the error delta model as proposed in Equation 18 will be non-stationary if $\Delta e_k$ is zero-mean, given the results known for AR(1). Such a model is therefore insufficient for generating plausible stack outputs.

An extension to the model proposal of Equation 18 is proposed, motivated by the nature of the error delta data collected. The extension is to model $\Delta e_k$ conditioned on the previous error, such that a best fit to $P(\Delta e_k | e_k - 1)$ is found. A model of this form should learn to sample error deltas that move the positional error towards zero with increasing probability the further the positional error gets from zero. This is found to be true.

Following the piecewise constant modelling approach described in Section 4.2.2, $P(\Delta e_k | e_k - 1)$ is approximated as follows:

Form M bins for the space of $e_{k-1}$ values, with boundaries $\{b_0, b_1, \ldots, b_M\}$.

Characterise a separate distribution $P_m(\Delta e_k)$ for each bin, where 0<m<M represents the bin index.

Given a previous timestep positional error $e_{k-1}$, the next error delta is drawn from $P_m(\Delta e_k)$ where $B_{m-1} \leq e_{k-1} < B_m$.

Figure 22:
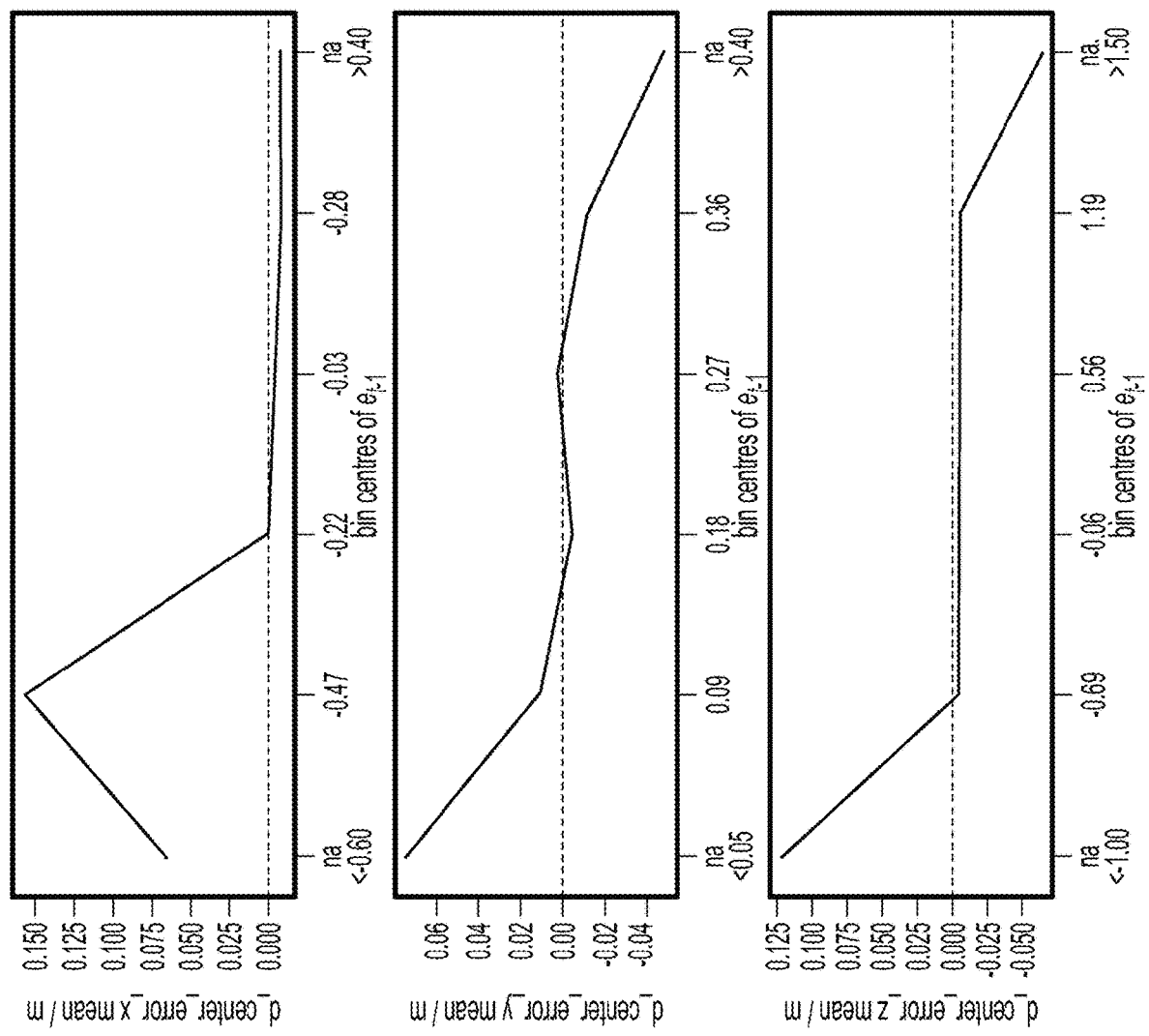
FIG. 22 shows example means of error delta distributions in the training data (based on single object tracked)

FIG. 22 shows the computed sample means over PRISM training data for M=5. The trends revealed are as expected, with the following intuitive explanation. Consider a series of error delta samples with the same polarity, accumulating an absolute positional error far from the ground truth. For the overall process to appear stationary, subsequent error delta samples with the same polarity should be less likely than a change in direction back towards the true object position. This observation helps to interpret the negative Pearson coefficients presented in Table 3, which indicate a slight preference for subsequent error deltas to reverse polarity.

The binning scheme for $P_m(\Delta e_k)$ suffers a typical PCM disadvantage of low sample cardinality in extreme bins. A simple prior can be used to mitigate this risk, for example setting the mean of the distribution in each bin to follow $\mu_m = -ae_m$ where $e_m$ is the central value of the $m^{th}$ bin and a>0. It is interesting to note that if $P_m(\Delta e_k)$ is chosen to be Gaussian, such that $\Delta e_k \sim \mathcal{N}(-ae_k, \sigma^2)$, then the time-dependent model becomes $$e_k = (1-a)e_{k-1} + \mathcal{N}(0, \sigma^2) \tag{20}$$

which is the canonical AR(1) process and is stationary provided that a<2. In practice, a good prior will require a~0 and so such a model is stationary by construction.

4.2.6 A Simple Validation

Figure 23:
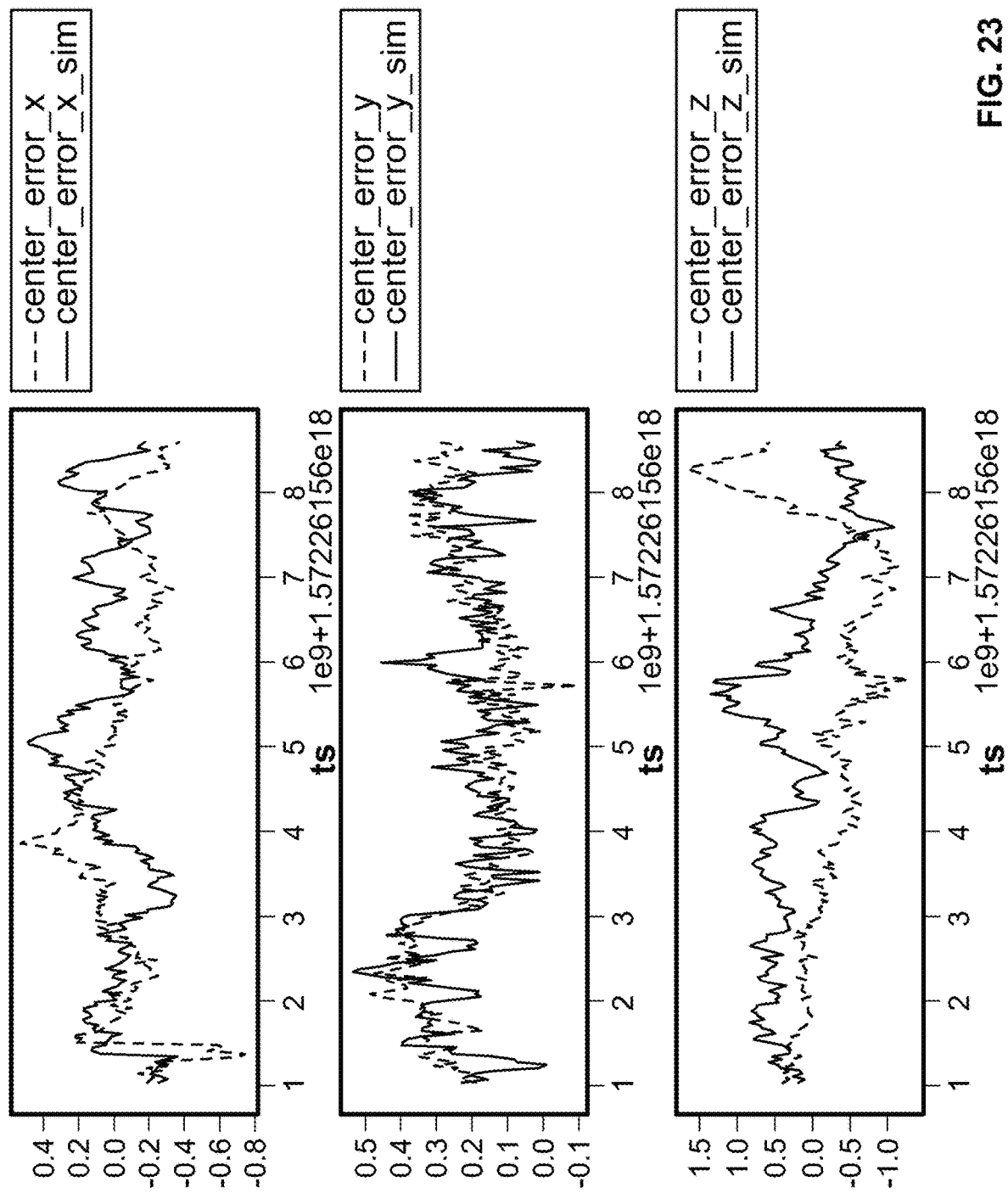
FIG. 23 shows time series plots of real perception errors vs simulated errors.
Figure 24:
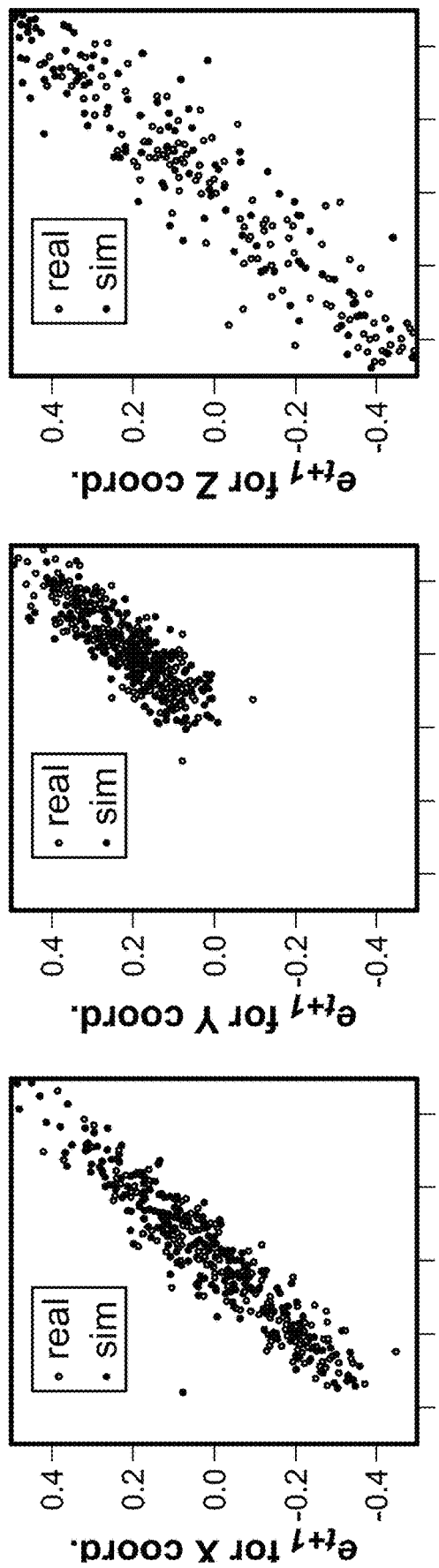
FIG. 24 shows lag plots for real perception errors vs simulated errors.

It is instructive to see if samples from the proposed time-correlated positional error model reproduce the features which motivated its construction. Plots of the positional error of a single dynamic object trace sampled from the learnt distribution are shown in FIG. 23. The lag-plot for the same data is shown in FIG. 24. In both cases the real perception error data is provided for visual comparison. The similarity of the PRISM sample and observed stack data is encouraging. Clearly a more quantitative evaluation, which will be the subject of Section 5, is required to make any meaningful claims of plausibility.

False Negatives and False Positives

Perception systems have failure modes that extend past noisy position estimates of dynamic objects. The detector may fail to identify an object in the scene, a false negative, or it may identify an object which does not exist, a false positive. A surrogate model like PRISM must emulate the observed false negative and positive rates of the detector. This section discusses the importance of modelling false negatives, investigates which confounders affect false negative rates and proposes two simple Markov models. It is demonstrated that using more confounders can produce a better performing Markov model and highlight some problems of doing so with the piecewise constant approach.

An investigation was performed to determine the frequencies of true positives (TPs), false negatives (FNs) and false positives (FPs). The results are summarised in Table 4. There are significantly more false negative events than false positives. The counts in Table 4 are for all object distances. It may seem unfair to count false negatives at such a distance from the detector that a human would have a difficult time identifying. Introducing a distance filter on the events reduces the factor by which false negatives are more prevalent than false positives, but the difference remains clear. When considering objects closer than 50 m in depth, the number of TP/FN/FP events is 34046/13343/843. Dropping the distance threshold to 20 m in depth, the number of TP/FN/FP events is 12626/1236/201.

TABLE 4

A table showing figures describing false positive and false negative events in the dataset

|  | true positives | FNs | FPs |
|---|---|---|---|
| Total number of events in the dataset | 44588 | 51925 | 1338 |
| Total number of frames, where events are observed | 8449 | 8440 | 1147 |
| Maximum number of events on a single frame | 13 | 20 | 4 |

4.2.9 False Negative Modelling

Figure 25:
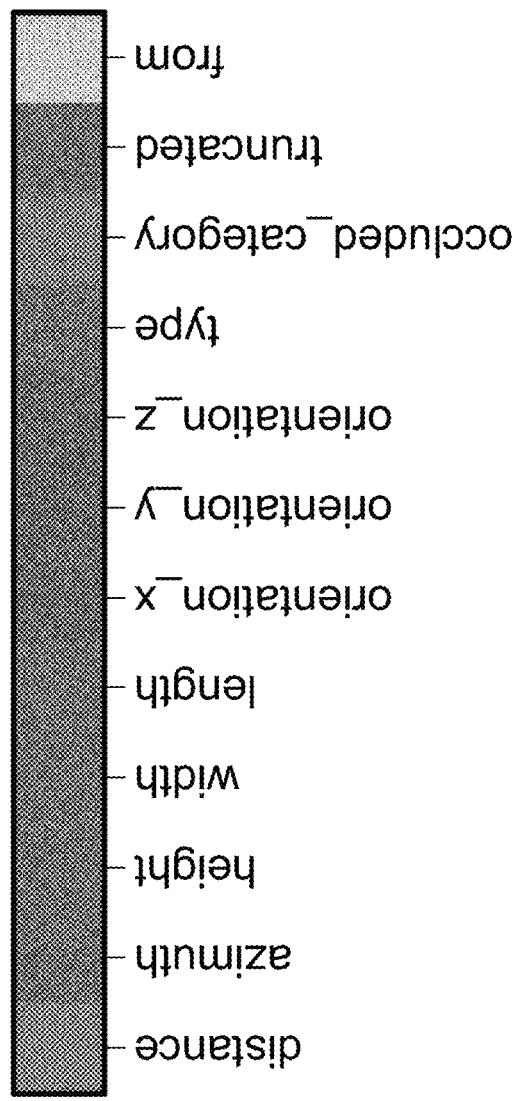
FIG. 25 graphically depicts the relative importance of certain confounders in a particular (left to right) for a target association state as determined by a Multi SURF Relief analysis.

Following the approach set out in Section 3.2, the importance of different confounders on false negatives is explored by employing the relief algorithm. Milts[2] is employed on a randomly chosen 20% sample of the training data. The results are shown in FIG. 25. A 20% random sample of the data allows the algorithm to run with tractable memory usage. The target variable is the class of association the detector produces, either: associated or false-negative. The class of association is referred to as the association state. The same list of confounders is used as in Section 3.2, with distance and azimuth replacing centre_x, centre_y and centre_z. It has been found that binning schemes based on distance and azimuth perform as well as binning on the centre values, while being lower dimensional. In addition, occluded_category is used, it being the most reliable occlusion variable. In addition, the association state of an object in the previous timestep is included as a potential confounder. This is labelled "from" in FIG. 25. Note that "from" has three possible values: associated, false negative, and empty. When an object is first visible to the detector there will be no previous association state; in the previous timestep the detector truly didn't detect the object. The association state for such timesteps is treated as empty, a true negative. Likewise for objects which disappear from view, either by exiting the camera frustum or becoming fully occluded, the empty association state is used as the previous association state for the first frame in which the object reappears.

Ryan J. Urbanowicz, Randal S. Olson, Peter Schmitt, Melissa Meeker, and Jason H. Moore. Benchmarking relief-based feature selection methods for bioinformatics data mining. Journal of biomedical informatics, 85:168{188, 2018.

From FIG. 25, it can be seen that the most important confounder is the "from" category. This implies the strongest predictor of the association state is the association state in the previous timestep. This relationship fits intuition; if a detector fails to detect an object in one timestep it would be expected to do so across a number of frames. The object might be inherently difficult for the detector to identify, or there might be some property of the scene (such as lens flare for a camera) that affects its sensing ability and persists across multiple frames. The next most important confounder is the occluded_category. This again fits intuition—if an object is occluded it is more difficult to detect and thus more likely to be a false negative. Distance is also important. Again, this is expected; the further away an object is the less information is known about it (e.g. a car further away is represented by fewer pixels in a camera image than a closer car).

Guided by this evaluation, a model of false negatives is constructed where the only confounding variable is the association state in the previous timestep. This is a Markov model as it assumes that the current state is dependent on the previous state only. This is modelled by determining the probability of transition from the state at timestep t−1 to the state at timestep t. Denoting the association state X, this amounts to finding the conditional probabilities $P(X_t|X_{t-1})$. To determine these transition probabilities the frequencies of these transitions in the training data are computed. This is equivalent to Bayesian likelihood maximisation. Table 5 shows the transition probabilities and the number of instances of each transition type in the data. Every bin in Table 5 has more than 800 entries, suggesting the implied transition frequencies are reliable. The observed transition probability from false negative to false negative is 0.98, from associated to associated it is 0.96. These values reveal a strong time-correlation, as expected given the results of the Relief analysis. Is there a cause to which the transition to and persistence of a false negative state can be attributed? From the empty (true negative) state there is a 0.65 probability of transitioning to a false negative state and a 0.35 probability of transitioning to the associated state. This means that when an object first becomes visible, it is more likely to be a false negative. Many objects enter the scene in the distance, it is likely this is an important factor in generating these initial false negatives. Some objects enter the scene from the side, especially in the roundabout scenario considered in the present example. Such objects are truncated for the first few frames and this may be a factor in early false negatives. To explore these points in more detail, a model dependent on additional factors is constructed.

TABLE 5

The probability of transition from the association state in the previous timestep (rows) to the association state in the current timestep (cols) (left two columns), and the count of the number of transitions in the training dataset (right two columns).

|  | Probability | | Count | |
|---|---|---|---|---|
|  | False Neg. | Associated | False Neg. | Associated |
| False Neg. | 0.98 | 0.02 | 38,424 | 831 |
| Associated | 0.04 | 0.96 | 836 | 20,489 |
| Empty | 0.65 | 0.35 | 3,381 | 1,819 |

As a first step toward a more complicated model, a relief analysis is performed to identify the confounders that are important to the transitions without considering the previous association state. MultiSURF is employed on a randomly chosen 20% sample of the training data. The results are shown in FIG. 26.

Figure 26:
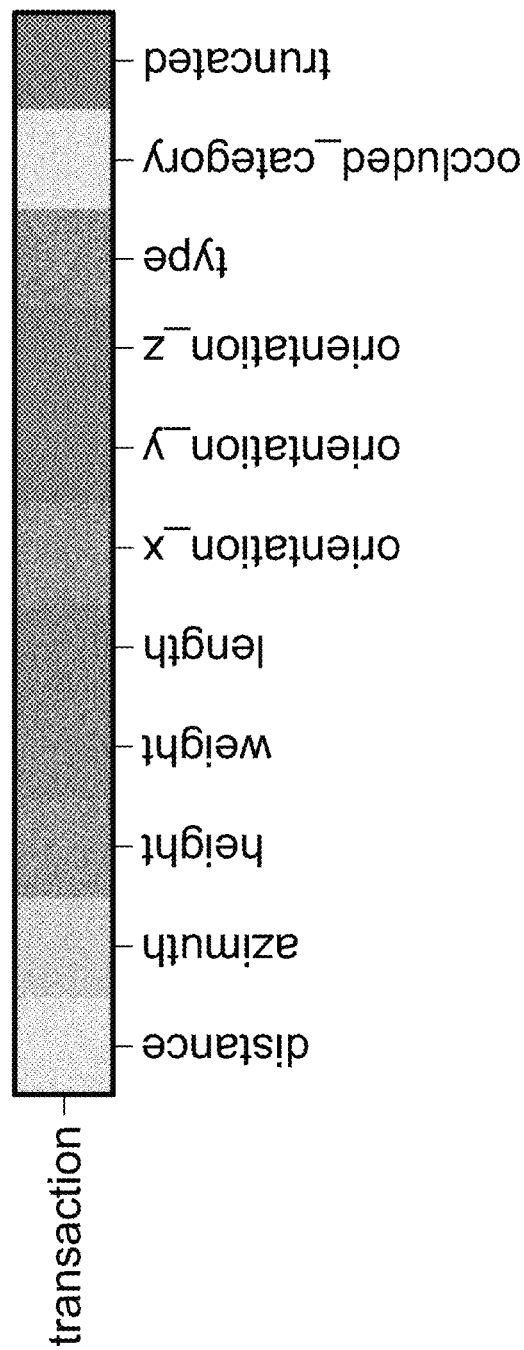
FIG. 26 graphically depicts the relative importance of confounders (left to right) for target transitions as determined by a Multi SURF Relief analysis.

FIG. 26 indicates that the most important confounders that might affect the transition probabilities are: occluded_category, distance and azimuth. In fact all the confounders are good confounders, using the criteria set out in Section 3.2. Based on this evidence, the next most complicated Markov model is created; occluded_category is added as a confounder.

Denoting the association state X and the occluded category C, the conditional probabilities $P(X_t|X_{t-1}, C_t)$. As with the first Markov model, these transition probabilities are determined from the training data by counting the frequency of occurrence. Table 6 shows the transition probabilities and the number of instances of each transition in the data.

TABLE 6

The probability of transition from the association state in the previous timestep and the occluded category (rows) to the association state in the current timestep (cols) (left two columns), and the count of the number of transitions in the training dataset (right two columns).

|  | Probability | | Count | |
|---|---|---|---|---|
|  | False Neg. | Associated | False Neg. | Associated |
| False Neg., fully-occ. | 1.00 | 0.00 | 12,665 | 27 |
| False Neg., largely-occ. | 0.98 | 0.02 | 12,037 | 264 |
| False Neg., somewhat-occ. | 0.97 | 0.03 | 10,491 | 379 |
| False Neg., fully-vis. | 0.95 | 0.05 | 3,231 | 161 |
| Associated, fully-occ. | 0.39 | 0.61 | 43 | 68 |
| Associated, largely-occ. | 0.15 | 0.85 | 242 | 1,384 |
| Associated, somewhat-occ. | 0.04 | 0.96 | 332 | 8,868 |
| Associated, fully-vis. | 0.02 | 0.98 | 219 | 10,169 |
| Empty, fully-occ. | 0.96 | 0.04 | 716 | 27 |
| Empty, largely-occ. | 0.83 | 0.17 | 1,028 | 209 |
| Empty, somewhat-occ. | 0.57 | 0.43 | 1,206 | 924 |
| Empty, fully-vis. | 0.40 | 0.60 | 431 | 659 |

Table 6 shows that some of the frequencies are determined from very low counts. For instance, only 27 transitions occur from a false negative that is fully-occluded to the associated state. However, this event is expected to be rare—that there are any of these transitions may indicate erroneous training data. These counts could be from misassociations of the annotated data with the detector observation; if an object really is fully occluded then the detector would not be expected to observe it. Perhaps the least trust-worthy transitions are from associated and fully-occluded; there are only 111 observations in total from this category. The probability of transition from associated and fully-occluded to associated is 0.61, i.e. highly likely; whereas the transition from false negative and fully-occluded to associated has few counts, it has effectively zero probability (as the number of counts from false negative and fully-occluded to false negative is so high). Rows with a low overall sum should be treated with caution.

Despite these limitations there are expected trends. When objects transition from the empty state (i.e. they are first observed) then if they are fully-visible there is a 0.60 chance of transition to associated i.e. the object is more likely to be associated than a false negative. However, if the object is largely occluded the transition probability to associated is only 0.17.

Given the limitations identified, it may be determined whether adding a confounder has improved the model. To compare these models the approach is taken that the model with the smaller negative log predictive density (NLPD) better explains the data. The respective NLPDs are calculated on the held-out test set. The simple Markov model has an NLPD of 10,197 compared with 9,189 for the Markov model with confounders. Adding the occlusion category confounder has improved the model by this metric.

This comparison demonstrates that the inclusion of confounders can improve the model. To construct a model including all the relevant confounders the paradigm used in the piecewise constant model is followed, new confounders add extra bins (e.g. Table 6 has more rows than Table 5).

5. Neural Network PRISMs

This section described how PRISMS might be implemented using neural networks or similar "black box" models.

As is well known in the art, a neural network is formed of a series of "layers", which in turn are formed of neurons (nodes). In a classical neural network, each node in an input layer receives a component of an input to the network (such as an image), which is typically multidimensional, and each node in each subsequent layer is connected to each node in the previous layer, and computes a function of a weighted sum of the outputs of the nodes to which it is connected.

Figure 27:
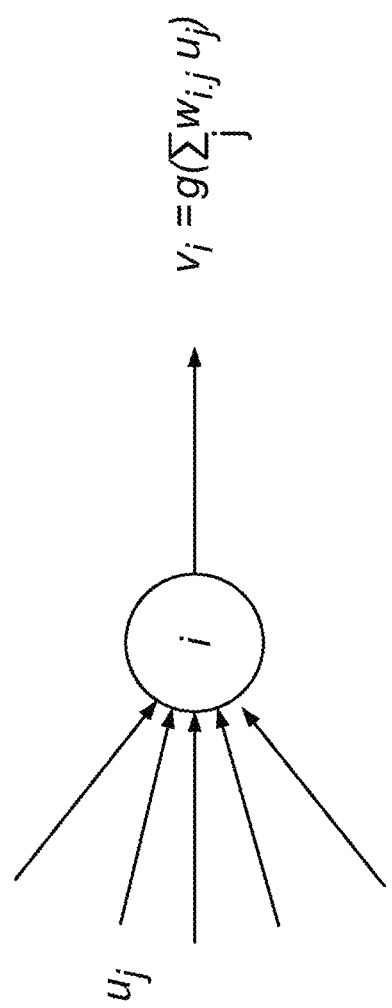
FIG. 27 shows an example node in a neural network.

By way of example, FIG. 27 shows a node i in a neural network that receives a set of inputs $\{u_j\}$ and computes as its output a function of a weighted sum of those inputs:

$$v_i = g\left(\sum_j w_{i,j} u_j\right)$$

Here, g is an "activation function" which may be non-linear, and $\{w_{i,j}\}$ is a set of weights applied at node i. The weights across the network are tuned during training.

Figure 28:
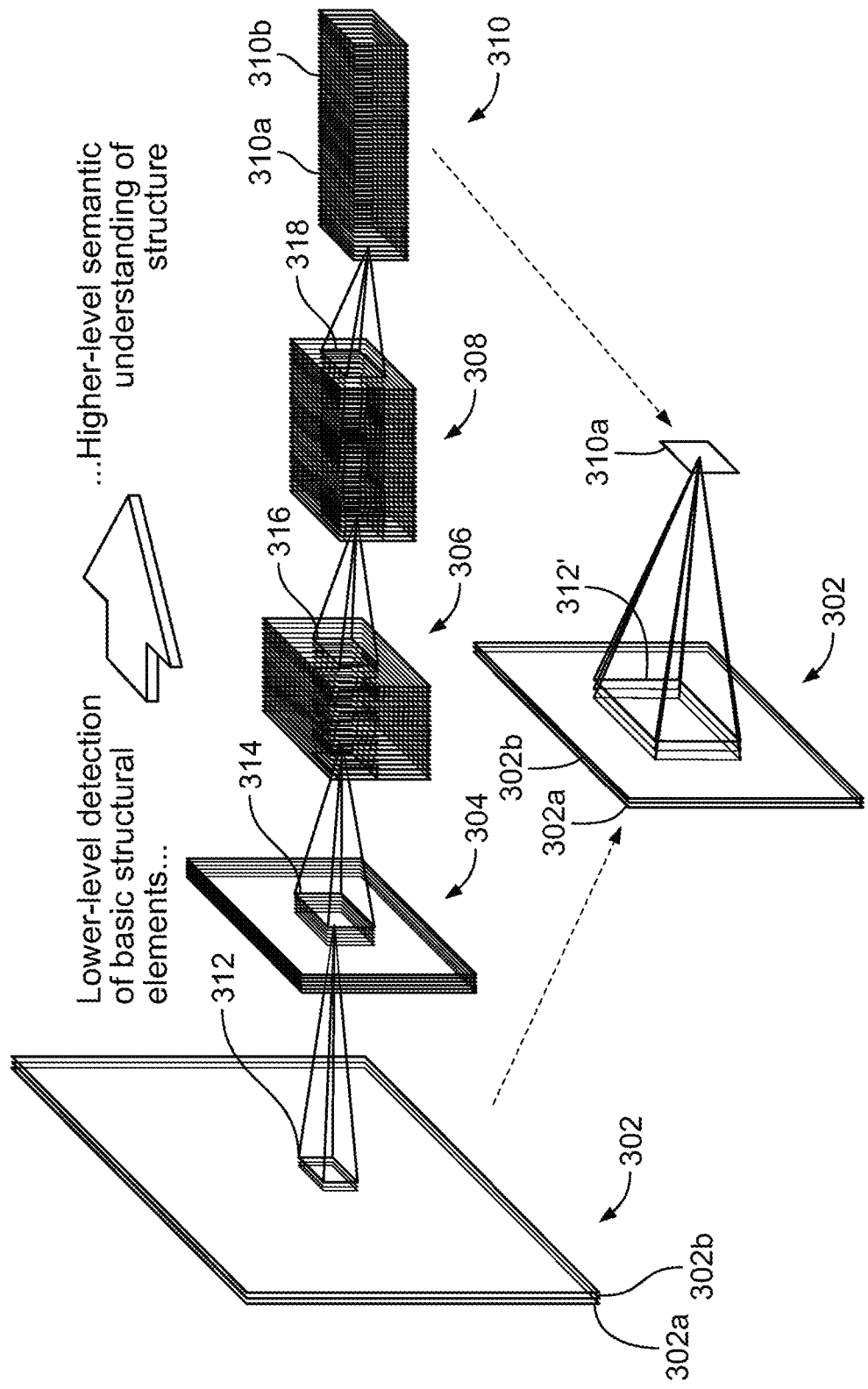
FIG. 28 shows a highly level overview of a convolutional neural network architecture.

With reference to FIG. 28, it is useful to conceptualize the inputs to and outputs of the layers of a CNN as "volumes" in a discrete three dimensional space (i.e. three dimensional arrays), each formed of a stack of two-dimensional arrays referred to as "feature maps" herein. More generally, CNNs take "tensors" as input which can have any dimensionality in general. The following description may also refer to a feature map as a layer of a tensor.

By way of example FIG. 28 shows a sequence of five such tensors 302, 304, 306, 308 and 310 that may for example be generated through a series of convolution operations, pooling operations and non-linear transformations, as is known in the art. For reference, two feature maps within the first tensor 302 are labelled 302a and 302b respectively, and two feature maps within the fifth tensor 310 are labelled 310a and 310b respectively. Herein (x,y) coordinates refer to locations within a feature map or image as applicable. The z dimension corresponds to the "depth" of the feature map or image, and may be referred to as the feature dimension. A color image has a depth of three corresponding to the three color channels, i.e. the value at (x,y,z) is the value of color channel z at location (x,y). A tensor generated at a processing layer within a CNN has a depth corresponding to a number of filters applied at that layer, where each filter corresponds to a particular feature the CNN learns to recognize.

A CNN differs from a classical neural network architecture in that it has processing layers that are not fully connected. Rather, processing layers are provided that are only partially connected to other processing layer(s). In particular, each node in a convolution layer is connected to only a localized 3D region of the processing layer(s) from which it receives inputs and over which that node performs a convolution with respect to a filter. The nodes to which that node is particularly connected are said to be within a "receptive field" of that filter. The filter is defined by a set of filter weights and the convolution at each node is a weighted sum (weighted according to the filter weights) of the outputs of the nodes within the receptive field of the filter. The localized partial connections from one layer to the next respect (x, y) positions of values within their respective tensors, such that (x, y) position information is at least to some extent preserved within the CNN as data passes through the network.

Each feature map is determined by convolving a given filter over an input tensor. The depth (extent in the z-direction) of each convolution layer is thus equal to the number of filters applied at that layer. The input tensor itself could be an image or it could be a stack of feature maps that have themselves been determined through convolution. When convolution is applied to an image directly, each filter operates as a low-level structure detector, in that "activations" (i.e. relatively large output values) occur when certain structure is formed by the pixels within the filter's receptive field (that is, structure which matches a particular filter). However, when convolution is applied to a tensor that is itself the result of convolution earlier in the network, each convolution is performed across a set of feature maps for different features, therefore activations further into the network occur when particular combinations of lower level features are present within the receptive field. Thus with each successive convolution, the network is detecting the presence of increasingly high level structural features corresponding to particular combinations of features from the previous convolution. Thus in the early layers the network is effectively performing lower level structure detection but gradually moves towards higher level semantic understanding of structure in the later layers. The filter weights are learned during training, which is how the network learns what structure to look for. As is known in the art, convolution can be used in conjunction with other operations. For example, pooling (a form of dimensionality reduction) and non-linear transformations (such as ReLu, softmax etc.) are typical operations that are used in conjunction with convolution within a CNN.

Figure 29:
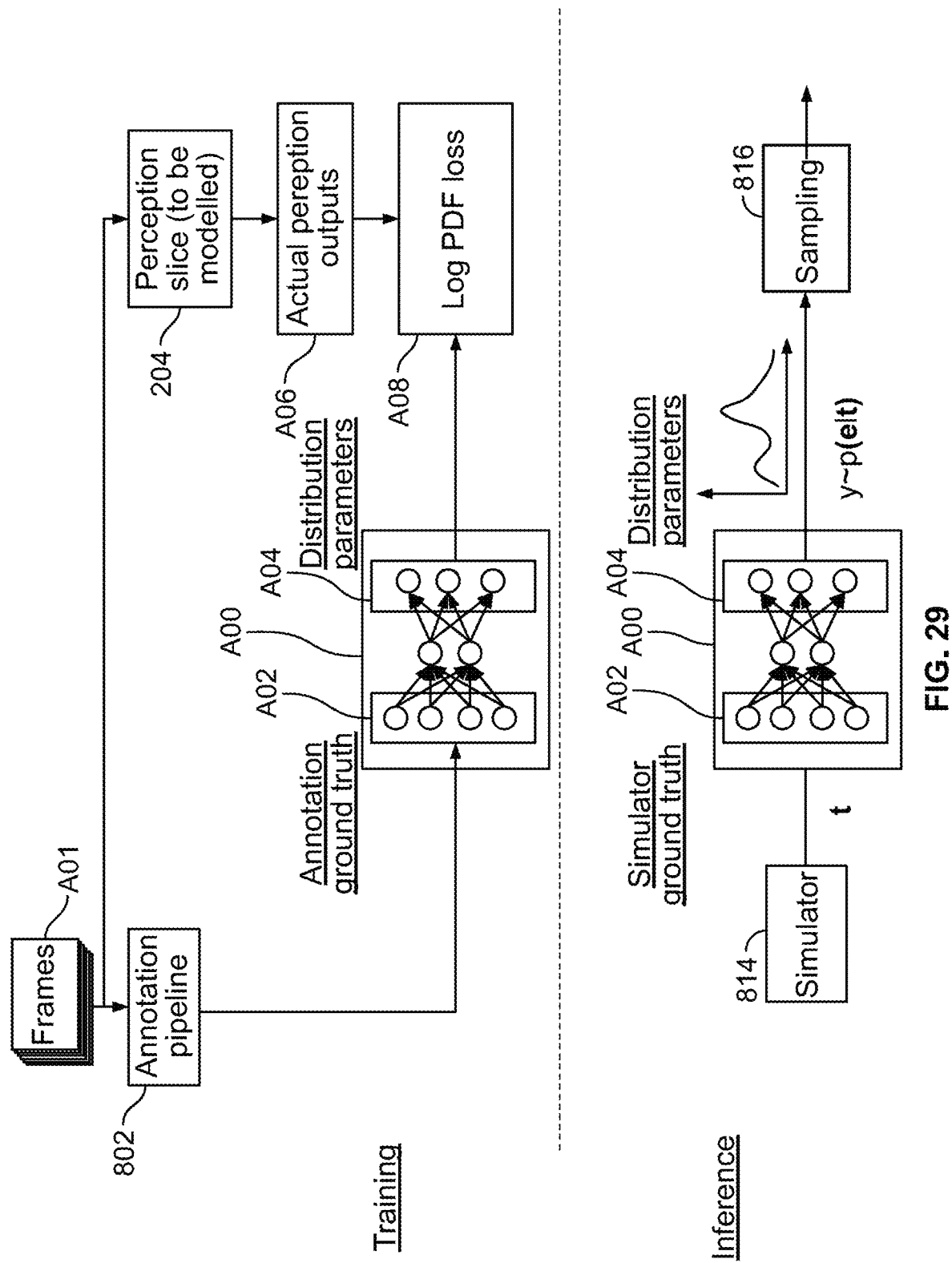
FIG. 29 shows a PSPM implements as a neural network, at training and inference.

FIG. 29 shows a highly schematic overview of a PSPM implemented as a neural network (net) or similarly trainable function approximator.

In this example, a neural net A00 has an input layer A02 and an output layer A04. Whilst the neural network A00 is schematically depicted as a simple feed-forward neural network, this is merely illustrative, and the neural net A100 can take any form, including e.g. Recurrent Neural Network (RNN) and/or Convolutional Neural Network (CNN) architectures. The terms "input layer" and "output layer" do not imply any particular neural net architecture and encompass, for example, input and output tensors in the case of CNNs.

At the input layer A02, the neural net A00 receives a perception ground truth t as input. For example, the perception ground truth t could be encoded as an input vector or tensor. In general, the perception ground truth t can pertain to any number of objects and any number of underlying sensor modalities.

The neural net A00 can be represented mathematically as a function $$y=f(t;w)$$

where w is a set of tuneable weights (parameters), according to which the input t is processed. During training, the aim is to optimize the weights w with respect to some loss function defined on the output y.

In the example of FIG. 29, the output y is a set of distribution parameters that define a predicted probability distribution p(e|t), i.e. the probability of obtaining some predicted perception output e given the perception ground truth t at the input layer A02.

Taking the simple example of a Gaussian (Normal) distribution, the output layer A04 could be configured to provide a predicted mean and variance for a given ground truth:

$$y=\{\mu(t;w),\sigma(t;w)\}.$$

Note that either of both of the mean and variance can vary as a function of the input ground truth t, as defined by the learned weights w, giving the neural net A00 the flexibility to learn such dependencies during training, to the extent they are reflected in the training data it is exposed to.

During training, the aim is to learn weights w that match p(e|t) to actual perception outputs A06 generated by a perception slice 204 to be modelled. This means optimizing a suitable loss function A08, e.g. via gradient descent or ascent, that can meaningfully compare a distribution p(e|t) predicted at the output layer for a given ground truth t with an actual perception output corresponding to the ground truth t. As described above, the ground truth inputs t used for training are provided by the ground truthing (annotation) pipeline 802, having been defined via manual, automatic or semi-automatic annotation of the sensor data to which the perception slice 204 is applied. A set of sensor data to which the perception slice 204 is applied may be referred to as an input sample or, equivalently, frame in the following description, and is denoted by reference numeral A01. Actual perception outputs are computed for each frame A01 by applying the perception slice 204 to the sensor data of that frame. However, in accordance with the above teaching, the neural net A00 is not exposed to the underlying sensor data during training, and instead receives the annotation ground truth t for that frame A01 as the input that conveys the underlying scene.

There exist various neural networks architectures that can be trained to predict a conditional distribution of the form p(e|t), given a sufficient set of example {e,t} pairs. For a simple Gaussian distribution (univariate or multivariate), a log normal or (negative) log PDF loss function A08 can be used. One way of extending this to non-Gaussian distributions is to use a Gaussian mixture model, where the neural net A00 is trained to predict multiple component Gaussian distribution together with mixing coefficients for combining these (learned as a function of the input t in the same way as the mean and variance for each Gaussian component). Theoretically, any distribution can be represented as mixed Gaussians, therefore Gaussian mixture models are a useful way to approximate general distributions. References herein to "fitting Normal distributions" and the like encompass Gaussian mixture models. The relevant description also applies more generally to other distribution parameterizations. As will be appreciated, there are various known techniques by which a neural net can be architected and trained to predict conditional probability distributions given sufficiently representative examples of input-output pairs. Therefore, further details are not described herein unless specifically relevant to the described embodiments.

At inference, the trained network A00 is used as described above. A perception ground truth t provided by the simulator 814 is provided to the neural net A00 at the input layer A02, which is processed by the neural net A00 to generate a predicted perception output distribution of the form p(e|t) at the output layer A04, that can then be sampled from, by the sampling orchestration component (sampler) 816, in the manner described above.

It is important to note the use of terminology herein. "Ground truth" in this context refers to the input to the neural net A00, from which its output is generated. In training, the ground truth input comes from annotation, and at inference it is provided by the simulator 814.

Whilst an actual perception output A06 can be seen as a form of ground truth in the context of training—in that it is an example of the kind of output the neural network is trained to replicate—that terminology is generally avoided herein to avoid confusion with the input to the PSPM. Perception outputs generated by applying the perception slice 204 to sensor data are instead referred to as "actual" or "target" perception outputs. The aim of training is to tune the weights w so as to match the distribution parameters at the output layer A04 to the actual perception output A06, via optimization of a suitable loss function that measures deviation between the output of the network and the target perception outputs.

FIG. 29 is not necessarily a complete representation of the inputs or outputs of the neural net A00—it can take additional input(s) that the predicted distribution will then depend on and/or it can provide other output(s) that are a function of its input(s).

5.1 Confounders

Figure 30:
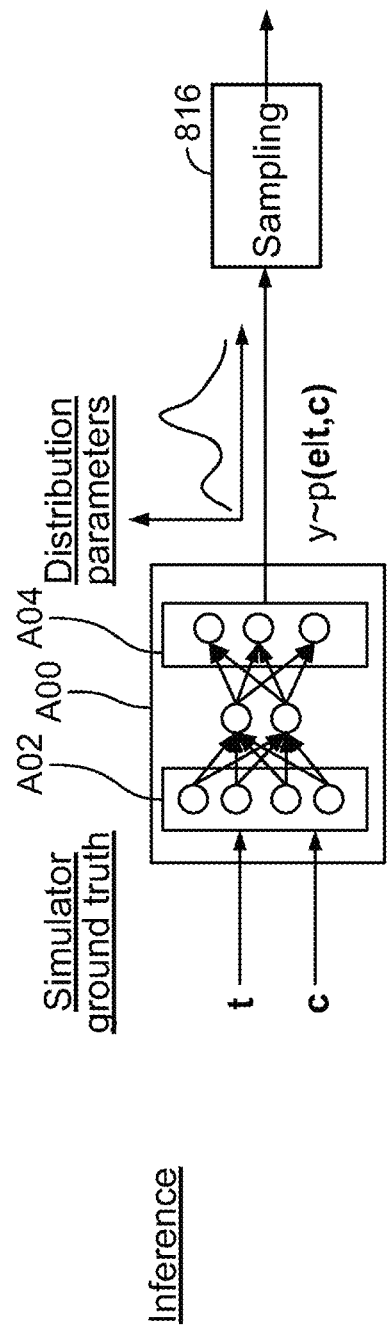
FIG. 30 shows a neural net PSPM with one or more confounder inputs at an input layer.

FIG. 30 shows an extension of the neural network to incorporate one or more confounders c according to the principles described above. Confounders are straightforward to incorporate in this architecture, as they can simply be provided as additional input(s) at the input layer A02 (at both training and inference), and during training the neural network A00 can therefore learn the dependency of the output distribution(s) on the confounders c. That is, the network A00 can learn the distribution p(e|t,c) at the output layer A04, where any parameter of the distribution (e.g. mean, standard deviation and mixing coefficient) can depend not only on the ground truth t but also the confounders c, to the extent those dependencies are captured in the training data.

5.2 Time Dependency

Figure 31:
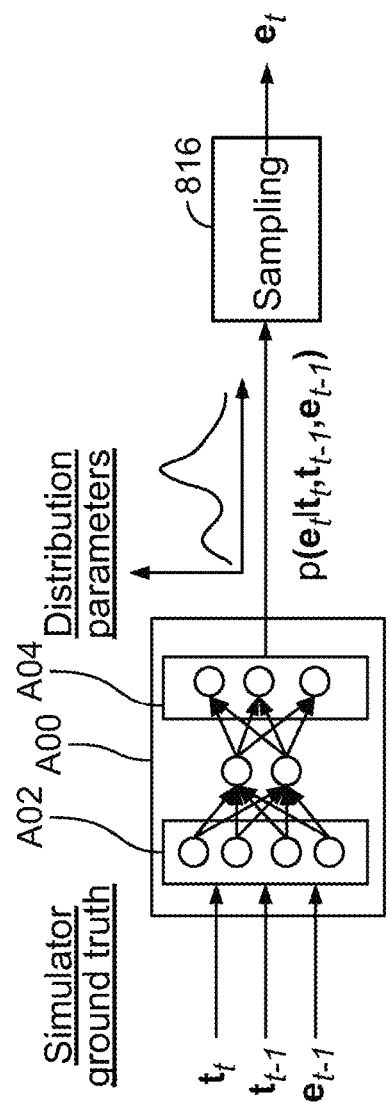
FIG. 31 shows one example of a time-dependent neural network architecture.

FIG. 31 shows another extension, to incorporate explicit time dependency. In this case, the function (neural net) takes as input, at the input layer A02:

Current Ground Truth, $t_t$,
Previous Time Step Ground Truth, $t_{t-1}$,
Previous Detection Output $e_{t-1}$, where the t (non-bold, italicised) subscript denotes a time instant. The output is a distribution for a current perception output $p(e_t|t_t,t_{t-1},e_{t-1})$, with a current sampled perception output $e_t$ obtained by sampling that distribution.

Here, $e_{t-1}$ is similarly obtained by sampling from the distribution predicted in the previous time step, hence the distribution predicted in the current step will depend on the output of the sampler 816 in the previous step.

The implementations of Figures B and C can be combined, to incorporate both confounders and explicit time dependency.

One way to implement the above is for the perception ground truths t and the sampled perception outputs e to model the properties of each detected object separately. For example, these properties could include Position, Extent, Orientation and Type.

The output layer A04 of the neural network is used to predict real valued variables which are transformed and then parameterise probability distributions over variables of interest. Conceptually, this form of neural network models the perception slice 204 as stochastic function.

Epistemic uncertainty motivates the modelling of the perception slice 204 as stochastic: even though the perception slice 204 is deterministic, it exhibits apparent randomness stemming from lack of knowledge of the many unknown variables that will influence its output in practice.

A typical scene might include multiple perceived objects. Note that e and t are general notation herein that can represent sampled perception outputs/perception ground truth for a single object or multiple objects.

Another challenge noted above is modelling false positives (FP, i.e. erroneous positive detections of objects) and false negatives (FN, i.e. failure to detect an object). An effect of FPs and/or FNs is that the number of ground truth objects (i.e. the number of objects for which perception ground truth is provided) will not necessarily match the number of predicted objects (i.e. the number of objects for which realistic perception output samples are provided)

A distinction may be drawn between a "single object" approach and a "set-to-set approach". In the broadest sense, single object PSPMs rely on explicit one-to-one associations between ground truth objects and predicted objects. The simplest way to implement a single object PSPM is to consider each object independently during training, in respect of its associated single-object ground truth. At inference, the PSPM receives a perception ground truth for a single object, and provides a single-object perception output. False negatives can be accommodated straightforwardly, by introducing some mechanism by which failed detections of a single object can be modelled.

5.3 Single-Object PSPMs

Ae example implementation for a single-object PSPM using neural nets will now be described. Normal distributions are fitted for position and extent variables (these can be multivariate normal if desired).

To model orientations, the approach from Sec 3.2.2 of Peretroukhin et. al., "Probabilistic Regression of Rotations using Quaternion Averaging and a Deep Multi-Headed Network" [https://arxiv.org/pdf/1904.03182.pdf]—incorporated herein by reference in its entirety—can be followed. In that approach, a quaternion representation of orientation is used.

Noise is injected into a tangent space around quaternions, possibly with a mixture of quaternions around which noise is injected.

False "negativeness" is modelled with a Bernoulli random variable.

Individual variable distributions may be conditionally independent given the final network layer A04, however dependence/correlation can be induced by feeding noise as an extra input into the neural network to form a stochastic likelihood function. This is in effect a mixture distribution.

The neural network A00 is trained with stochastic gradient descent (maximum likelihood—using negative log pdf of random variables as the position and extent variables (can be multivariate normal if appropriate).

The single object approach requires explicit associations to be made between ground truth objects and the actual perception outputs A06. This is because the predicted distribution for a given object needs to be matched to an appropriate single-object perception output actually produced by the perception slice 204. Identifying and encoding those associations for the purpose of PSPM training can be implemented as an additional step within the ground truthing pipeline 802.

5.4 Set-to-Set Approach

In the broadest sense, a set-to-set approach is one that does not rely on explicit associations between ground truth objects and predicted objects, i.e. during training, the PSPM does not need to be told which ground truth object corresponds to which predicted object.

Figure 32:
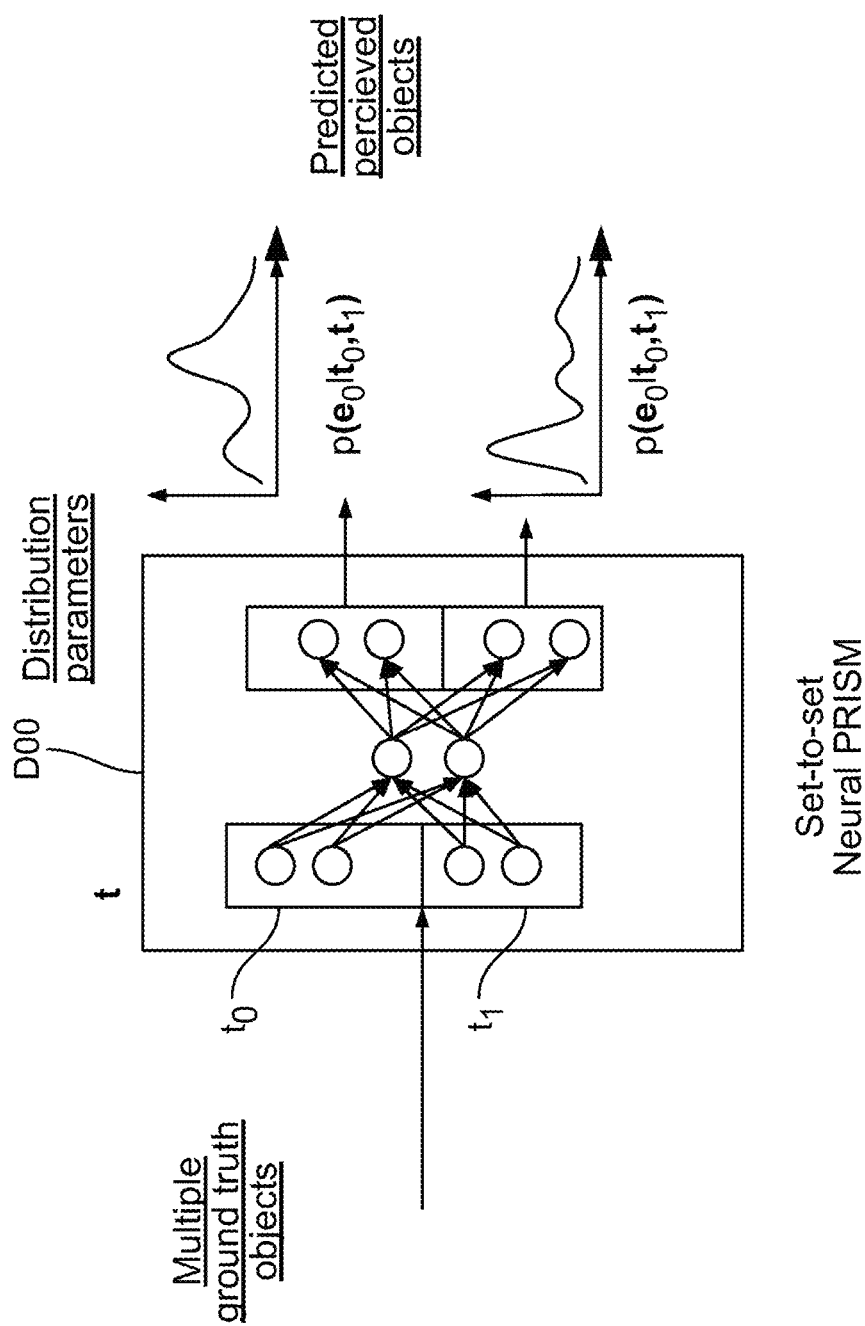
FIG. 32 shows a "set-to-set" PSPM implemented as a neural network.

FIG. 32 shows a set-to-set PSPM DOO that takes, as input, perception ground truths $\{t_0, t_1\}$ for an arbitrarily-sized set of ground truth objects (two ground truth objects in this example, indexed 0 and 1) and provides realistic perception outputs or distributions $\{e_0, e_1\}$ for a set of predicted perceived objects (also two in this example—but note the discussion of FPs and FNs below).

There are various benefits to the set-to-set approach.

An overarching benefit is the reduced annotation burden—associations between ground truth and actual perceived objects do not need to be determined for the purpose of training.

Another benefit is that correlations between objects can be modelled. In the example of FIG. 32, a set-to-set Neural Network PRISM is shown that takes the perception ground truths for any number of input objects at its input layer, and outputs distributions for each predicted object. Notably, the architecture of the network is such that the predicted perception output distribution $p(e_m|t_0, t_1)$ for any given predicted object m can, in general, depend on the ground truth perception outputs for all of the ground truth objects ($t_0, t_1$ in this example). More precisely, the architecture is flexible enough to be able to learn such dependencies to the extent they are reflected in the training data. The set-to-set approach can also learn the extent to which the perception slice 204 provides overlapping bounding boxes, and any tendency it has to "swap" objects, which are further examples of learnable object correlations.

More generally, a consequence of the set to set approach is that the joint distribution of all detections is considered at once, i.e. $p(e_1, e_2, \ldots |t_0, t_1)$ (which only reduces to the product of each $p(e_m|t_0, t_1)$ mentioned in the previous paragraph when $e_m$ are independent of each other). The advantage of this is that correlations between detections can be modelled, e.g. $e_1$ can have instance identifier 0 and so can $e_2$, but not at the same time. Whilst the preceding paragraph and FIG. 32 assume independence of $e_m$, this is not required in general—the output layer could instead be configured to represent the joint distribution $p(e_1, e_2|t_0, t_1)$ more generally.

Another benefit is the ability to model false positives with certain set-to-set architectures. This is because the number of ground truth objects is not necessarily constrained to match the number of predicted perceived objects—set-to-set architectures are viable where the latter would be less than, equal to, or more than the former, depending on the inputs to the network.

5.5 CNN Set-to-Set Architecture

By way of example, a set-to-set CNN architecture will now be described with reference to Figures D1 to D4. The following assumes that the actual perception outputs provided by the perception slice 204 comprise 3D bounding boxes for any detected objects, having a defined position, orientation and extent (size/dimensions). The CNN consumes an input tensor, and produces an output tensor, constructed as described below.

The CNN PSPM DOO jointly models output detections based on all ground truth detections in a particular frame. Time dependence could be induced using a RNN architecture, which is one way to implement explicit time dependence on previous frames.

The ground truth t and output predictions are encoded spatially, in the "PIXOR" format. In brief, the PIXOR format allows an efficient encoding of 3D spatial data, based on a top-down (bird's-eye) view. For further details, see Yang et. al. "PIXOR: Real-time 3D Object Detection from Point Clouds" [https://arxiv.org/abs/1902.06326], incorporated herein by reference in its entirety.

Figure 33A:
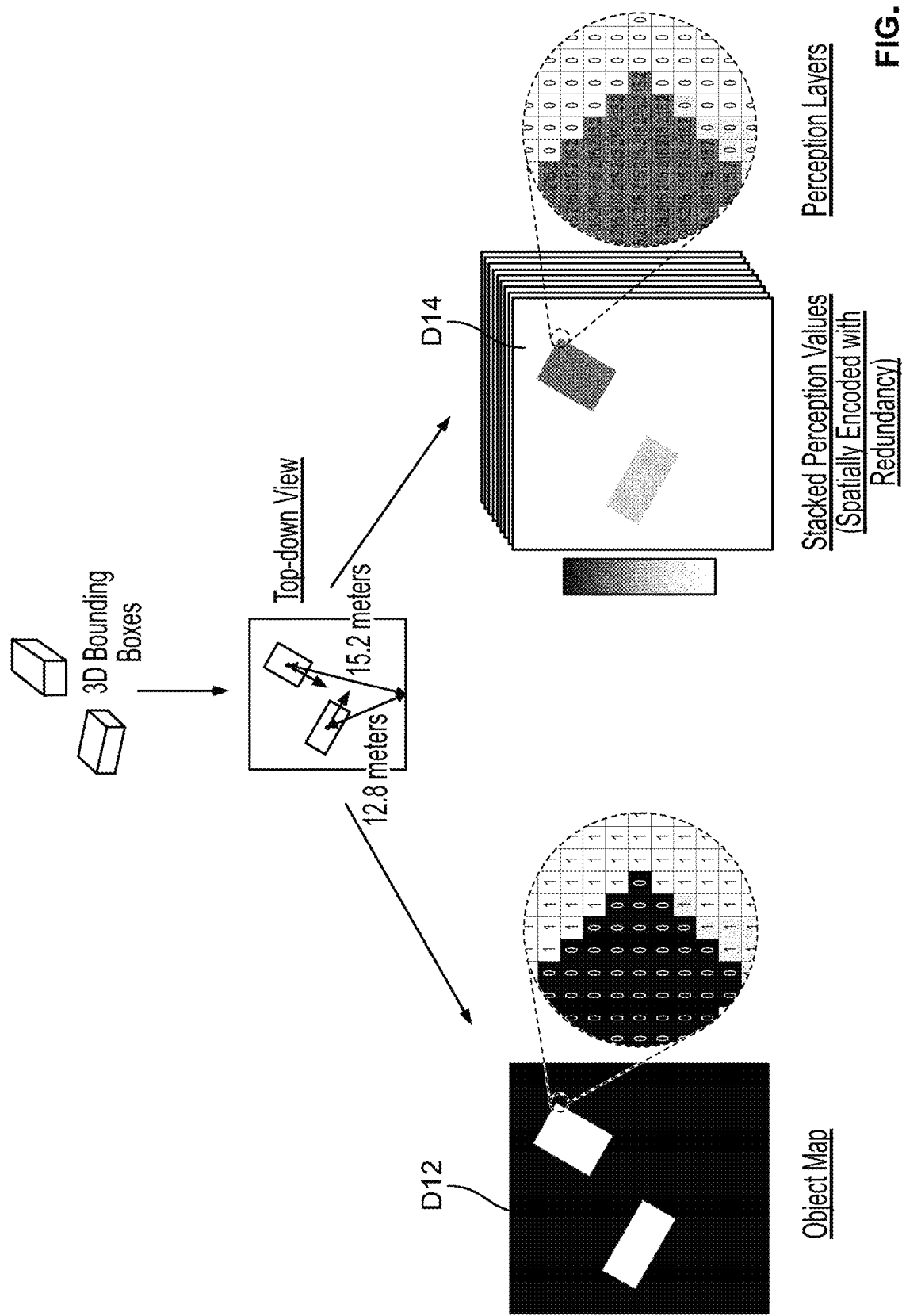
FIG. 33A schematically depicts a spatial encoding of perception outputs conducive to processing in a convolutional neural network (CNN)

As depicted in FIG. 33A, in order to represent the actual perception output A06 for the purpose of training, a low resolution (e.g. 800 px square) bird's-eye view image of the actual perceived 3D bounding boxes is generated (classification layer D12 or, more generally, object map). The output objects are drawn in only one "colour"—i.e. a classification detection image with binary encoding of "detection-ness" ("detected" pixels for a given object form an object region). This can be repeated for the ground truth objects, or generalised by drawing the input objects' colour based on their occlusion status (a one hot encoding).

To encode other properties of objects spatially, further birds eye view images are generated where the position, extent, orientation and any other important variable of the vehicle present in each pixel is represented. These further images are referred to as regression layers or perception layers, and are denoted by reference numeral D14. This means a single detection is represented multiple times in adjacent pixels, and some information is redundant, as depicted. The images are stacked to produce a tensor of size (HEIGHT×WIDTH×NUMBER OF IMPORTANT VARIABLES).

Note, it is the perception layers that encode the 3D bounding boxes, with redundancy. When "decoding" an output tensor, it is the actual numerical values of the regression layers D14 that define the position, orientation and extent of the bounding boxes. The purpose of the spatial encoding in the bird's-eye view is to provide the information encoded within the perception layers D14 of the input tensor in a form that is conducive to interpretation by a CNN.

One advantage of this model is that correlations between different object detections can be learnt—e.g. it can be learnt if stacks do not predict overlapping objects. Also, the PSPM can learn if stacks swap object IDs between objects.

By feeding in extra input images, e.g. a map of the scene (indicating environmental structure), the CNN can be encouraged to predict False Positives in physically meaningful places, as this provides the CNN with the information it needs to determine correlations between false positives and the map during training.

The CNN can also have input to receive confounder(s), in any suitable form. Object-specific confounders can be encoded spatially in the same way. Examples of such confounders include occlusion values, i.e. measure(s) of the extent of occlusion by other objects and/or truncation (the extent to which an object is outside of a sensor field of view).

Figure 33B:
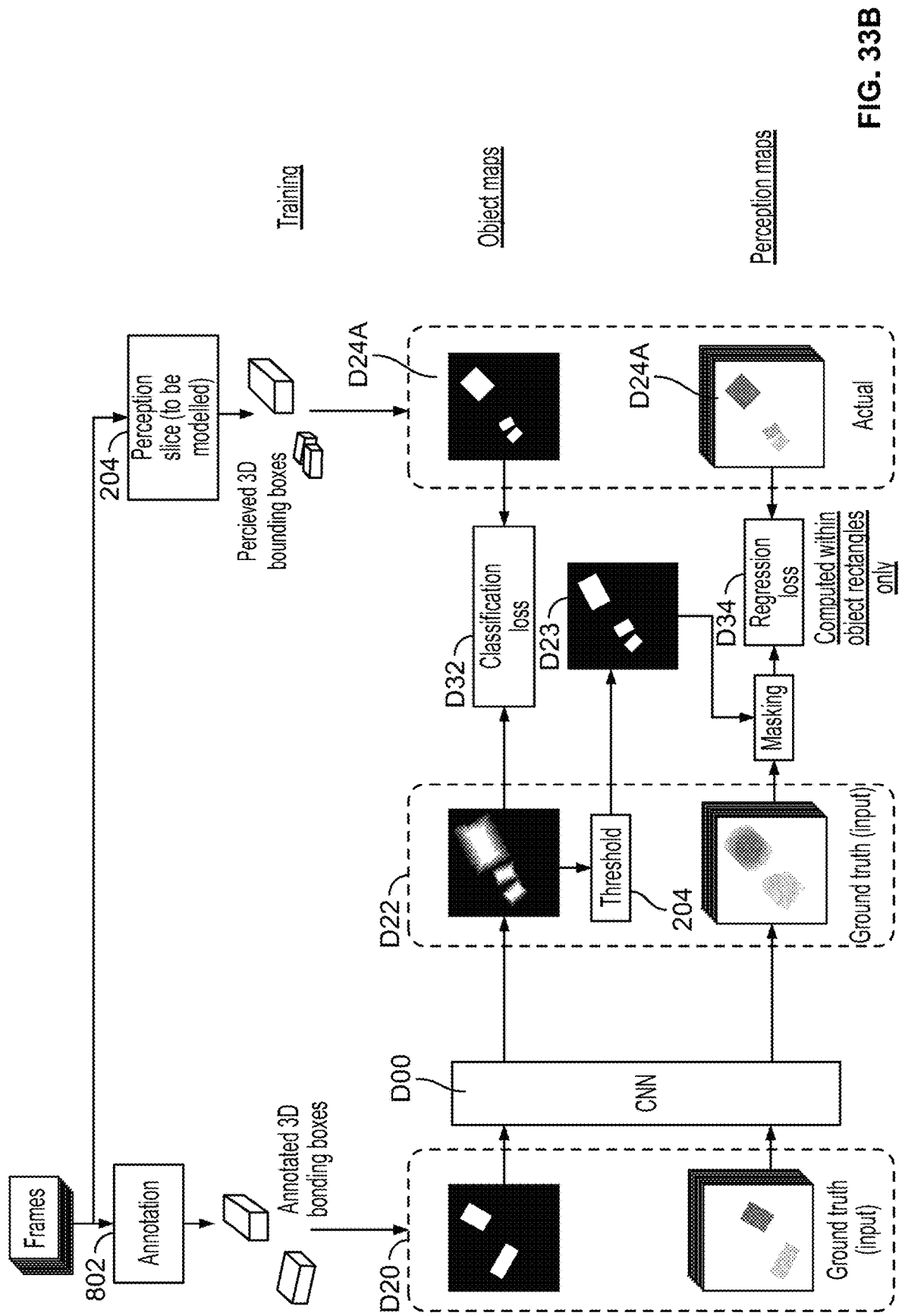
FIG. 33B schematically depicts a training phase of a CNN PSPM.

FIG. 33B schematically illustrates the training of the CNN.

The CNN DOO is trained to predict an output tensor D22 from an input tensor D20 using a classification (e.g. cross entropy) loss D32 for the classification layer and a regression (e.g. smoothed L1) loss D34 for the regression layers of those tensors. The classification and regression layers of the input and output tensors D20, D22 are depicted separately merely for clarity. In general, the information can be encoded in one or multiple tensors.

The regression layers of the input tensor D20 encode the perception ground truth t for a current frame, for any number of ground truth objects.

The classification loss D32 is defined with respect to a target classification image D24A derived from the actual perception output e for the current frame. The regression loss is defined with respect to target perception layers D24B that spatially encode the actual perception outputs for the current frame.

Each pixel of the classification layer of the output tensor D22 encodes a probability that an object is detected at that pixel (probability of "detection-ness"). The corresponding pixels of the regression layers define the corresponding object position, extent and orientation.

The classification layer of the output tensor D22 is thresholded, to produce a binary output classification image. During training, the binary output classification image D23 is used to mask the regression layers, i.e. the regression loss only considers areas in which an object is present within the thresholded image D23, and ignores areas of the regression layers outside of this.

Figure 33C:
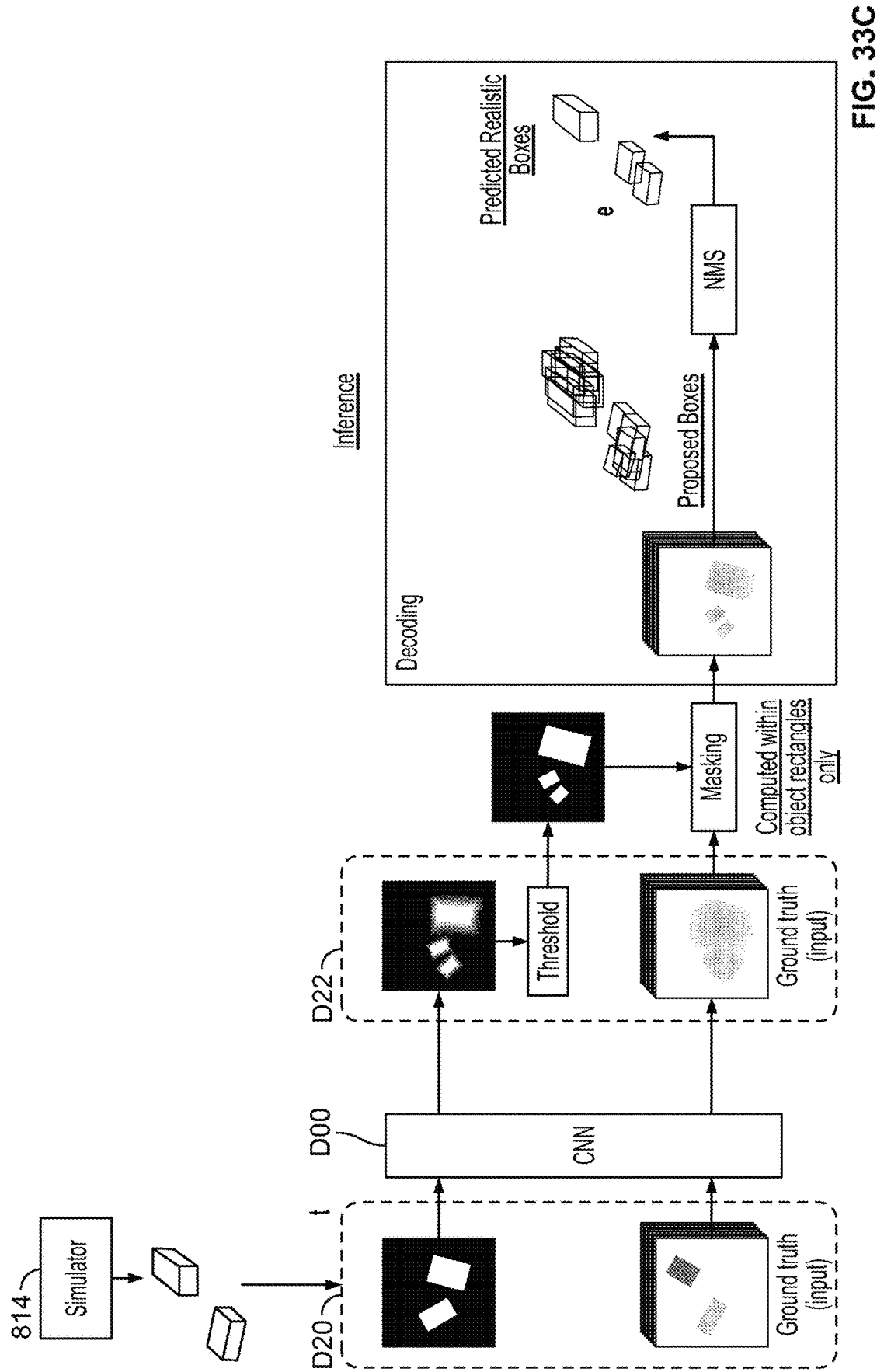
FIG. 33C schematically depicts a trained CNN PSPM at inference.

FIG. 33C shows how the trained network may be applied at test time or inference.

At inference, the input tensor D20 now encodes a perception ground truth t (for any number of objects) that is provided by the simulator 814.

The classification layer on the output image is thresholded, and used to mask the regression layers of the output tensor D22. Non-marked pixels, within the object regions of the thresholded image, contain perception values which can then be considered as detections.

Predicted perceived 3D bounding boxes are decoded from the masked regression layers of the output tensor D22.

Recall that, for any given pixel, it is the numerical values of that pixel in the regression layers that define the extent, position and orientation of a bounding box, hence it is straightforward to obtain a predicted 3D bounding box for each unmasked pixel. As shown, this will generally result in a large number of overlapping boxes (proposed boxes), because every pixel within each object region is activated by the binary image (i.e. taken as a valid bounding box proposal).

Non-maximal suppression (NMS) is applied to the decoded bounding boxes to ensure objects are not detected multiple times. As is well known, NMS provides a systematic way to discard proposed boxes based on a confidence score for the box and degree of overlap with other boxes. In this context, for a box corresponding to any given pixel of the output tensor D22, the detection-ness probability at that pixel from the (non-thresholded) classification layer can be used as the confidence score.

As an alternative, the use of non-maximal suppression can be avoided by choosing to only activate the output classification image in the centre position of the object. Hence only one detection would be obtained for each object and no NMS would be required. This could be combined with a stochastic likelihood (feeding noise as an extra input into the neural network), in order to mitigate the effect of only activating the output classification image at the centre position of the object.

A GAN (generative adversarial network) could be used in addition to the other losses to obtain more realistic network outputs.

The simple example described above does not provide a probability distribution at the output layer—i.e. the is a one-to-one mapping between a perception ground truth t and a predicted set of perception outputs e encoded directly in the output tensor (the network is deterministic in this sense). This can be interpreted as an "average" response of the perception slice 204 given the ground truth t.

Figure 33D:
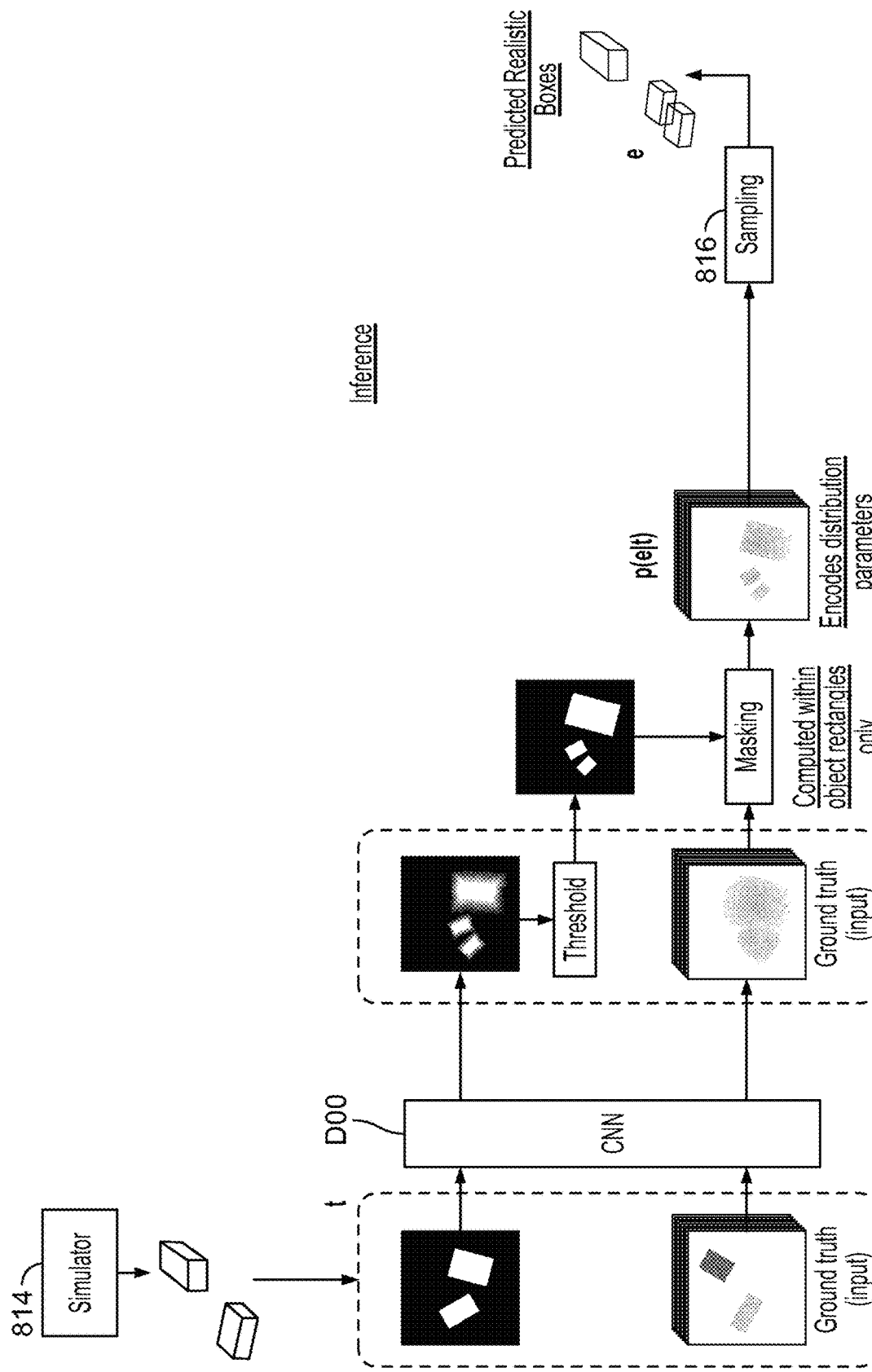
FIG. 33D shows how a CNN PSPM may be architected to encode perception output distributions in an output tensor, from which realistic perception outputs may be sampled.

However, as depicted in FIG. 33D, the architecture can be extended to predict distributions at the output tensor D22, applying exactly the same principles as described above with reference to FIG. 29. The perception values of the output tensor D22, in that case, encode distribution parameters, and the L1 regression loss D34 is replaced with a log PDF loss or other loss suitable for learning conditional distributions.

Another option is to train an ensemble of deterministic neural networks in the same way, but on different subsets of the training data. With M neural nets trained in this way, in combination those networks would provide a sampled perception output directly (M samples in total for each ground truth t). With a sufficient number of appropriately configured deterministic nets, the spread of their output samples could capture the statistical properties of the perception slice 204 being modelled, in a similar way to a learned parameterised distribution.

5.6 Modelling Online Error Estimation

Figure 34:
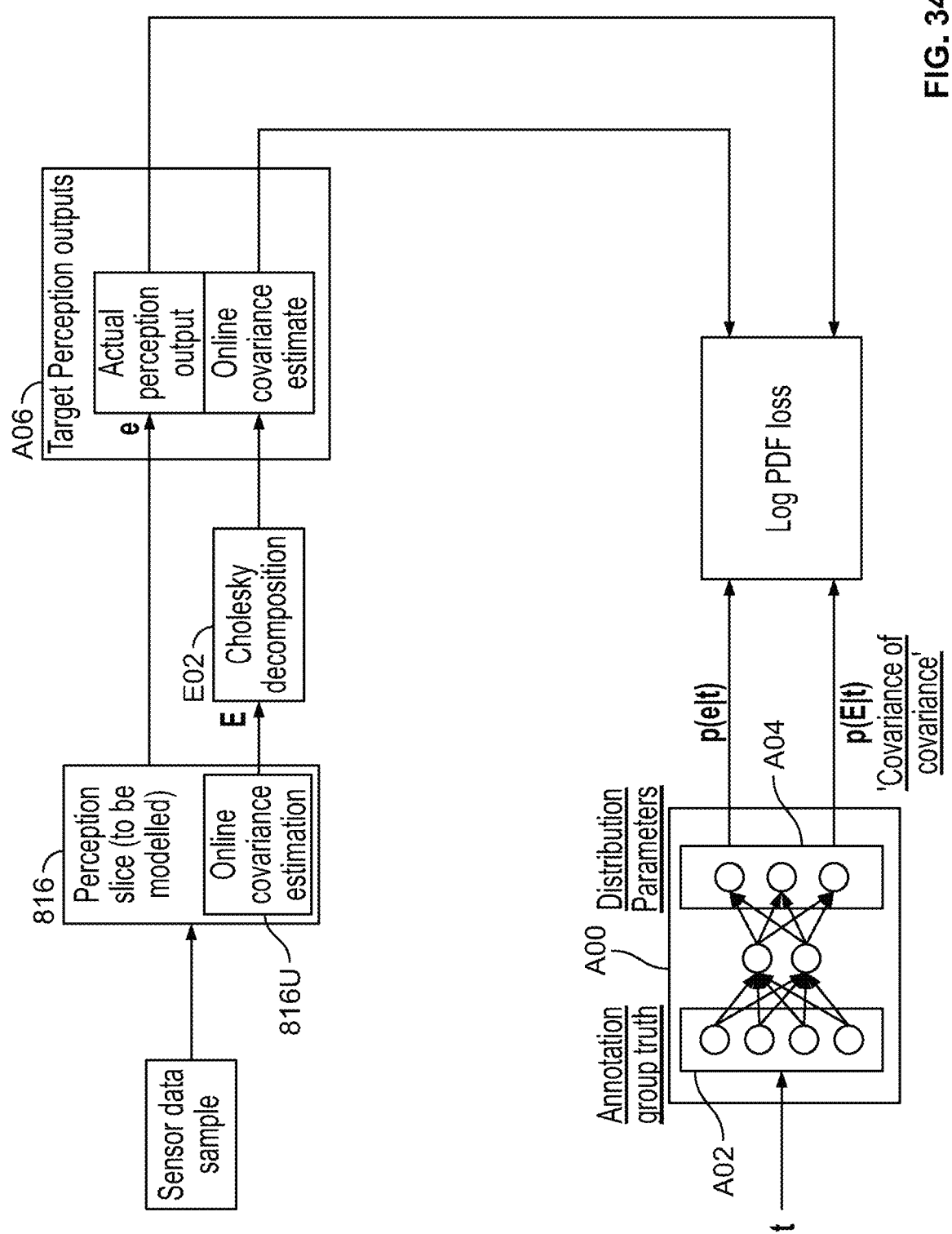
FIG. 34 shows how a PSPM may be configured to model a perception slice that includes an online error estimation component.

FIG. 34 illustrates a further extension to accommodate the modelling of online error (e.g. covariance) estimates within the perception slice 816 to be modelled. An online error estimator 816U within the stack provides an error estimate (or set of error estimates) associated with its perception outputs. An online error estimate is an estimate within the prediction system 816 as to the error associated with its outputs. Note, this is the prediction slice's own (potentially flawed) estimation of the uncertainty in its outputs, that would typically be generated in real-time using only information that would be available on the vehicle at runtime. This may, itself, be subject to error. Such error estimates are important, for example, in the context of filtering or fusion, where multiple perception outputs (e.g. derived from different sensor modalities) may be fused in a way that respects their relative levels of uncertainty. Incorrect online covariances can lead to fusion errors. Online error estimates can also feed directly into prediction 104 and/or planning 106, e.g. where planning is based on probabilistic predictions. Hence, errors in the online error estimate can potentially have a significant impact on stack performance, and in the worst case could result in unsafe decisions (particularly if the level of error for a given perception output is underestimated).

The approach to modelling online covariance (or other online error estimates) is different to position, extent and orientation, because there is no ground truth covariance available, i.e. the ground truth input t does not include any ground truth covariance.

The only change, therefore, is adding additional distribution parameters at the output layer A04, to additionally model the distribution p(E|t), i.e. the probability of the online error estimator 816U providing an error estimate of E given the perception ground truth t.

Note, this also treats the online error estimator 816U as a stochastic function. Without loss of generality, this may be referred to as the neural net A00 learning the "covariance of the covariance". Modelling the online error estimation component 816U in this manner can accommodate epistemic uncertainty about the online error estimator 816U, in the same way as other such uncertainty about the perception system 204. This is particularly useful if the inputs to the online error estimator 816U are hard or expensive to simulate. For example, if the online error estimator 816U were applied to sensor data directly, this would be a way to model the online error estimator 816 without having to simulate those sensor data inputs.

Covariance is fitted by taking a Cholesky decomposition E02 of the covariance matrix to yield a triangular matrix. This yields positive diagonal elements, allowing the log of the diagonal elements to be computed. Then normal distributions can be fitted to each component of the matrix (multivariate normal can be used if desired). At test time the procedure is reversed to yield the desired covariance matrix (the lower triangular scale matrices are multiplied together). This allows the loss function to be formulated as a straightforward numerical regression loss, on the unconstrained space of the Cholesky decomposition. In order to "decode" the neural network, the inverse transformation can be applied. At inference, p(E|t) can be sampled in the same manner as p(e|t), to obtain realistic sampled online error estimates.

All of the architectures depicted in FIGS. 29-34. For example, time and/or confounder dependence could be incorporated in the model of FIG. 34, such that the covariance of the covariance is dependent on one or both.

More generally, the net can be configured to learn a joint distribution of the form P (e, E|t), which reduces to the above when e and E are independent of each other (but both dependent on the ground truth t).

6. PSPM Applications

There are a number of useful applications of PSPMs, some of which will now be described.

6.1. Planning Under Uncertainty

The use case set out above tests planning under uncertainty. This means testing how the planner 106 performs in the presence of statistically representative perception errors. In that context, the benefit arises in the ability to expose the planner 106 and prediction stack 104 to realistic perception errors in a robust and efficient manner.

One benefit of the confounder approach is that, when an instance of unsafe behaviour has occurred in a particular scenario, the contribution of any confounders to that behaviour can be explored by running the same scenario but with different confounders c (which may have the effect of changing the perception uncertainty p(e|t,c)).

As already mentioned, when sampling from the PSPMs, there is no requirement to sample in a uniform way. It may be beneficial to deliberately bias the sampling towards outliers (i.e. lower probability PSPM samples).

The way that confounders c are incorporated also facilitates the testing of more challenging scenarios. For example, if it is observed through simulation that the planner 106 is making relatively more errors in the presence of occlusion, that could be a trigger to test more scenarios in which external objects are occluded.

6.2. Separating Perception and Planning/Prediction Error

Another somewhat related, but nonetheless separate application, is the ability to isolate the cause of unsafe decisions by the planner 106 within the runtime stack 100. In particular, it provides a convenient mechanism to reason about whether the cause was perception error as opposed to prediction/planning errors.

For example, consider a simulated scenario in which an instance of unsafe behaviour occurs. This unsafe behaviour could have arisen because of a perception error but equally it might have been caused by a prediction or planning error. To help isolate the cause, the same scenario could be run but without the PSPMs i.e. directly on the perfect perception ground truths instead, to see how the planner 106 performs in exactly the same scenario but with perfect perception outputs. If unsafe behaviour still occurs, this points to the unsafe behaviour being at least partially attributable to errors outside of the perception stack 102, which could indicate prediction and/or planning errors.

6.3. Training

Simulation can also be used as a basis for training, such as reinforcement learning training. For example, simulation may be used as a basis for training of components within the prediction stack 104, planner 106 or controller 108. In some circumstances, there may be benefits to running training simulations based on realistic perception outputs provided by PSPMs.

6.4 Testing Different Sensor Arrangements

One possible advantage of the PSPM approach is the ability to simulate sensor types/positions not actually tested. This can be used to make reasoned inferences about, say, the effect of moving a particular set of sensors on the AV, or of using a different type of sensors.

For example, a relatively simple way to test the impact of reducing the pixel resolution of the on-board cameras would be to reduce the pixel resolutions of the annotated images in the annotated ground truth database 804, re-build the PSPMs and re-run the appropriate simulations. As another example, simulations could be re-run with a particular sensor modality (such as LiDAR) removed altogether to test what effect that might have.

As a more complex example, inferences could be drawn about the effect of changing a particular sensor on the perception uncertainties. It is unlikely that this would be used as a basis for proving safety, but this could be used as a useful tool when considering e.g. camera placement.

6.6 PSPMs for Simulated Sensor Data

Whilst the above considers PSPMs generated via the application of a perception slice 204 to real sensor data, the actual perception outputs used to train the PSPM could instead be derived by applying the perception slice 204 to simulated sensor data, in order to model the performance of the perception slice 204 on simulated sensor data. Note, the trained PSPM does not require simulated sensor data—it is still applied to perception ground truth, without the need to simulate sensor inputs. Simulated sensor data is only used to generate the actual perception outputs used for training. This can be useful as way to model the performance of the perception slice 204 on simulated data.

6.7 Online Applications

Certain PSPMs may also be usefully deployed on an AV at runtime. That is, as part of the runtime stack 100 itself. This, in turn, ultimately could assist the planner 106 in taking account knowledge of perception uncertainty. PSPMs can be used in conjunction with existing online uncertainty models used as a basis for filtering/fusions.

Because PSPMs are confounder-dependent, in order to maximize the usefulness of a PSPM at runtime, the relevant confounders would need to be measured in real-time. This may not be possible for all confounder types, but PSPMs can still be usefully deployed when the appropriate confounders are measurable.

For example, an uncertainty estimate by a PSPM may be used as a prior at run time in conjunction with an independent measurement of uncertainty from one of the AV's online uncertainty models. Together, these may provide a more reliable indication of the actual perception uncertainty.

Structure perception refers to a class of data processing algorithms which can meaningfully interpret structure captured in perception inputs (sensor outputs or perception outputs from lower-level perception components). Such processing may be applied across different forms of perception input. A perception input refers generally to any structure representation, i.e. any set of data in which structure is captured. Structure perception can be applied in both two-dimensional (2D) and three-dimensional (3D) space. The results of applying a structure perception algorithm to a given structure input are encoded as a structure perception output.

One form perception input is a two-dimensional (2D) image; that is, an image having only a colour component (one or more colour channels). The most basic form of structure perception is image classification, i.e. the simple classification of an image as a whole in relation to a set of image classes. More complex forms of structure perception applied in 2D space include 2D object detection and/or localization (e.g. orientation, pose and/or distance estimation in 2D space), 2D instance segmentation etc. Other forms of perception input include three-dimensional (3D) images, i.e. images having at least a depth component (depth channel); 3D point clouds, e.g. as captured using RADAR or LIDAR or derived from a 3D image; voxel or mesh-based representations of structure, or any other form of 3D structure representation. Examples of perception algorithms which may be applied in 3D space include 3D object detection and/or localization (e.g. distance, orientation or pose estimation in 3D space) etc. A single perception input may also be formed of multiple images. For example, stereo depth information may be captured in a stereo pair of 2D images, and that image pair may be used as a basis for 3D perception. 3D structure perception may also be applied to a single 2D image, an example being monocular depth extraction, which extracts depth information from a single 2D image (noting that a 2D image, without any depth channel, may nonetheless capture a degree of depth information in its one or more color channels). Such forms of structure perception are examples of different "perception modalities" as that term is used herein. Structure perception applied to 2D or 3D images may be referred to as "computer vision".

Object detection refers to the detection of any number of objects captured in a perception input and typically involves characterizing each such object as an instance of an object class. Such object detection may involve, or be performed in conjunction with, one or more forms of position estimation, such as 2D or 3D bounding box detection (a form of object localization, where the aim is to define an area or volume in 2D or 3D space which bounds the object), distance estimation, pose estimation etc.

In a machine learning (ML) context, a structure perception component may comprise one or more trained perception models. For example, machine vision processing is frequently implemented using convolutional neural networks (CNNs). Such networks require large numbers of training images which have been annotated with information that the neural network is required to learn (a form of supervised learning). At training time, the network is presented with thousands, or preferably hundreds of thousands, of such annotated images and learns for itself how features captured in the images themselves relate to annotations associated therewith. Each image is annotated in the sense of being associated with annotation data. The image serves as a perception input, and the associated annotation data provides a "ground truth" for the image. CNNs and other forms of perception model can be architected to receive and process other forms of perception inputs, such as point clouds, voxel tensors etc., and to perceive structure in both 2D and 3D space. In the context of training generally, a perception input may be referred to as a "training example" or "training input". By contrast, training examples captured for processing by a trained perception component at runtime may be referred to as "runtime inputs". Annotation data associated with a training input provides a ground truth for that training input in that the annotation data encodes an intended perception output for that training input. In a supervised training process, parameters of a perception component are tuned systematically to minimize, to a defined extent, an overall measure of difference between the perception outputs generated by the perception component when applied to the training examples in a training set (the "actual" perception outputs) and the corresponding ground truths provided by the associated annotation data (the intended perception outputs). In this manner, the perception input "learns" from the training examples, and moreover is able to "generalize" that learning, in the sense of being able, one trained, to provide meaningful perception outputs for perception inputs it has not encountered during training.

Such perception components are a cornerstone of many established and emerging technologies. For example, in the field of robotics, mobile robotic systems that can autonomously plan their paths in complex environments are becoming increasingly prevalent. An example of such a rapidly emerging technology is autonomous vehicles (AVs) that can navigate by themselves on urban roads. Such vehicles must not only perform complex manoeuvres among people and other vehicles, but they must often do so while guaranteeing stringent constraints on the probability of adverse events occurring, such as collision with these other agents in the environments. In order for an AV to plan safely, it is crucial that it is able to observe its environment accurately and reliably. This includes the need for accurate and reliable detection of real-world structure in the vicinity of the vehicle. An autonomous vehicle, also known as a self-driving vehicle, refers to a vehicle which has a sensor system for monitoring its external environment and a control system that is capable of making and implementing driving decisions automatically using those sensors. This includes in particular the ability to automatically adapt the vehicle's speed and direction of travel based on perception inputs from the sensor system. A fully-autonomous or "driverless" vehicle has sufficient decision-making capability to operate without any input from a human driver. However, the term autonomous vehicle as used herein also applies to semi-autonomous vehicles, which have more limited autonomous decision-making capability and therefore still require a degree of oversight from a human driver. Other mobile robots are being developed, for example for carrying freight supplies in internal and external industrial zones. Such mobile robots would have no people on board and belong to a class of mobile robot termed UAV (unmanned autonomous vehicle). Autonomous air mobile robots (drones) are also being developed.

Hence, in the field of autonomous driving and robotics more generally, one or more perception components may be required for interpreting perception inputs, i.e. which can determine information about real-world structure captured in a given a perception input.

Increasingly, a complex robotic system, such as an AV, may be required to implement multiple perception modalities and thus accurately interpret multiple forms of perception input. For example, an AV may be equipped with one or more stereo optical sensor (camera) pairs, from which associated depth maps are extracted. In that case, a data processing system of the AV may be configured to apply one or more forms of 2D structure perception to the images themselves—e.g. 2D bounding box detection and/or other forms of 2D localization, instance segmentation etc. —plus one or more forms of 3D structure perception to data of the associated depth maps—such as 3D bounding box detection and/or other forms of 3D localization. Such depth maps could also come from LiDAR, RADAR etc, or be derived by merging multiple sensor modalities.

The present techniques can be used to simulate behaviour of a variety of robotic systems for the purpose of testing/training etc. Run time application may also be implemented in different robotic systems.

In order to train a perception component for a desired perception modality, the perception component is architected so that it can receive a desired form of perception input and provide a desired form of perception output in response. Further, in order to train a suitably-architected perception component based on supervised learning, annotations need to be provided which accord to the desired perception modality. For example, to train a 2D bounding box detector, 2D bounding box annotations are required; likewise, to train a segmentation component perform image segmentation (pixel-wise classification of individual image pixels), the annotations need to encode suitable segmentation masks from which the model can learn; a 3D bounding box detector needs to be able to receive 3D structure data, together with annotated 3D bounding boxes etc.

A perception component may refer to any tangible embodiment (instance) of one or more underlying perception models of the perception component, which can be a software or hardware instance, or a combined software and hardware instance. Such an instance can be embodied using programmable hardware, such as a general-purpose processor (e.g. CPU, accelerator such as a GPU etc.) or a field programmable gate array (FPGA), or any other form of programmable computer or computers. A computer program for programming a computer can thus take the form of program instructions for execution on a general-purpose processor, circuit description code for programming an FPGA etc. An instance of a perception component can also be implemented using non-programmable hardware, such as an application specific integrated circuit (ASIC), and such hardware may be referred to herein as a non-programmable computer. In general, a perception component may be embodied in one or more computers which may or may not be programmable, and which are programmed or otherwise configured to execute the perception component.

With reference to FIG. 8, the depicted pipeline components are functional components of a computer system which may be implemented at the hardware level in various ways: although not shown in FIG. 8, the computer system comprises one or more processors (computers) which carry out the functionality of the aforementioned components. A processor can take the form of a general-purpose processor such as a CPU (Central Processing unit) or accelerator (e.g. GPU) etc. or more specialized form of hardware processor such as an FPGA (Filed Programmable Gate Array) or ASIC (Application-Specific Integrated Circuit). Although not shown separately, a UI typically comprises at least one display and at least one user input device for receiving user inputs to allow a user to interface with the system, such as a mouse/trackpad, touchscreen, keyboard etc. Various aspects of the invention and example embodiments thereof have been set out above. Further aspects and example embodiments of the invention are set out below.

Another aspect provides a method of testing performance of a robotic planner and perception system, the method comprising:

receiving at least one probabilistic uncertainty distribution for modelling at least one perception component of the perception system, as determined based on a statistical analysis of actual perception outputs derived by applying the at least one perception component to inputs obtained directly or indirectly from one or more sensor components; and running simulated scenarios in a simulator, in which a simulated robot state changes in accordance with autonomous decisions made by the robotic planner in dependence on realistic perception outputs computed for each simulated scenario;

wherein the realistic perception outputs model actual perception outputs which would be provided by the at least one perception component in the simulated scenario, but are computed without applying the at least one perception component to the simulated scenario and without simulating the one or more sensor components, and instead by:

(i) directly computing perception ground truths for the at least one perception component based on the simulated scenario and the simulated robot state, and (ii) modifying the perception ground truths according to the at least one probabilistic uncertainty distribution, thereby computing the realistic perception outputs.

Note the terms "perception pipeline", "perception stack" and "perception system" are used synonymously herein. The term "perception slice" is used to refer to all or part of a perception stack (comprising one or more perception components) that is modelled by a single PSPM. As described later, a perception stack may be wholly or partially replaced with one or more PSPMs during simulation safety-testing. The term slice may also be used to refer to part of the prediction stack that is not modelled by or replaced by a PSPM, and the meaning will be clear in context.

In preferred embodiments of the invention, the realistic perception outputs depend not only on the perception ground truth but also on one or more "confounders". That is, the effect of confounders on perception outputs in modelled by a PSPM. A confounder represents a real-world condition which can affect the accuracy of perception outputs (such as weather, lighting, speed of another vehicle, distance to another vehicle, etc; examples of other types of confounder are given later). A PSPM is said to be mapped to a "confounder space" representing all possible confounders or combinations of confounders that the PSPM can take into account. This allows a PSPM to accurately model different real-world conditions, represented by different points in the confounder space, in a highly efficient way because PSPMs remove the need to simulate sensor data for those different conditions and do not require the perception component(s) itself to be applied as part of the simulation.

The word "confounder" is sometimes used in statistics to refer to a variable that causally influences both a dependent and an independent variable. However, herein, the word is used in a more general sense to mean a variable of a perception error model (PSPM) that represents some kind of physical condition.

In embodiments, the at least one probabilistic uncertainty distribution may be for modelling multiple cooperating perception components of the perception system.

In embodiments, only part of the perception system may be modelled, and at least a second perception component of the perception system may be applied to the realistic perception outputs, in order to provide second perception outputs for use in making said decisions.

The second perception component may be a fusion component, such as a Bayesian or non-Bayesian filter.

The modelled perception component may be a sensor data processing component that is highly sensitive to artefacts in simulated data. In that case, the above approach avoids the need to simulate high quality sensor data for that component. For example, the perception component may be a convolutional neural network (CNN) or other form of neural network.

Alternatively or additionally, the modelled perception component may be a sensor data processing component that processes sensor data that is inherently hard to simulate. For example, a RADAR processing component.

The method may comprise the step of analysing changes in the simulated robot state to detect instances of unsafe behaviour of the simulated robot state and determine a cause of the unsafe behaviour.

An instance of unsafe behaviour may be detected based on a set of predefined acceptable behaviour rules applied to the simulated scenario and the simulated robot state.

Such rules of acceptable behaviour may take the form of a "digital highway code" (DHC).

PSPMs in conjunction with the DHC allow many realistic simulations to be run efficiently, without knowing which will lead to unsafe/unacceptable behaviour (as opposed to running variations of scenarios known to be unsafe from real-world test driving), with the predefined rules of the DHC being used to detect instances of such behaviour automatically.

The perception component(s) and/or planner may be modified to mitigate the cause of the unsafe behaviour.

The probabilistic uncertainty distribution may be determined using sensor outputs obtained from the one or more sensors and respective perception ground truths associated with the sensor outputs.

The probabilistic uncertainty distribution may vary as a function of one or more confounders, wherein a set of one or more confounders chosen for the simulated scenario may be used to modify the perception ground truths according to the probabilistic uncertainty distribution, wherein each confounder represents a physical property.

The one or more confounders may comprise one or more of:
an occlusion level
one or more lighting conditions
an indication of time of day
one or more weather conditions
an indication of season
a physical property of at least one external object
a sensor condition (e.g. object position in field of view)

In a time dependent model, another variable input(s) on which the PSPM depends may be a previous ground ruth and/or at least one previous realistic perception output computed therefrom.

The simulated scenario may be derived from an observed real-world scenario.

The simulated scenario may be a fuzzed scenario, determined by fuzzing an observed real-world scenario.

That is, as well as generating variations in the input that comes to the prediction and planning system as a result of perception errors, it is also possible to combine this with the approach of generating additional test scenarios by making variations (small or large) to the circumstances of a test scenario (e.g. slightly speeding up or slowing down other cars in the scenario, e.g. slightly changing the initial positions and orientations of the ego car, and other cars in the scenario etc.). These two types of variation of a known realistic scenario will together have a higher chance of hitting on situations that are dangerous and the system needs to be able to cope with.

Another aspect is directed to a computer-implemented method of training a perception statistical performance model (PSPM), wherein the PSPM models uncertainty in perception outputs computed by a perception slice, the method comprising:
applying the perception slice to a plurality of training sensor outputs, and thereby computing a training perception output for each sensor output, wherein each training sensor output is associated with a perception ground truth;
comparing each of the perception outputs with the associated perception ground truth, thereby computing a set of perception errors $\Delta$;
using the set of perception errors $\Delta$ to train the PSPM, wherein the trained PSPM provides a probabilistic perception uncertainty distribution of the form $p(e|t)$, wherein $p(e|t)$ denotes the probability of the perception slice computing a particular perception output e given a perception ground truth t.

Another aspect provides a perception statistical performance model (PSPM) embodied in a computer system, the PSPM for modelling a perception slice and configured to:
receive a computed perception ground truth t;
determine from the perception ground truth t, based on a set of learned parameters $\theta$, a probabilistic perception uncertainty distribution of the form $p(e|t)$, wherein $p(e|t)$ denotes the probability of the perception slice computing a particular perception output e given the computed perception ground truth t, and the probabilistic perception uncertainty distribution is defined over a range of possible perception outputs, the parameters θ learned from a set of actual perception outputs generated using the perception slice to be modelled.

In preferred embodiments, the PSPM may vary in dependence on one or more confounders c, wherein each confounder characterizes a physical condition. In that case, the probabilistic perception uncertainty distribution takes the form p(e|t,c).

In embodiments, the PSPM may take the form of a parametric distribution which is defined by a set of parameters θ learned from the set of perception errors Δ, and which varies as a function of the given perception ground truth t.

In order to train the PSPM in dependence on the confounders, each training perception output may also be associated with a set of one or more confounders characterizing one or more physical conditions in which the training sensor output was captured.

Ground truth for training the PSPM may be generated offline because more accurate and hence usually more computer intensive algorithms can be used than would otherwise be the case online. These only need to be generated once.

Note, the term parameters includes hyperparameters, e.g. as learned though variational inference.

In embodiments, the perception ground truths associated with the sensor outputs may be derived from the sensor outputs using offline processing (e.g. processing which cannot be performed in real-time due to hardware constraints or because the offline processing is inherently non-real time).

Model fitting to the PSPMs will often draw attention to confounders in the data being used for the modelling that may or may not be initially apparent. The advantage of this is that only confounders that are significant need be modelled separately, and their significance is determined by how far the data deviates from the model.

The confounders c are variables on which the trained PSPM depends. At runtime, realistic perception outputs (i.e. with realistic errors) can be obtained for different physical situations by varying the values of the confounders c. The variables could be numerical (e.g. continuous/pseudo-continuous) or categorical (e.g. binary or non-binary categorical values).

It may be that the training of the PSPM reveals a statistically significant dependence on one or more physical properties that are not currently characterized by the existing confounders c. For example, it may be that, when the trained PSPM is validated, its performance is worse than expected on certain types of data, and an analysis may be able to attribute this to a dependence on a physical condition(s) that is not explicitly modelled in the PSPM.

Accordingly, in embodiments, the method may comprise steps of analysing the trained PSPM with respect to the confounders c (e.g. validating the PSPM using a validation perception error dataset), and responsive thereto, re-training the PSPM with respect to a new set of one or more confounders c', whereby the probabilistic perception uncertainty distribution of the re-trained PSPM takes the form p(e|t,c').

For example, c' could be determined by adding or removing a confounder(s) from c. For example, a confounder may be added if it is deemed statistically significant, or a confounder may be removed if the analysis indicates that it is not actually statistically significant.

By modelling PSPMs in this way, it is possible to determine which confounders are statistically significant and need to be modelled, and which are not statistically significant and do not.

For example, the one or more confounders may comprise one or more of:
  an occlusion level for at least one external object (indicating the extent to which the object is occluded relative to the agent. The external object could be a moving actor or a static object)
  one or more lighting conditions
  an indication of time of day
  one or more weather conditions
  an indication of season
  a physical property of at least one external object (e.g. location/distance from the agent, speed/velocity/acceleration relative to the agent etc.)
  Position of an external object in a field of view of the agent (e.g. angle from centre of image in the case of a camera)

Another aspect herein provides a computer system for testing and/or training a runtime stack for a robotic system, the computer system comprising:
  a simulator configured to run simulated scenarios, in which a simulated agent interacts with one or more external objects;
  a runtime stack comprising an input configured to receive a time series of perception outputs for each simulated scenario, a planner configured to make autonomous decisions in dependence on the perception outputs and a controller configured to generate a series of control signals for causing the simulated agent to execute the decisions as the simulated scenario progresses;
  wherein the computer system is configured to compute each perception output of the time series by:
  computing a perception ground truth based on a current state of the simulated scenario,
  applying the above PSPM to the perception ground truth, thereby determining a probabilistic perception uncertainty distribution, and
  sampling the perception output from the probabilistic perception uncertainty distribution.

Preferably, the PSPM is applied to the perception ground truth and a set of one or more confounders associated with the simulated scenario.

The perception ground truth may be computed for each external object using ray tracing.

Each external object may be a moving actor or a static object.

The same simulated scenario may be run multiple times.

The same simulated scenario many be run multiple times with different confounders.

The runtime stack may comprise a prediction stack configured to predict behaviour of the external actors based on the perception outputs, wherein the controller may be configured to make the decisions in dependence on the predicted behaviour.

The computer system may be configured to record details of each simulated scenario in a test database, wherein the details include decisions made by the planner, the perception outputs on which those decisions were based, and the behaviour of the simulated agent in executing those decisions.

The computer system may comprise a scenario assessment component configured to analyse the behaviour of the simulated agent in each simulated scenario in relation to a predetermined set of behaviour rules, in order to classify the behaviour of the agent.

The results of the analysis by the scenario assessment component may be used to formulate a simulation strategy.

For example, scenarios may be "fuzzed" (see below) based on the results of the analysis.

The behaviour of the agent may be classified as safe or unsafe.

To model false negative detections, the probabilistic perception uncertainty distribution may provide a probability of successfully detecting a visible object, which is used to determine whether or not to provide an object detection output for that object. (A visible object in this context means one which is in a sensor field of view of the agent in the simulated scenario, but which there is a chance the agent will fail to detect nonetheless).

A time-dependent PSPM may be used (e.g. a hidden Markov model) may be in any of the above.

In the case of modelling false negatives, a time-dependent PSPM may be used such that the probability of detecting the visible object is dependent on at least one earlier determination as to whether or not to provide an object detection output for the visible object.

To model false positive detections, the probabilistic uncertainty distribution may provide a probability of false object detection, which is used to determine whether or not to provide a perception output for a non-existent object.

Once "ground truth" is determined, potential errors in the planner can be explored if the scenario is run without the PSPM in the loop. This can be extended to automatically triage data to indicate a perception problem or a planner problem.

In embodiments, a simulated scenario, in which the simulated agent exhibited unsafe behaviour, may be re-run without applying the PSPM(s), and instead by providing perception ground truths to the runtime stack directly.

An analysis may then be performed, in order to determine whether the simulation agent still exhibited unsafe behaviour in the re-run scenario.

Another aspect of the invention provides a method of testing a robotic planner, the robotic planner for making autonomous decisions using perception outputs of at least one perception component, the method comprising:
running simulated scenarios in a computer system, in which a simulated robot state changes in accordance with autonomous decisions made by the robotic planner using realistic perception outputs computed for each simulated scenario;
for each simulated scenario, determining an ontological representation of the simulated scenario and the simulated robot state; and
applying a set of predefined acceptable behaviour rules [e.g. DHC] to the ontological representation for each simulated scenario, so as to record and flag violations of the predefined acceptable behaviour rules within one or more of the simulated scenarios.

A further aspect of the invention provides a computer-implemented method comprising steps to implement any of the above the program, system or PSPM functionality.

Further aspects provide a computer system comprising one or more computers programmed or otherwise configured to carry out any of the functions disclosed herein, and one or more computer programs for programming a computer system to carry out said functions.

It will be appreciated that various embodiments of the invention have been described by way of example only. The scope of the invention is not defined by the described examples but only by the accompanying claims.

The invention claimed is:

1. A computer system for testing and/or training a runtime stack for a robotic system, the computer system comprising:
a simulator configured to run simulated scenarios, in which a simulated agent interacts with one or more external objects;
a planner of the runtime stack configured to make autonomous decisions for each simulated scenario in dependence on a first time series of perception outputs and a second time series of perception outputs computed for the simulated scenario; and
a controller of the runtime stack configured to generate a series of control signals for causing the simulated agent to execute the autonomous decisions as the simulated scenario progresses;
wherein the computer system is configured to compute each perception output of the first time series by:
computing a perception ground truth based on a current state of the simulated scenario,
applying a first perception statistical performance model (PSPM) to the perception ground truth, thereby determining a probabilistic perception uncertainty distribution, and
sampling the perception output from the probabilistic perception uncertainty distribution;
wherein the first PSPM is for modelling a first perception slice of the runtime stack and is configured to determine the probabilistic perception uncertainty distribution based on a set of parameters learned from a set of actual perception outputs generated using the perception slice to be modelled;
wherein the computer system is configured to compute the second time series of perception outputs using a second PSPM for modelling a second perception slice of the runtime stack, the first PSPM learned from data of a first sensor modality of the perception slice for computing the first time series, and the second PSPM learned independently thereof from data of a second sensor modality of the second perception slice for computing the second time series.

2. The computer system of claim 1, wherein the computer system is configured to apply at least one unmodelled perception component of the runtime stack to the first and second time series of perception outputs, thereby computing processed perception outputs, the planner configured to make said autonomous decisions in dependence on the processed perception outputs.

3. The computer system of claim 2, wherein the unmodelled perception component is a filtering component applied to the first and second time series of perception outputs, the processed perception outputs being filtered perception outputs.

4. The computer system of claim 3, wherein the filtering component is applied to fuse the first time series of perception outputs of the first sensor modality with the second time series of perception outputs.

5. The computer system of claim 1, wherein the PSPM is applied to the perception ground truth and one or more confounders associated with the simulated scenario, wherein each confounder is a variable of the PSPM whose value characterizes a physical condition applicable to the simulated scenario and on which the probabilistic perception uncertainty distribution depends.

6. The computer system of claim 5, wherein the one or more confounders comprise one or more first confounders, which at least partially determine the probabilistic uncertainty distribution from which the perception output is sampled, the one or more first cofounders being selected from a group comprising:
  an occlusion level for at least one of the external objects,
  one or more lighting conditions,
  an indication of time of day,
  one or more weather conditions,
  an indication of season,
  a physical property of at least one of the external objects,
  a sensor condition, for example a position of at least one of the external objects in a sensor field of view of the agent,
  a number or density of the external objects;
  a distance between two of the external objects,
  a truncation level for at least one of the external objects,
  a type of at least one of the objects, and
  an indication as to whether or not at least one of the external objects corresponds to any external object from an earlier time instant of the simulated scenario.

7. The computer system of claim 1, comprising:
  a scenario assessment component configured to assess behaviour of the simulated agent in each of the simulated scenarios by applying a set of predetermined rules.

8. The computer system of claim 7, wherein at least some of the predetermined rules pertain to safety, and the scenario assessment component is configured to assess the safety of the simulated agent's behaviour in each of the simulated scenarios.

9. The computer system of claim 8, wherein the scenario assessment component is configured to automatically flag instances of unsafe behaviour by the simulated agent for further analysis and testing.

10. The computer system of claim 8, wherein the computer system is configured to re-run a simulated scenario in which the simulated agent originally exhibited unsafe behaviour based on a time series of perception ground truths determined for the re-run scenario, without applying the PSPM to those perception ground truths and therefore without perception errors, and assess whether the simulated agent still exhibited unsafe behaviour in the re-run scenario.

11. The computer system of claim 1, wherein the sampling from the probabilistic perception uncertainty distribution is non-uniform and is biased towards lower-probability perception outputs.

12. The computer system of claim 1, comprising a scenario fuzzing component configured to generate at least one fuzzed scenario for running in the simulator by fuzzing at least one existing scenario.

13. The computer system of claim 1, wherein, to model false negative detections, the probabilistic perception uncertainty distribution provides a probability of successfully detecting a visible one of the objects, which is used to determine whether or not to provide an object detection output for that object, an object being visible when it is within a sensor field of view of the agent in the simulated scenario, whereby detection of the visible object is not guaranteed.

14. The computer system of claim 1, wherein the perception ground truths are computed for the one or more external objects using ray tracing.

15. The computer system of claim 1, wherein at least one of the external objects is a moving actor, the computer system comprising a prediction stack of the runtime stack configured to predict behaviour of the external actor based on the perception outputs, the planner configured to make the autonomous decisions in dependence on the predicted behaviour.

16. The computer system of claim 1, which is configured to record details of each simulated scenario in a test database, wherein the details include decisions made by the planner, the perception outputs on which those decisions were based, and [the] behaviour of the simulated agent in executing those decisions.

17. A computer-implemented method of performance testing a runtime stack for a robotic system, the method comprising:
  running a simulated scenario in a simulator, in which a simulated agent interacts with one or more external objects, wherein a planner of the runtime stack makes autonomous decisions for the simulated scenario in dependence on first and second time series of perception outputs computed for the simulated scenario, and a controller of the runtime stack generate a series of control signals for causing the simulated agent to execute the autonomous decisions as the simulated scenario progresses;
  wherein each perception output of the first time series is computed by:
  computing a perception ground truth based on a current state of the simulated scenario, applying a first perception statistical performance model (PSPM) to the perception ground truth, thereby determining a probabilistic perception uncertainty distribution, and
  sampling the perception output from the probabilistic perception uncertainty distribution;
  wherein the first PSPM is for modelling a first perception slice of the runtime stack and determined the probabilistic perception uncertainty distribution based on a set of parameters learned from a set of actual perception outputs generated using the perception slice to be modelled;
  wherein the second time series of perception outputs is computed using a second PSPM for modelling a second perception slice of the runtime stack, the first PSPM learned from data of a first sensor modality of the perception slice for computing the first time series, and the second PSPM learned independently thereof from data of a second sensor modality of the second perception slice for computing the second time series.

18. A computer program embodied in a non-transitory computer-readable storage medium for programming one or more computers to
  run a simulated scenario in a simulator, in which a simulated agent interacts with one or more external objects, wherein a planner of a runtime stack for a robotic system makes autonomous decisions for the simulated scenario in dependence on first and second time series of perception outputs computed for the simulated scenario, and a controller of the runtime stack generate a series of control signals for causing the simulated agent to execute the autonomous decisions as the simulated scenario progresses;
  wherein each perception output of the first time series is computed by:
    computing a perception ground truth, wherein the perception ground truth is derived from a current state of the simulated scenario based on a location and an orientation of at least one of the external objects relative to the simulated agent in the simulated scenario,
    applying a first perception statistical performance model (PSPM) to the perception ground truth, thereby determining a probabilistic perception uncertainty distribution, and sampling the perception output from the probabilistic perception uncertainty distribution;

wherein the first PSPM is for modelling a first perception slice of the runtime stack and determined the probabilistic perception uncertainty distribution based on a set of parameters learned from a set of actual perception outputs generated using the perception slice to be modelled;

wherein the second time series of perception outputs is computed using a second PSPM for modelling a second perception slice of the runtime stack, the first PSPM learned from data of a first sensor modality of the perception slice for computing the first time series, and the second PSPM learned independently thereof from data of a second sensor modality of the second perception slice for computing the second time series.

* * * * *